(12) United States Patent
Choi et al.

(10) Patent No.: US 11,889,692 B2
(45) Date of Patent: *Jan. 30, 2024

(54) VERTICAL MEMORY DEVICES

(71) Applicant: SAMSUNG ELECTRONICS CO., LTD., Suwon-si (KR)

(72) Inventors: Chang-Min Choi, Seoul (KR); Ju-Young Lim, Seoul (KR); Su-Jin Ahn, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 86 days.

This patent is subject to a terminal disclaimer.

(21) Appl. No.: 17/349,193

(22) Filed: Jun. 16, 2021

(65) Prior Publication Data

US 2021/0313349 A1 Oct. 7, 2021

Related U.S. Application Data

(63) Continuation of application No. 16/285,829, filed on Feb. 26, 2019, now abandoned, which is a
(Continued)

(30) Foreign Application Priority Data

Oct. 29, 2015 (KR) .................. 10-2015-0150764

(51) Int. Cl.
*H01L 27/06* (2006.01)
*H10B 43/27* (2023.01)
(Continued)

(52) U.S. Cl.
CPC ......... *H10B 43/27* (2023.02); *H01L 23/5283* (2013.01); *H01L 27/0688* (2013.01);
(Continued)

(58) Field of Classification Search
CPC ........ H10B 43/27; H10B 41/27; H10B 43/10; H10B 43/20; H10B 43/35; H10B 43/40;
(Continued)

(56) References Cited

U.S. PATENT DOCUMENTS 8,178,861 B2 5/2012 Futatsuyama
8,188,530 B2 5/2012 Tanaka et al.
(Continued)

FOREIGN PATENT DOCUMENTS

CN 102110690 6/2011
CN 104681561 6/2015

OTHER PUBLICATIONS

Office Action dated Oct. 15, 2020 in Corresponding U.S. Appl. No. 16/285,829.
(Continued)

*Primary Examiner* — Shouxiang Hu
(74) *Attorney, Agent, or Firm* — F. Chau & Associates, LLC

(57) ABSTRACT

A vertical memory device includes a substrate, a plurality of channels extending in a first direction substantially vertical to a top surface of the substrate, a plurality of gate lines surrounding a predetermined number of channels from among the channels, a plurality of common wirings electrically connected to the gate lines, and a plurality of signal wirings electrically connected to the gate lines via the common wirings. The gate lines are arranged and spaced apart from one another along the first direction. Each common wiring is electrically connected to a corresponding gate line at a same level of the corresponding gate line via a corresponding contact.

20 Claims, 43 Drawing Sheets

Related U.S. Application Data continuation of application No. 15/223,255, filed on Jul. 29, 2016, now Pat. No. 10,242,997.

(51) Int. Cl.
| | | |
|---|---|---|
| *H10B 41/27* | (2023.01) | |
| *H10B 43/10* | (2023.01) | |
| *H10B 43/20* | (2023.01) | |
| *H10B 43/35* | (2023.01) | |
| *H10B 43/40* | (2023.01) | |
| *H10B 43/50* | (2023.01) | |
| *H01L 23/528* | (2006.01) | |

(52) U.S. Cl.
CPC .............. *H10B 41/27* (2023.02); *H10B 43/10* (2023.02); *H10B 43/20* (2023.02); *H10B 43/35* (2023.02); *H10B 43/40* (2023.02); *H10B 43/50* (2023.02)

(58) Field of Classification Search
CPC ........ H10B 43/50; H10B 41/20; H10B 41/35; H01L 23/5283; H01L 27/0688; H01L 27/11582; H01L 27/11575; H01L 27/1157; H01L 27/11573; H01L 27/11556; H01L 27/11565; H01L 27/11578; H01L 27/11548; H01L 27/11551; H01L 27/11526
See application file for complete search history.

(56) References Cited

U.S. PATENT DOCUMENTS

| | | |
|---|---|---|
| 8,247,860 B2 | 8/2012 | Iwase et al. |
| 8,405,141 B2 | 3/2013 | Matsuda et al. |
| 8,643,076 B2 | 2/2014 | Seo et al. |
| 8,652,921 B2 | 2/2014 | Lee et al. |
| 8,895,393 B2 | 11/2014 | Sim et al. |
| 9,847,341 B2 | 12/2017 | Shin et al. |
| 10,242,997 B2 | 3/2019 | Choi et al. |
| 2010/0254191 A1 | 10/2010 | Son et al. |
| 2011/0115010 A1 | 5/2011 | Shim et al. |
| 2011/0204420 A1 | 8/2011 | Kim et al. |
| 2012/0070944 A1 | 3/2012 | Kim et al. |
| 2014/0061776 A1 | 3/2014 | Kwon et al. |
| 2014/0197546 A1 | 7/2014 | Hwang et al. |
| 2014/0199815 A1 | 7/2014 | Hwang et al. |
| 2015/0035065 A1 | 2/2015 | Park et al. |
| 2015/0063024 A1 | 3/2015 | Yip et al. |
| 2015/0118808 A1 | 4/2015 | Ahn |
| 2015/0162341 A1 | 6/2015 | Aritome |
| 2015/0194603 A1 | 7/2015 | Terai et al. |
| 2017/0125439 A1 | 5/2017 | Choi et al. |
| 2019/0189634 A1 | 6/2019 | Choi et al. |

OTHER PUBLICATIONS

Final Office Action dated Mar. 16, 2021 in Corresponding U.S. Appl. No. 16/285,829.

Office Action dated Apr. 30, 2021 from the Chinese Patent Office in corresponding Chinese Patent Application No. 201610971038.2.

FIG. 1A
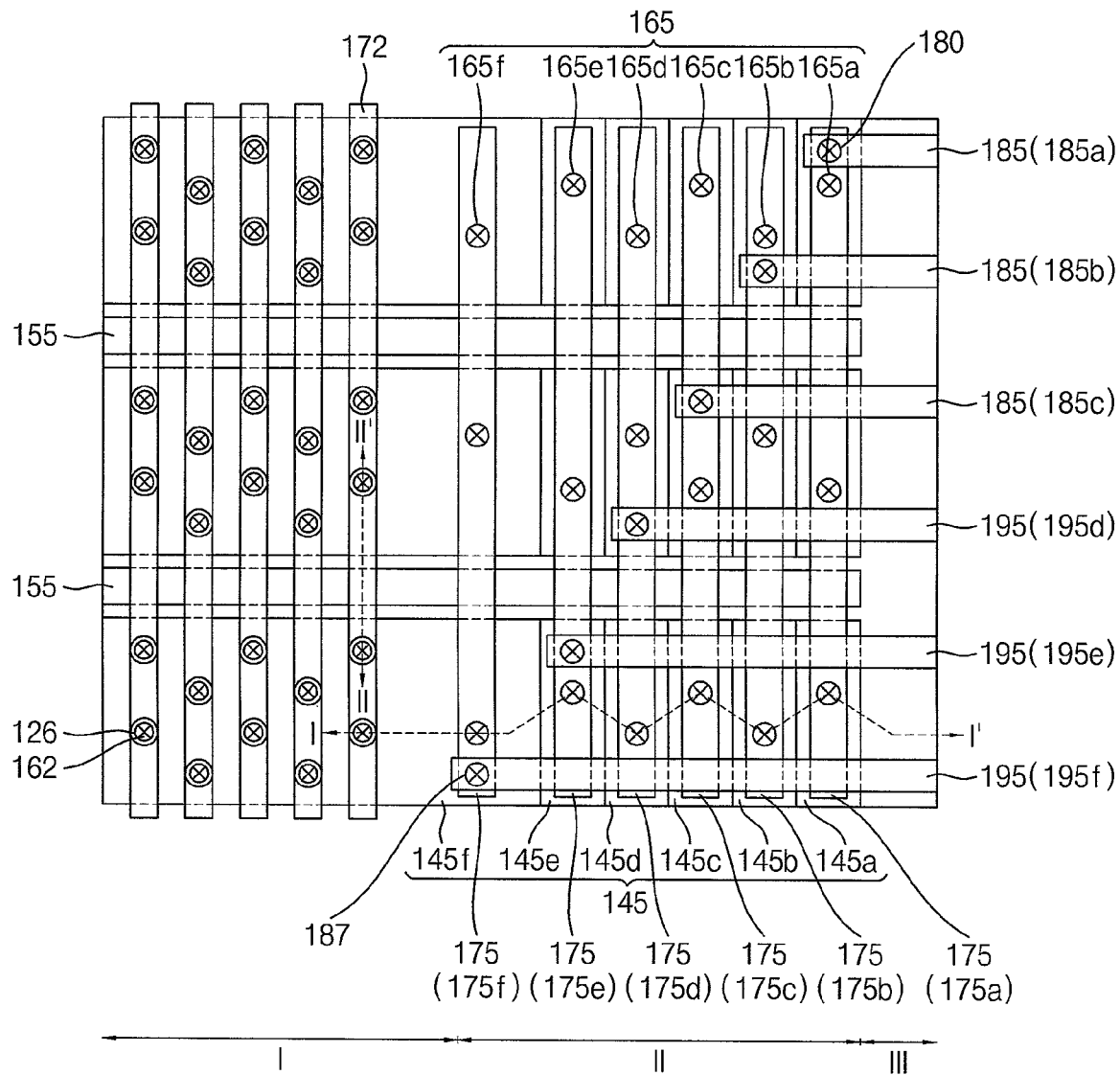
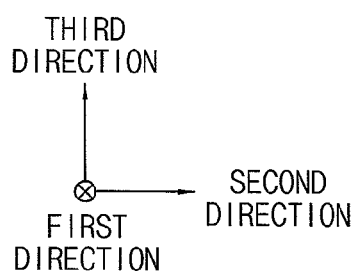

FIG. 1B
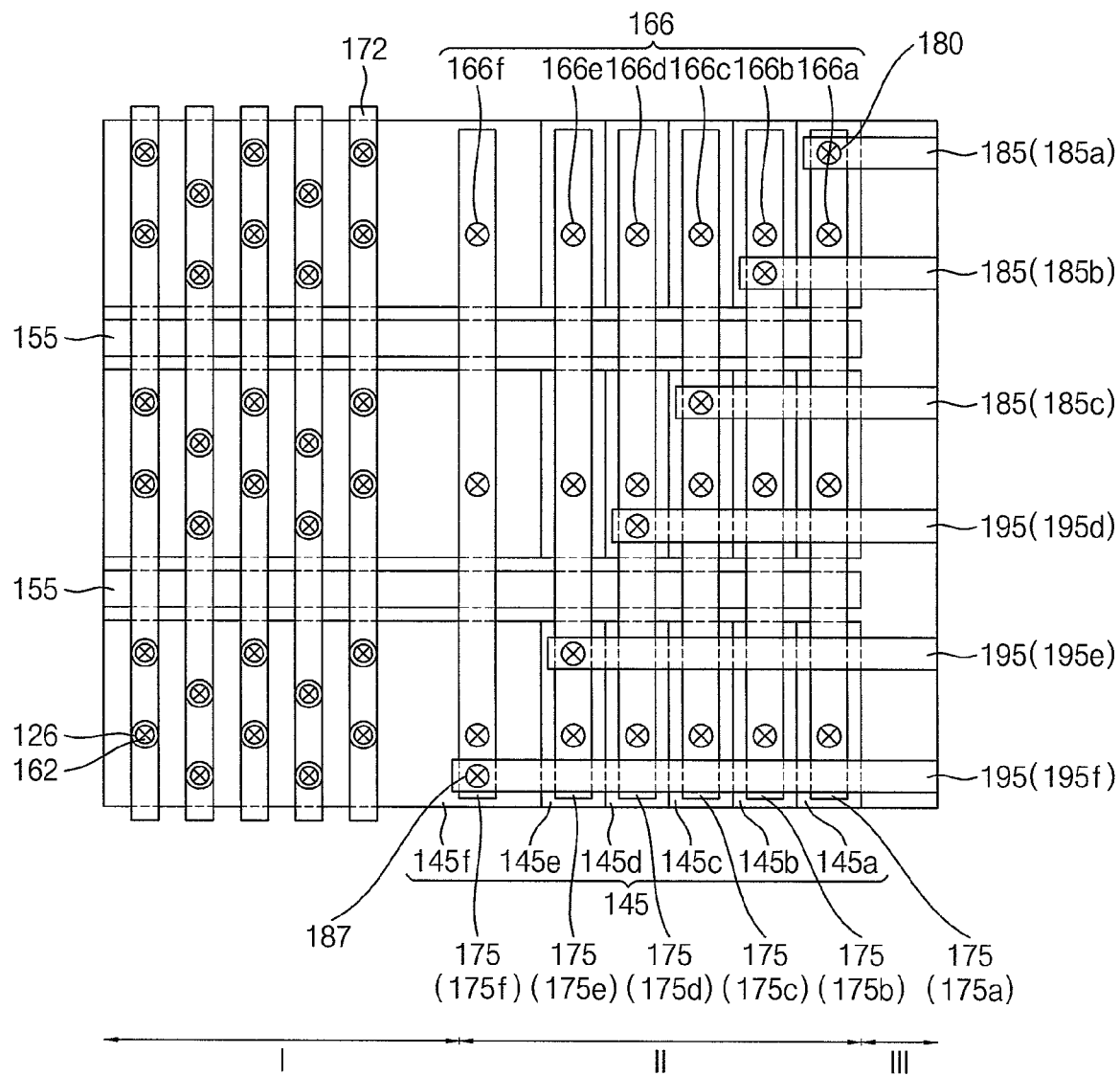
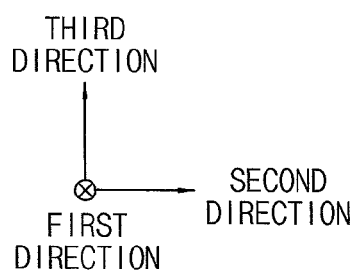

FIG. 3
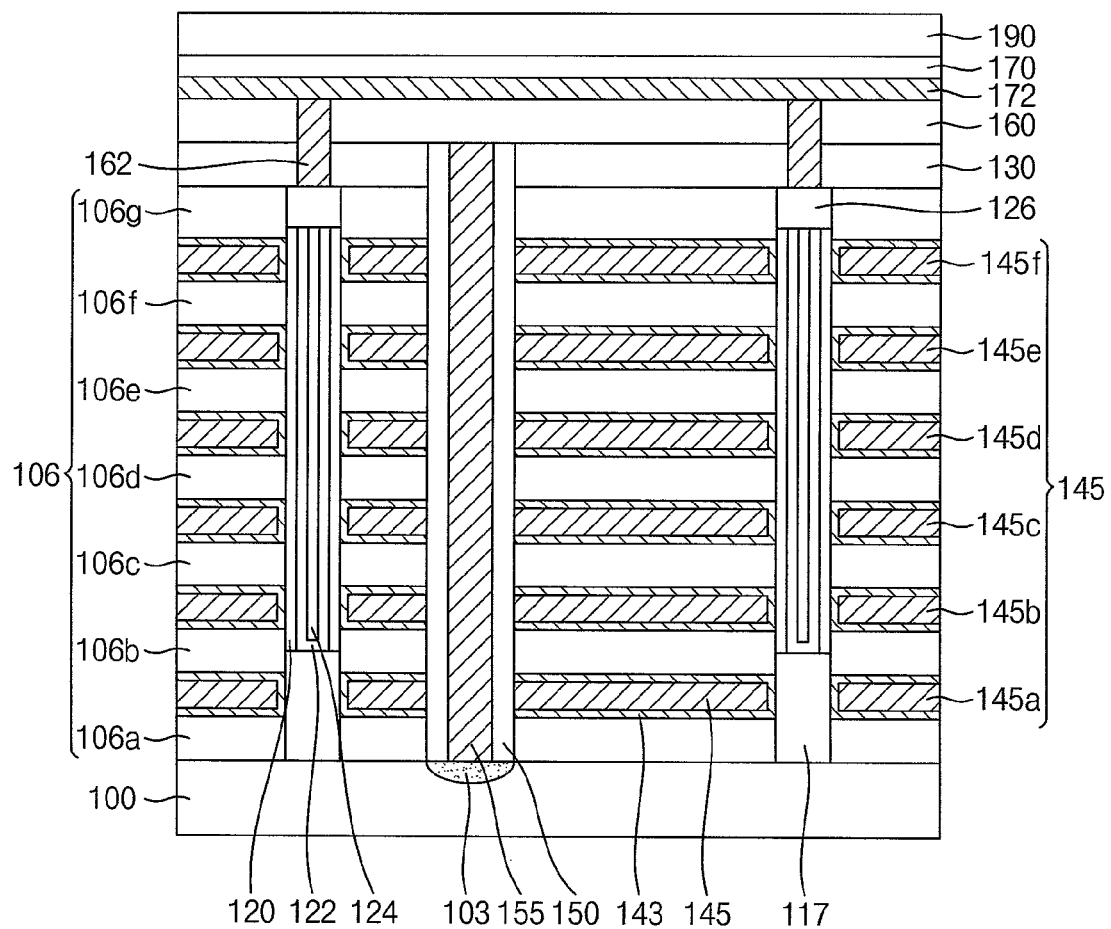
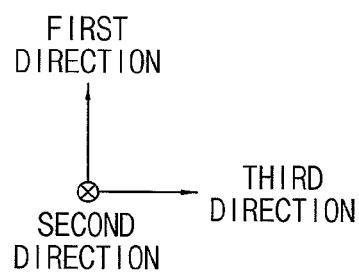

FIG. 8
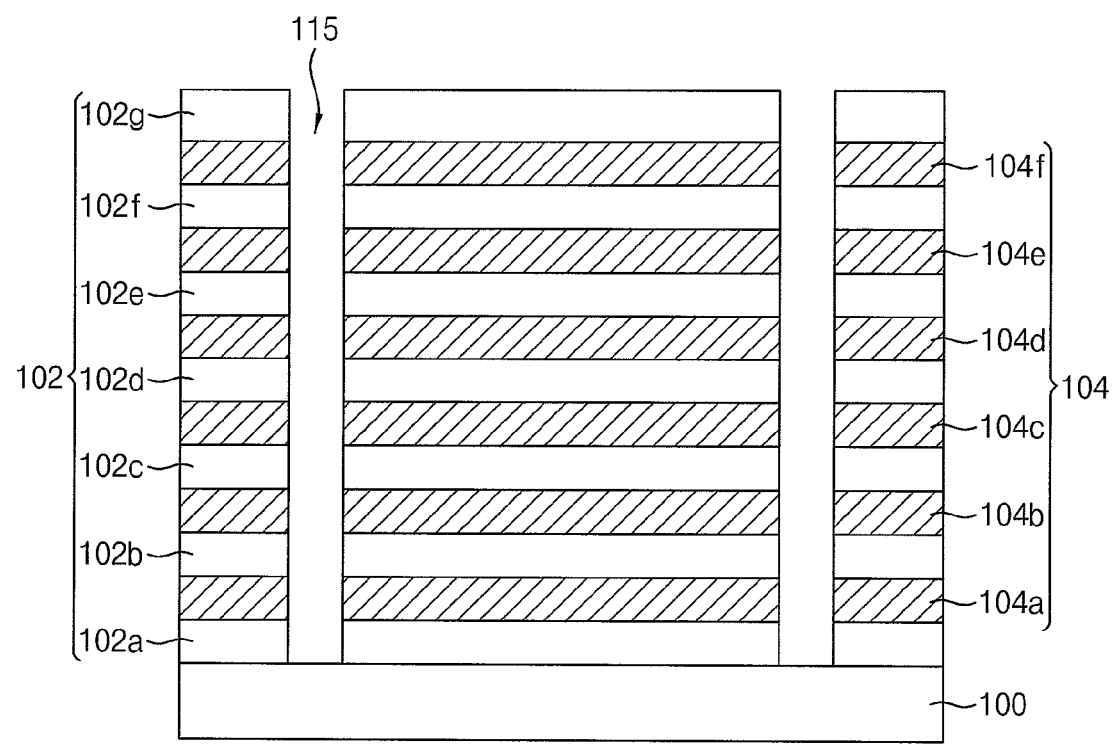
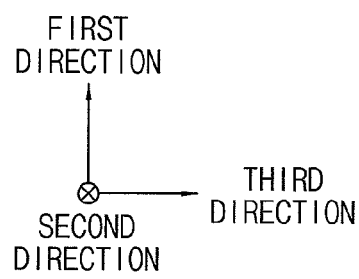

FIG. 10
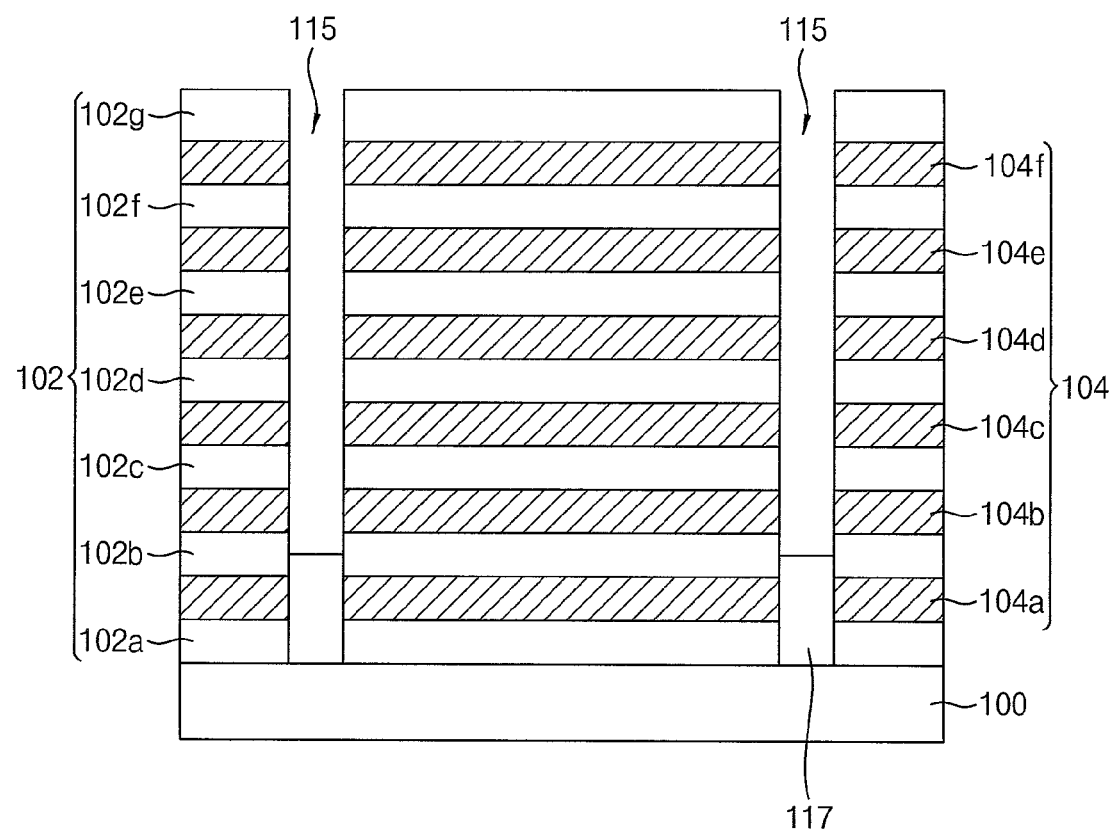
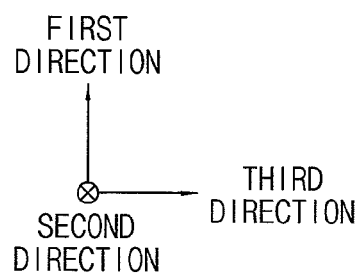

FIG. 12
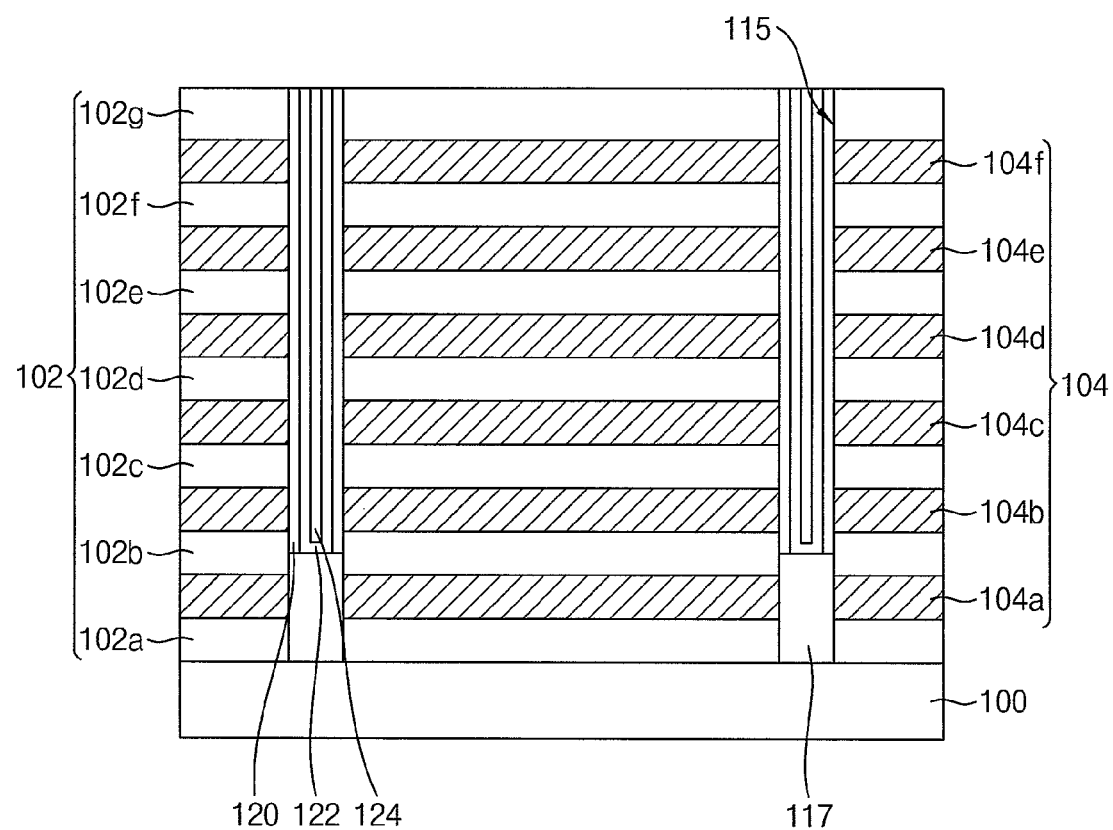
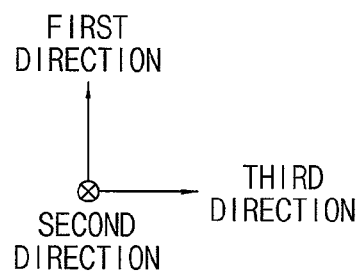

FIG. 18
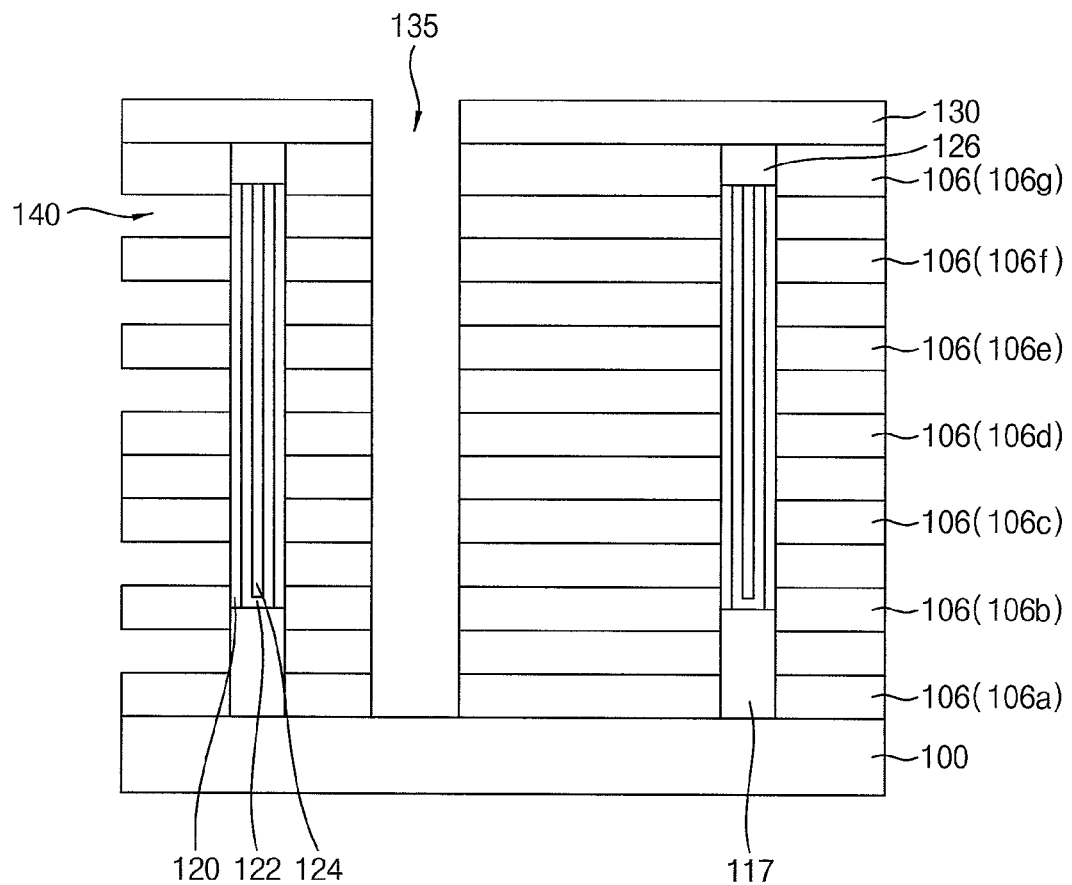
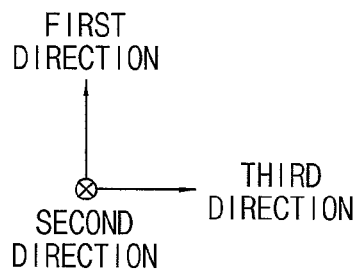

FIG. 26
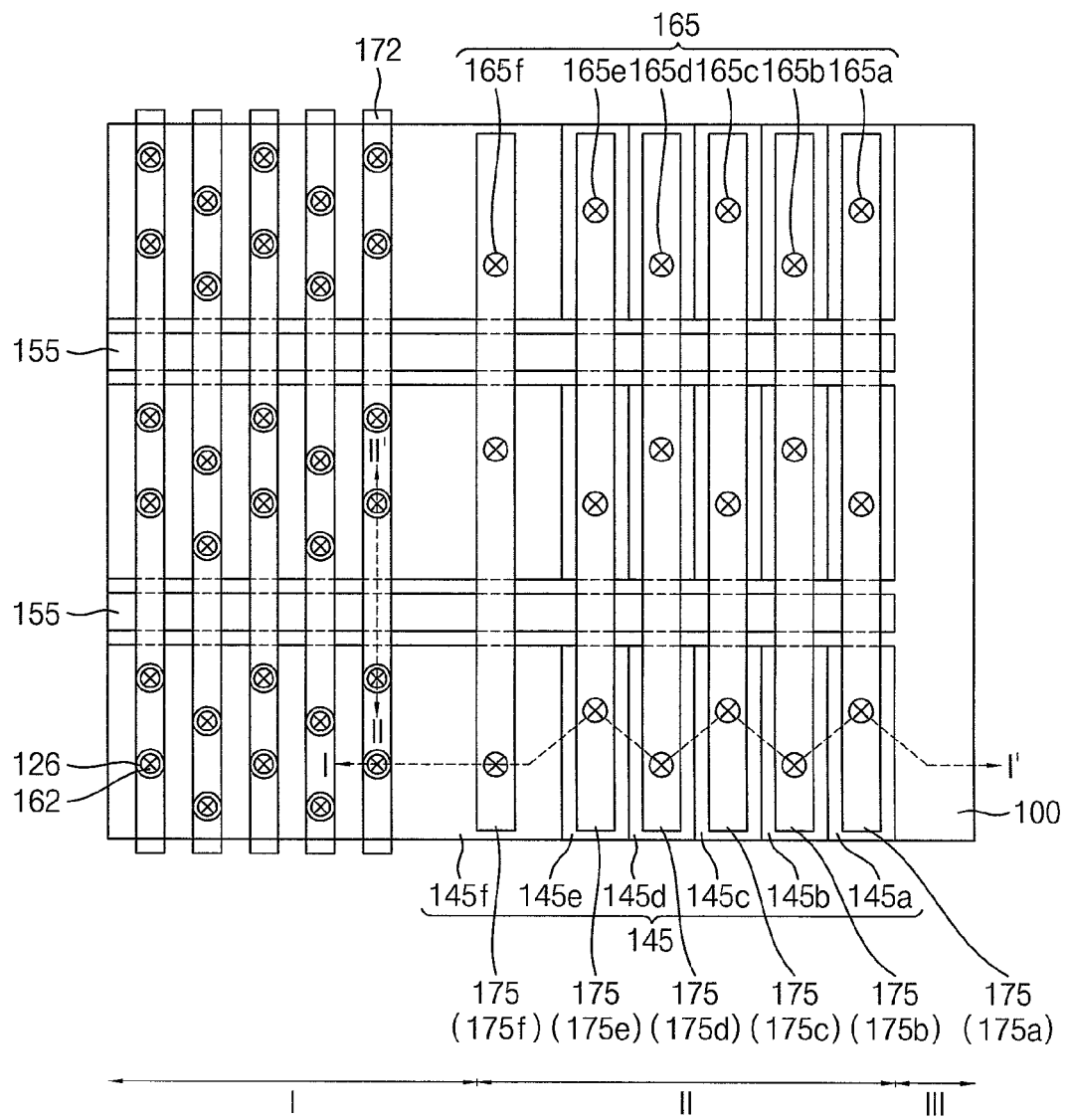
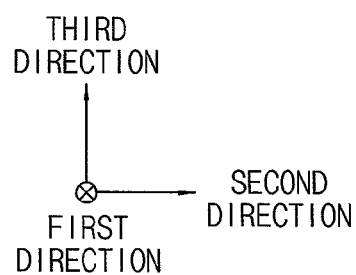

FIG. 31
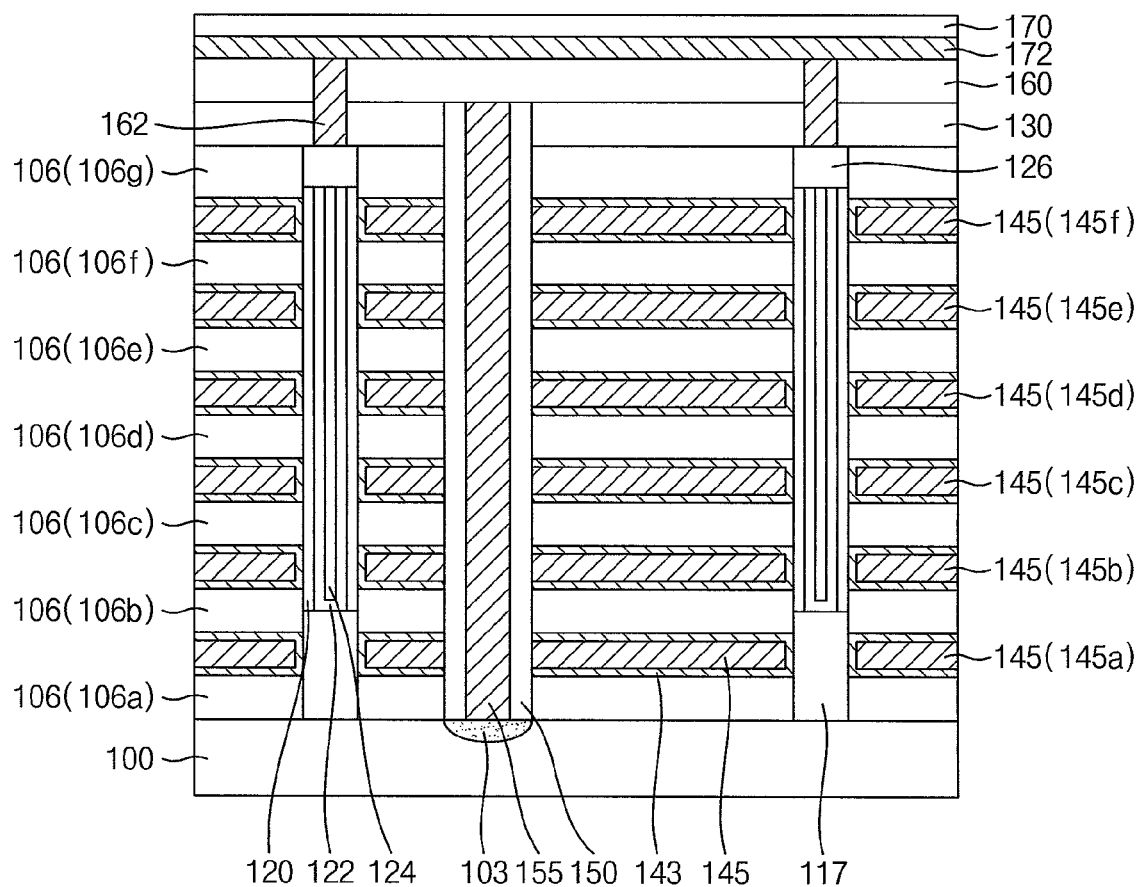
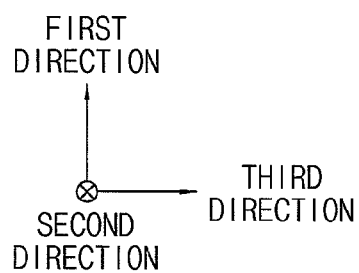

FIG. 32
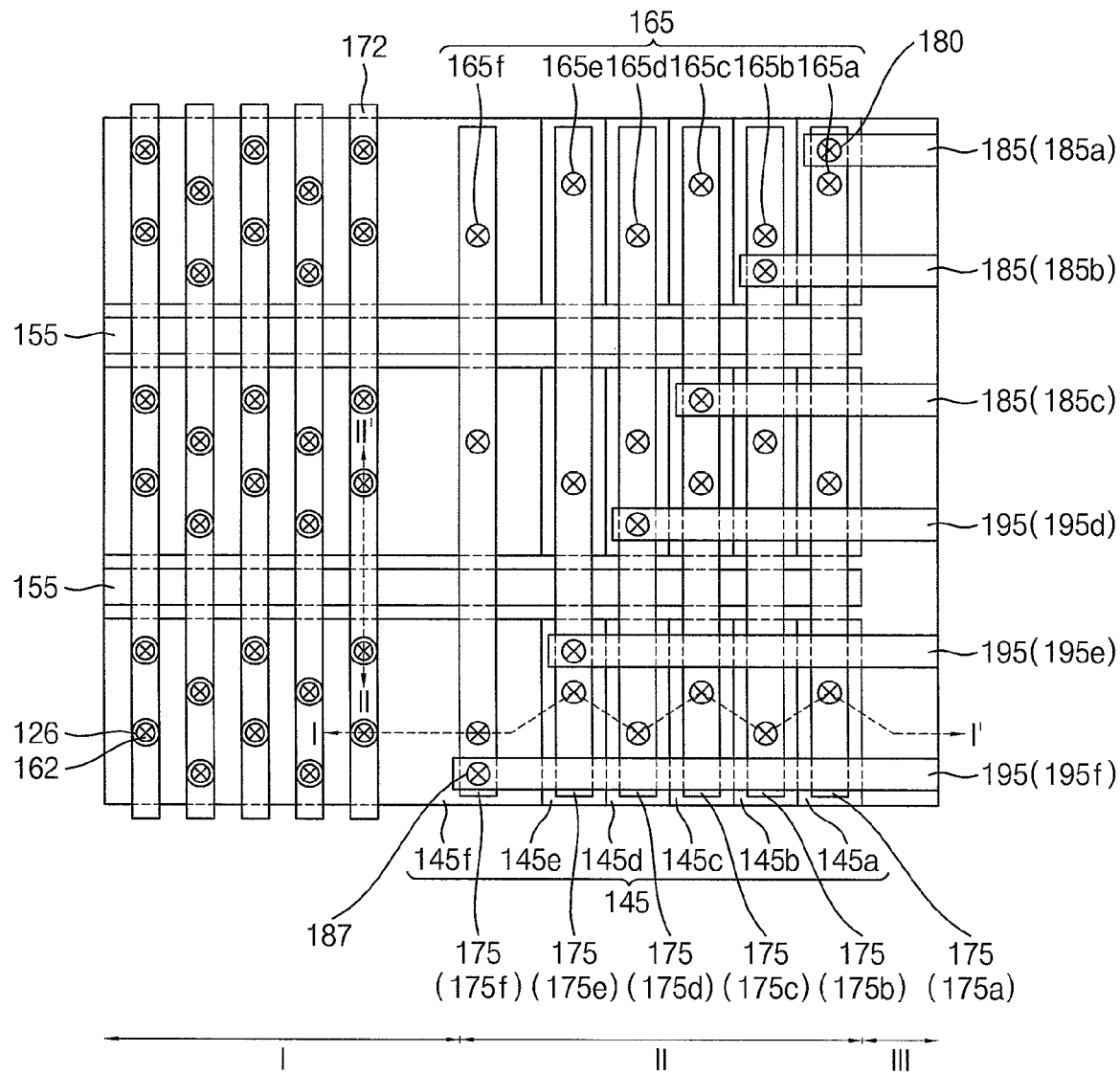
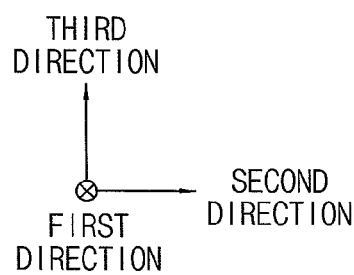

FIG. 34
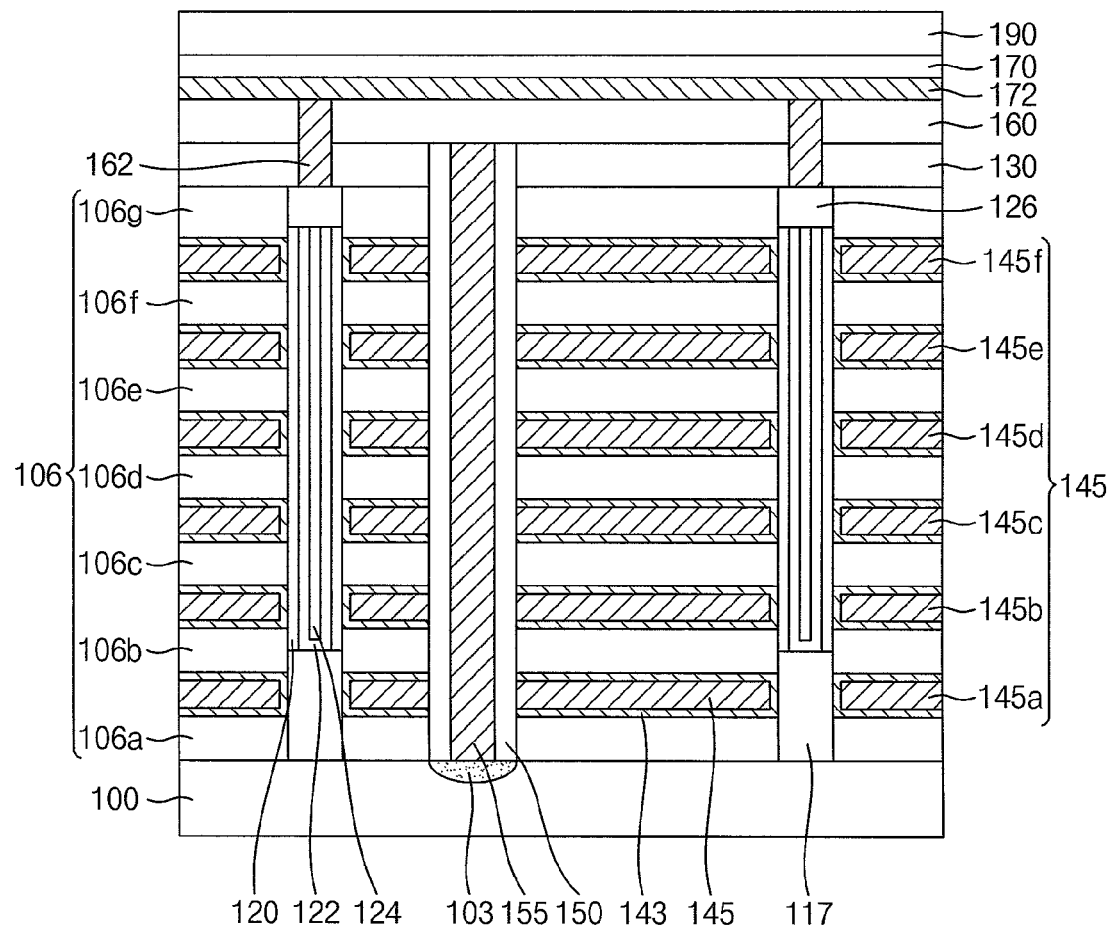
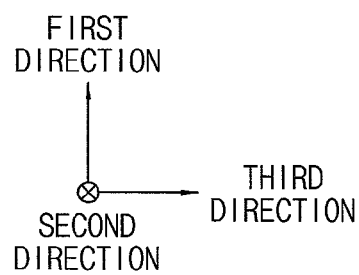

FIG. 39
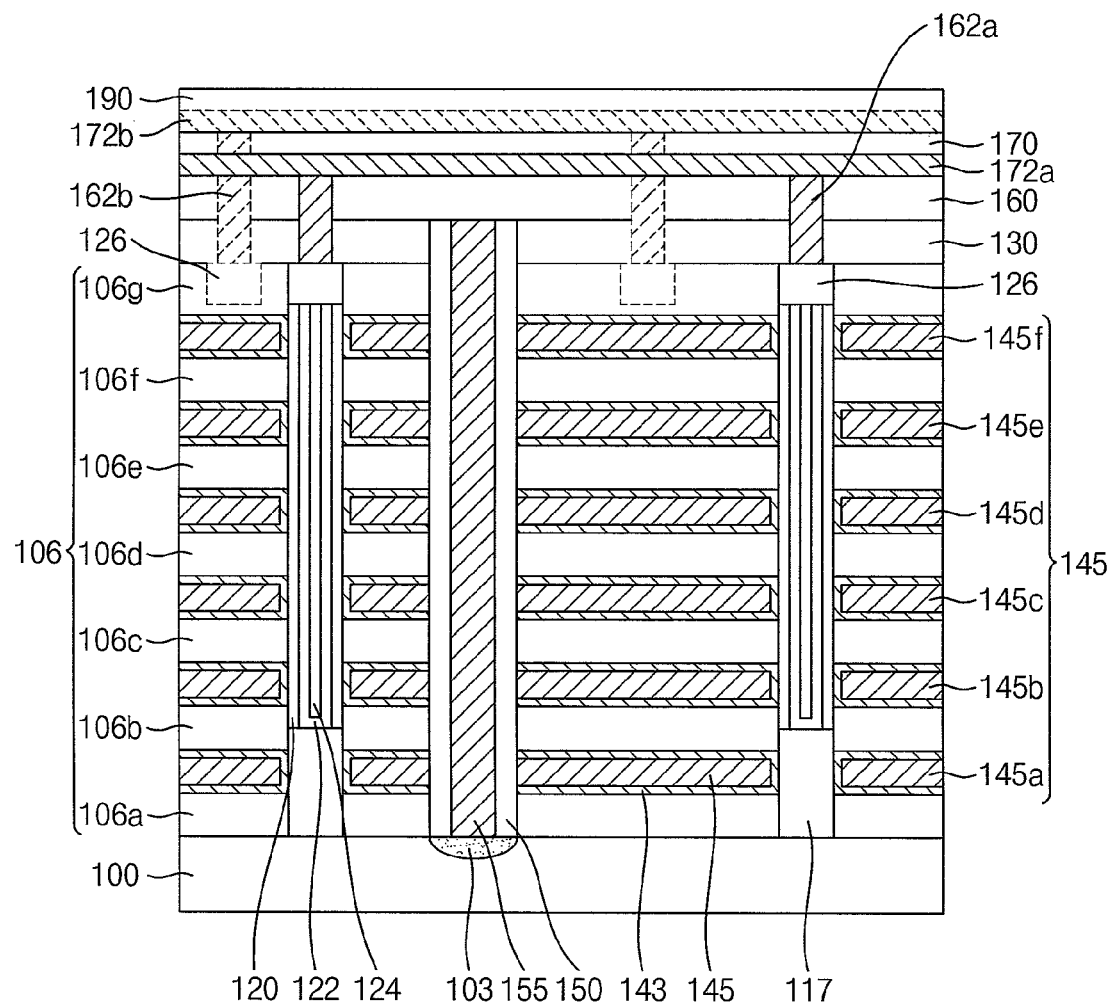
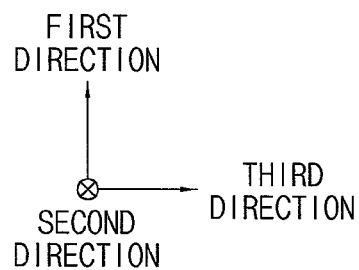

FIG. 40
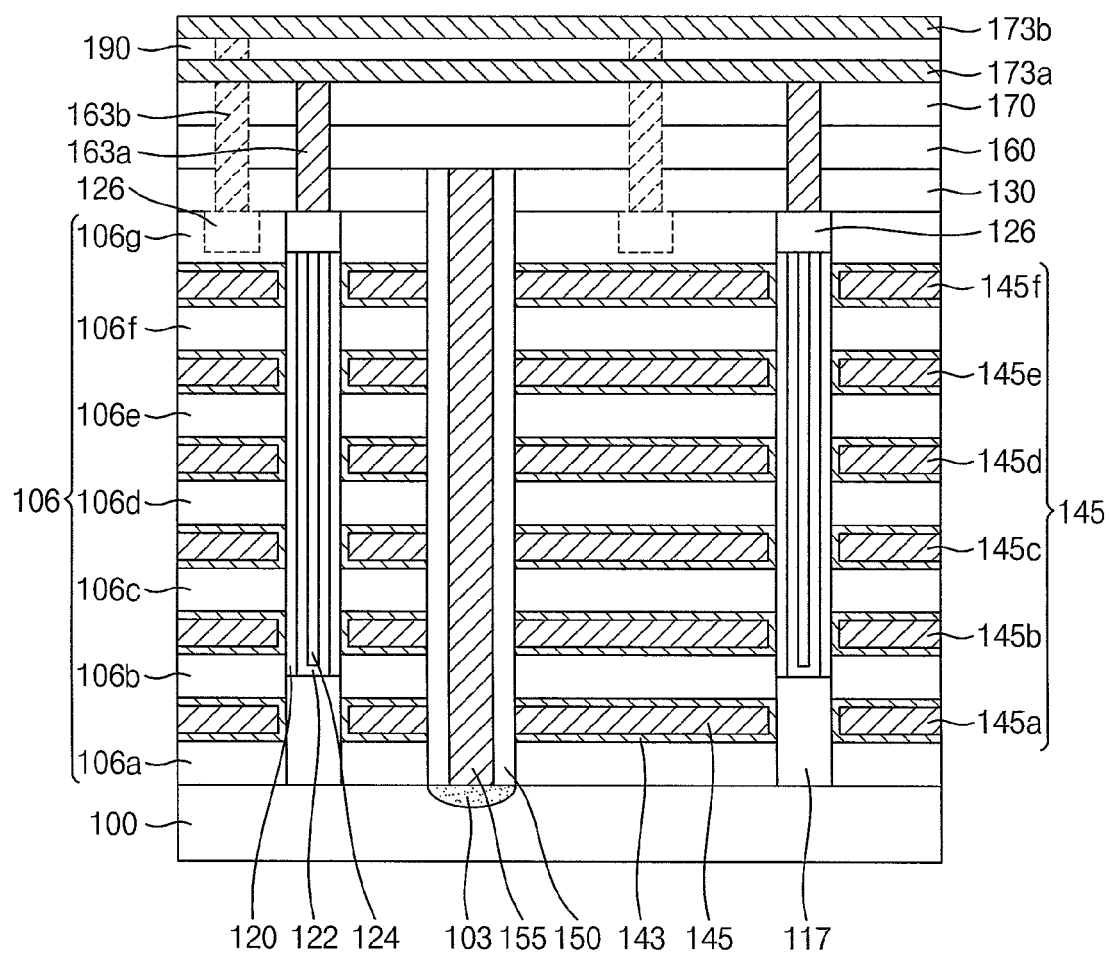
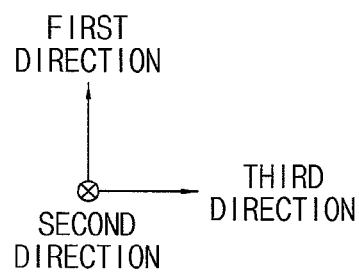

VERTICAL MEMORY DEVICES

CROSS-REFERENCE TO RELATED APPLICATIONS

This application is a continuation application of U.S. patent application Ser. No. 16/285,829 filed on Feb. 26, 2019, which is a continuation application of U.S. Ser. No. 15/223,255, filed on Jul. 29, 2016, issued as U.S. Pat. No. 10,242,997 on Mar. 26, 2019, which claims priority under 35 USC § 119 to Korean Patent Application No. 10-2015-0150764, filed on Oct. 29, 2015, the disclosures of which are incorporated by reference herein in their entireties.

TECHNICAL FIELD

Exemplary embodiments of the inventive concept relate to vertical memory devices. More particularly, exemplary embodiments of the inventive concept relate to vertical memory devices including vertically stacked gate lines.

DISCUSSION OF THE RELATED ART

A vertical memory device including a plurality of memory cells stacked vertically with respect to a surface of a substrate has been developed for achieving a high degree of integration. In the vertical memory device, a channel having a pillar shape or a cylindrical shape may protrude vertically from the surface of the substrate, and gate lines and insulation layers surrounding the channel may be repeatedly stacked.

As the degree of integration of the vertical memory device becomes greater, the number of the gate lines and the insulation layers stacked in a vertical direction may increase. Thus, structural and operational reliability of the vertical memory device may be affected.

SUMMARY

Exemplary embodiments of the inventive concept provide a vertical memory device having improved electrical reliability.

According to exemplary embodiments of the inventive concept, a vertical memory device includes a substrate, a plurality of channels extending in a vertical direction with respect to a top surface of the substrate, and a plurality of gate lines surrounding a predetermined number of channels of the channels. The gate lines are arranged and spaced apart from one another along the vertical direction and a lateral direction, common wirings are electrically connected to gate lines at the same level of the gate lines, and signal wirings are electrically connected to the gate lines via the common wirings.

In exemplary embodiments, the gate lines are stacked along a first direction substantially vertical to the top surface of the substrate, and the gate lines extend in a second direction substantially parallel to the top surface of the substrate.

In exemplary embodiments, the common wirings extend in a third direction substantially parallel to the top surface of the substrate and crossing the second direction.

In exemplary embodiments, the signal wirings extend in a different direction from that of the common wirings.

In exemplary embodiments, the signal wirings extend in the second direction.

In exemplary embodiments, the signal wirings are disposed over the common wirings.

In exemplary embodiments, the signal wirings include first wirings and second wirings, which are located at different levels.

In exemplary embodiments, the first signal wirings are electrically connected to some common wirings of the common wirings. The some common wirings are connected to gate lines at a predetermined number of lower levels of the gate lines.

In exemplary embodiments, the second signal wirings are electrically connected to common wirings except for the some common wirings connected to the first signal wirings.

In exemplary embodiments, the vertical memory device further includes a plurality of bit lines electrically connected to the channels.

In exemplary embodiments, the common wirings extend in the same direction as that of the bit lines, and the signal wirings extend in a different direction from that of the bit lines.

In exemplary embodiments, the bit lines are located at the same level as that of the common wirings or at a lower level than that of the common wirings.

In exemplary embodiments, the bit lines are located at the same level as that of some signal wirings of the signal wirings.

In exemplary embodiments, the bit lines include first bit lines and second bit lines, which are located at different levels.

According to exemplary embodiments of the inventive concept, a vertical memory device includes a substrate, and a plurality of gate line stack structures on the substrate. Each gate line stack structure includes channels extending in a vertical direction with respect to a top surface of the substrate, and gate lines surrounding outer sidewalls of the channels. The gate lines are stacked and spaced apart from one another along the vertical direction. The vertical memory device further includes common wirings electrically connected to gate lines located at the same level and included in different gate line stack structures of the plurality of the gate line stack structures, and signal wirings electrically connected to the gate lines via the common wirings. The signal wirings are distributed at different levels.

In exemplary embodiments, each gate line stack structure has a stepped shape, and includes step portions defined from the gate lines at respective levels.

In exemplary embodiments, the substrate includes a cell region, an extension region, and a peripheral circuit region. The channels are disposed on the cell region, and the step portions are disposed on the extension region.

In exemplary embodiments, the common wirings are disposed selectively on the extension region.

In exemplary embodiments, the signal wirings extend from the extension region to the peripheral circuit region.

In exemplary embodiments, the signal wirings are disposed over the common wirings, and the signal wirings extend in a different direction from that of the common wirings.

In exemplary embodiments, the vertical memory device further includes first contacts disposed on the step portions. First contacts electrically connected to step portions at the same level of the step portions are connected to one another by a same one of the common wirings.

In exemplary embodiments, the first contacts are arranged in a zigzag configuration along a direction of the signal wirings.

In exemplary embodiments, the vertical memory device further includes second contacts connecting the signal wirings and the common wirings. One of the second contacts is provided per each of the common wirings.

In exemplary embodiments, the vertical memory device further includes a plurality of bit lines electrically connected to the channels, and a conductive line interposed between the gate line stack structures.

In exemplary embodiments, the bit lines and the common wirings are disposed over the conductive line.

According to exemplary embodiments, a vertical memory device includes a substrate, a plurality of channels extending in a vertical direction with respect to a top surface of the substrate, and a plurality of gate lines surrounding a predetermined number of channels of the channels. The gate lines are arranged and spaced apart from one another along the vertical direction and a lateral direction. The gate lines include a ground selection line (GSL), word lines, and a string selection line (SSL) sequentially stacked from the top surface of the substrate. The vertical memory device further includes common wirings electrically connected to gate lines at the same level of the gate lines, and signal wirings electrically connected to the gate lines via the common wirings. The signal wirings are distributed at a plurality of levels.

In exemplary embodiments, the signal wirings are disposed over the common wirings, and the signal wirings include first signal wirings and second signal wirings, which are located at different levels.

In exemplary embodiments, the first signal wirings are electrically connected to the GSL and lower word lines of the word lines at a predetermined number of lower levels.

In exemplary embodiments, the second signal wirings are electrically connected to upper word lines of the word lines except for the lower word lines.

In exemplary embodiments, the second signal wirings include a signal wiring electrically connected to the SSL.

In exemplary embodiments, the second signal wirings are disposed over the first signal wirings.

In exemplary embodiments, the vertical memory device further includes first contacts connecting the gate lines and the common wirings, second contacts connecting the common wirings and the first signal wirings, and third contacts connecting the common wirings and the second signal wirings. One of the second contacts or one of the third contacts is disposed on each of the common wirings.

In exemplary embodiments, the gate lines and the signal wirings extend in the same direction, and the common wirings extend in a direction crossing that of the signal wirings.

In exemplary embodiments, the common wirings overlap end portions of the gate lines and do not overlap the channels.

According to exemplary embodiments of the inventive concept, a vertical memory device includes a substrate including a cell region, an extension region, and a peripheral circuit region. The vertical memory device further includes a plurality of vertical channels on the cell region of the substrate, and gate lines surrounding the channels. The gate lines are stacked from a top surface of the substrate on the cell region and the extension region. The vertical memory device further includes a conductive line cutting/intersecting the gate lines, and common wirings crossing over the gate lines and the conductive line. The common wirings connect gate lines at the same height of the gate lines. The vertical memory device further includes signal wirings connected to the respective common wirings on the extension region. The signal wirings extend from the extension region to the peripheral circuit region.

In exemplary embodiments, the vertical memory device further includes an impurity region formed at an upper portion of the substrate in the peripheral circuit region, and a peripheral circuit contact electrically connected to the impurity region. At least one of the signal wirings is electrically connected to the impurity region via the peripheral circuit contact.

In exemplary embodiments, the signal wirings are arranged three-dimensionally.

According to exemplary embodiments of the inventive concept, a vertical memory device includes a substrate, a plurality of channels extending in a first direction substantially vertical to a top surface of the substrate, and a plurality of gate lines surrounding a predetermined number of channels from among the channels. The gate lines are arranged and spaced apart from one another along the first direction. The vertical memory device further includes a plurality of common wirings electrically connected to the gate lines. Each common wiring is electrically connected to a corresponding gate line at a same level of the corresponding gate line via a corresponding contact. The vertical memory device further includes a plurality of signal wirings electrically connected to the gate lines via the common wirings.

According to exemplary embodiments of the inventive concept, a vertical memory device includes a substrate and a plurality of gate line stack structures disposed on the substrate. Each gate line stack structure includes a plurality of channels extending in a first direction substantially vertical to a top surface of the substrate, and a plurality of gate lines surrounding outer sidewalls of the channels. The gate lines are stacked and spaced apart from one another along the first direction. The vertical memory device further includes a plurality of common wirings included in different gate line stack structures from among the gate line stack structures. Each common wiring is electrically connected to a corresponding gate line at a same level of the corresponding gate line. The vertical memory device further includes a plurality of signal wirings electrically connected to the gate lines via the common wirings. The signal wirings are disposed at different levels from one another.

According to exemplary embodiments of the inventive concept, a vertical memory device includes a substrate, a plurality of channels extending in a vertical direction with respect to a top surface of the substrate, and a plurality of gate lines surrounding a predetermined number of channels from among the channels. The gate lines are arranged and spaced apart from one another along the vertical direction. The gate lines include a ground selection line (GSL), a plurality of word lines, and a string selection line (SSL) sequentially stacked on the top surface of the substrate. The vertical memory device further includes a plurality of common wirings electrically connected to the gate lines. Each common wiring is electrically connected to a corresponding gate line at a same level of the corresponding gate line. The vertical memory device further includes a plurality of signal wirings electrically connected to the gate lines via the common wirings. The signal wirings are distributed at a plurality of levels.

According to exemplary embodiments of the inventive concept, a vertical memory device includes a substrate including a cell region, an extension region, and a peripheral circuit region, a plurality of vertical channels disposed in the cell region, and a plurality of gate lines surrounding the channels. The gate lines are stacked on a top surface of the substrate in the cell region and the extension region. The vertical memory device further includes a conductive line intersecting the gate lines, and a plurality of common wirings crossing the gate lines and the conductive line. The common wirings connect to the gate lines at a same height of the gate lines. The vertical memory device further includes a plurality of signal wirings connected to the common wirings in the extension region. The signal wirings extend from the extension region to the peripheral circuit region.

According to exemplary embodiments of the inventive concept, a vertical memory device includes a substrate, a channel extending in a first direction substantially vertical to a top surface of the substrate, and a plurality of gate lines arranged and spaced apart from one another along the first direction. The channel extends through the gate lines in the first direction. The vertical memory device further includes a plurality of common wirings electrically connected to the gate lines, and a plurality of first contacts extending in the first direction. A first end of each first contact is connected to one common wiring from among the common wirings, and a second end of each first contact is connected to a gate line from among the gate lines. The second ends of the first contacts are disposed at different levels from one another. The vertical memory device further includes a first signal wiring electrically connected to lower gate lines from among the gate lines via the common wirings, and a second signal wiring electrically connected to upper gate lines from among the gate lines via the common wirings.

In exemplary embodiments, the common wirings are disposed at a same level as one another, the first signal wiring is disposed over the common wirings, and the second signal wiring is disposed over the first signal wiring.

In exemplary embodiments, the gate lines are stacked along the first direction, and the gate lines extend in a second direction substantially parallel to the top surface of the substrate. In addition, the common wirings extend in a third direction substantially parallel to the top surface of the substrate and crossing the second direction, and the signal wirings extend in the second direction.

BRIEF DESCRIPTION OF THE DRAWINGS

The above and other features of the present inventive concept will become more apparent by describing in detail exemplary embodiments thereof with reference to the accompanying drawings, in which:

FIGS. 1A, 1B, 2 and 3 are top plan views and cross-sectional views illustrating a vertical memory device according to exemplary embodiments of the inventive concept.

FIGS. 4 to 34 are cross-sectional views and top plan views illustrating a method of manufacturing a vertical memory device according to exemplary embodiments of the inventive concept.

FIGS. 38 to 40 are a top plan view and cross-sectional views illustrating a vertical memory device according to exemplary embodiments of the inventive concept.

DETAILED DESCRIPTION OF THE EXEMPLARY EMBODIMENTS

Figure 2:
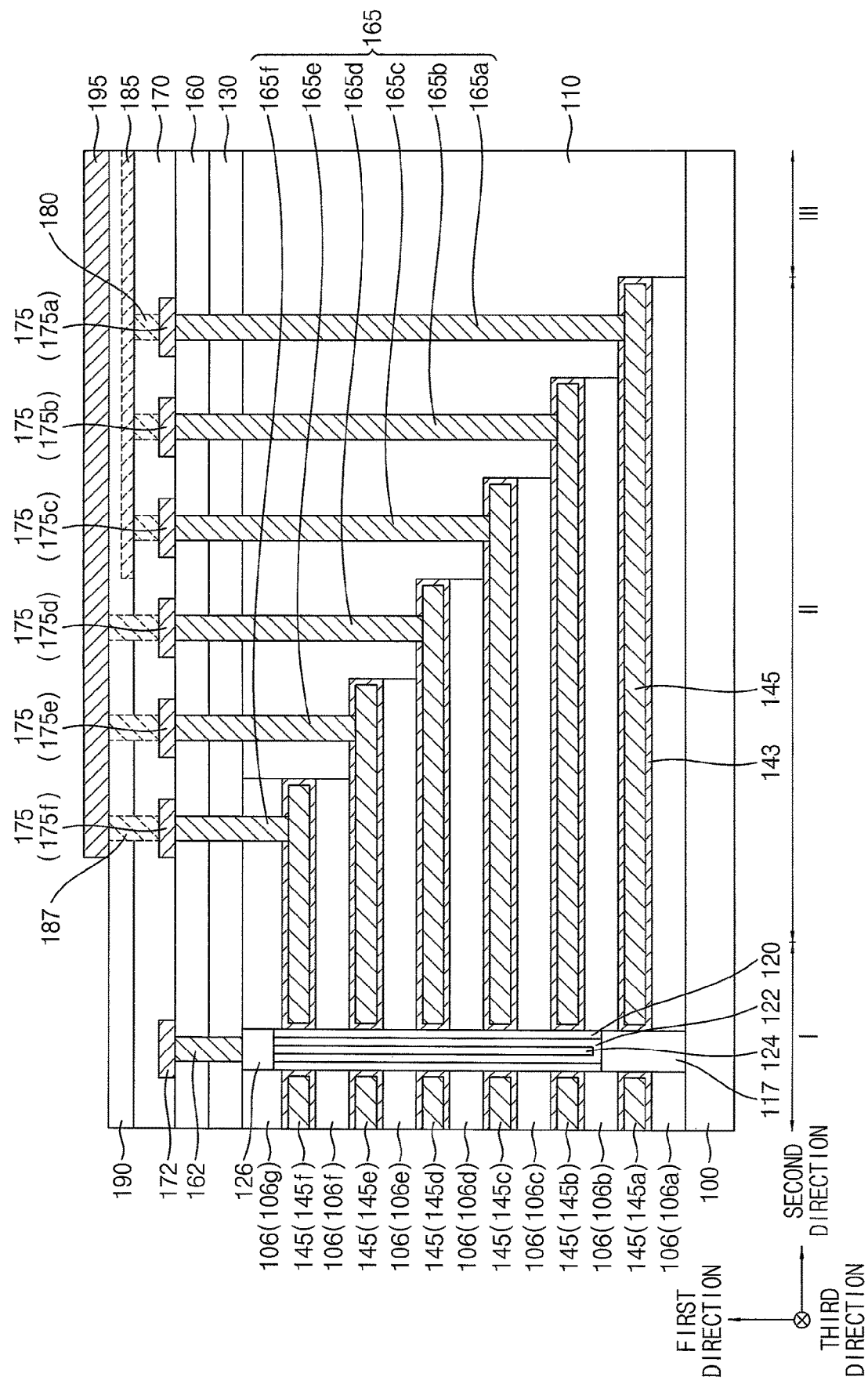

Exemplary embodiments of the inventive concept will be described more fully hereinafter with reference to the accompanying drawings. In the drawings, the sizes and relative sizes of layers and regions may be exaggerated for clarity. Like reference numerals may refer to like elements throughout the accompanying drawings.

It will be understood that when an element or layer is referred to as being "on," "connected to" or "coupled to" another element or layer, it can be directly on, connected or coupled to the other element or layer or intervening elements or layers may be present.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper," etc. may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

As used herein, the singular forms "a," "an" and "the" are intended to include the plural forms as well, unless the context clearly indicates otherwise.

Exemplary embodiments of the inventive concept are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

In the exemplary embodiments described herein, a direction substantially vertical to a top surface of a substrate is referred to as a first direction, and two directions substantially parallel to the top surface of the substrate and crossing each other are referred to as a second direction and a third direction. For example, the second direction and the third direction are substantially perpendicular to each other. Additionally, a direction indicated by an arrow and a reverse direction thereof are considered as the same direction.

Herein, when a first element is described as surrounding a second element, it is to be understood that the first element may entirely or partially surround the second element. Further, when two directions are described as being substantially parallel or perpendicular to each other, it is to be understood that the two directions are exactly parallel or perpendicular to each other, or are approximately parallel or perpendicular to each other as would be understood by a person having ordinary skill in the art. Further, when two or more elements are described as extending in substantially the same direction, it is to be understood that the two or more elements extend in exactly the same direction, or extend in approximately the same direction as would be understood by a person having ordinary skill in the art. Further, when a first element is described as extending in a direction substantially perpendicular or parallel to a surface of a second element, it is to be understood that the first element extends in a direction exactly perpendicular or parallel to the surface of the second element, or extends in a direction approximately perpendicular or parallel to the surface of the second element as would be understood by a person having ordinary skill in the art.

FIGS. 1A, 1B, 2 and 3 are top plan views and cross-sectional views illustrating a vertical memory device according to exemplary embodiments of the inventive concept.

More specifically, FIGS. 1A and 1B are top plan views illustrating a vertical memory device according to exemplary embodiments of the inventive concept. FIGS. 2 and 3 are cross-sectional views taken along lines I-I' and II-II' of FIG. 1A, respectively, according to exemplary embodiments of the inventive concept.

For convenience of explanation, an illustration of insulation structures is omitted in FIGS. 1A and 1B.

Referring to FIGS. 1A, 1B, 2 and 3, in exemplary embodiments, the vertical memory device includes a vertical channel structure including a channel 122, a dielectric layer structure 120, and a filling insulation pattern 124. The channel structure extends in a first direction from a top surface of the substrate 100. The vertical memory device further includes gate lines 145 surrounding the vertical channel structure and stacked along the first direction in a stepped shape to be spaced apart from one another, and first contacts 165 (e.g., 165a through 165f) and 166 (e.g., 166a through 166o) electrically connected to the gate lines 145. A wiring structure including a common wiring 175, a first signal wiring 185, and a second signal wiring 195 is disposed on the first contacts 165 and 166. The wiring structure is electrically connected to the gate lines 145 via the first contacts 165 and 166.

The substrate 100 may include a semiconductor material such as, for example, silicon and/or germanium. In exemplary embodiments, the substrate 100 may include single crystalline silicon. For example, the substrate 100 may serve as a body and/or a p-type well of the vertical memory device.

The vertical memory device may include a first region I, a second region II and a third region III. The substrate 100 may be divided into the first region I, the second region II and the third region III.

In exemplary embodiments, the first region I, the second region II and the third region III may correspond to a cell region, an extension region and a peripheral circuit region, respectively, of the vertical memory device.

Memory cells of the vertical memory device may be disposed on the cell region. For example, a cell string may be defined by the vertical channel structure and the gate lines 145 surrounding the vertical channel structure. Step portions of the gate lines 145 protruding in a second direction may be disposed on the extension region. A peripheral circuit configured to drive the vertical memory device may be disposed on the peripheral circuit region.

In exemplary embodiments, a pair of the second regions II may be located symmetrically with respect to the first region I.

The vertical channel structure including the channel 122, the dielectric layer structure 120, and the filling insulation pattern 124 may extend through the gate lines 145 and insulating interlayer patterns 106 in the first direction.

The channel 122 may be disposed on the first region I of the substrate 100. The channel 122 may have, for example, a hollow cylindrical shape or a cup shape. The channel 122 may include, for example, polysilicon or single crystalline silicon, and may include, for example, p-type impurities such as boron (B) in a portion thereof.

The filling insulation pattern 124 may fill an inner space of the channel 122, and may have, for example, a solid cylindrical shape or a pillar shape. The filling insulation pattern 124 may include an insulation material such as, for example, silicon oxide. In an exemplary embodiment, the channel 122 may have a pillar shape or a solid cylindrical shape, and the filling insulation pattern 124 may be omitted.

The dielectric layer structure 120 may be formed on an outer sidewall of the channel 122. The dielectric layer structure 120 may have, for example, a straw shape or a cylindrical shell shape.

The dielectric layer structure 120 may include, for example, a tunnel insulation layer, a charge storage layer, and a blocking layer, which may be sequentially stacked from the outer sidewall of the channel 122. The blocking layer may include, for example, silicon oxide or a metal oxide such as, for example, hafnium oxide or aluminum oxide. The charge storage layer may include, for example, a nitride such as silicon nitride or a metal oxide, and the tunnel insulation layer may include, for example, an oxide such as silicon oxide. For example, the dielectric layer structure 120 may have an oxide-nitride-oxide (ONO) layered structure.

As illustrated in FIGS. 2 and 3, a semiconductor pattern 117 is interposed between the top surface of the substrate 100 and the vertical channel structure. In exemplary embodiments, a channel hole extending through the gate lines 145 and the insulating interlayer patterns 106 in the first direction and exposing the top surface of the substrate 100 may be formed. The semiconductor pattern 117 may be formed at a lower portion of the channel hole, and may be in contact with the top surface of the substrate 100. The channel 122 may be disposed on a top surface of the semiconductor pattern 117, and the dielectric layer structure 122 may be formed on a peripheral portion of the top surface of the semiconductor pattern 117.

In exemplary embodiments, a pad 126 is formed on the dielectric layer structure 120, the channel 122 and the filling insulation pattern 124. For example, an upper portion of the channel hole may be capped by the pad 126.

The pad 126 may be electrically connected to, for example, a bit line 172, and may serve as a source/drain region through which charges may be transferred to the channel 122. The pad 126 may include, for example, polysilicon or single crystalline silicon. In exemplary embodiments, the pad 126 is doped with n-type impurities such as, for example, phosphorus (P) or arsenic (As).

As illustrated in FIG. 1A, a plurality of the pads 126 may be arranged along the second direction such that a pad row may be defined, and a plurality of the pad rows may be arranged in a third direction. The vertical channel structures may be arranged according to an arrangement of the pads 126. For example, a plurality of the vertical channel structures may be arranged along the second direction to form a channel row, and a plurality of the channel rows may be arranged in the third direction.

The gate lines 145 (e.g., 145a through 145f) may be formed on an outer sidewall of the dielectric layer structure 120 or the semiconductor pattern 117, and may be spaced apart from one another along the first direction. In exemplary embodiments, each gate line 145 may surround (e.g., partially surround) the channels 122 or the vertical channel structures included in at least one of the channel rows, and may extend in the second direction.

In exemplary embodiments, each gate line 145 may surround the predetermined number of the channel rows (e.g., 4 channel rows). In this case, a gate line stack structure may be defined by the predetermined number of channel rows (e.g., 4 channel rows) and the gate lines 145 surrounding the predetermined number of channel rows (e.g., 4 channel rows). A plurality of the gate line stack structures may be arranged along the third direction.

In exemplary embodiments, widths of the gate lines 145 in the second direction may be reduced along the first direction from the top surface of the substrate 100. For example, as illustrated in FIGS. 1A and 2, a plurality of the gate lines 145 may be stacked in a pyramidal shape or a stepped shape along the first direction.

Accordingly, in exemplary embodiments, the gate line 145 of each level includes the step portion protruding in the second direction from the gate line 145 at an upper level thereof. For example, each gate line 145 other than the uppermost gate line (e.g., gate line 145f) may include a step portion protruding in the second direction beyond a step portion of an adjacent upper gate line 145, as shown in FIG. 2. The step portion of each gate line 145 may serve as a contact pad for the first contact 165, and the step portions may be arranged on the second region II.

The gate lines 145 may include a ground selection line (GSL), a word line, and a string selection line (SSL). For example, a lowermost gate line 145a may serve as the GSL, an uppermost gate line 145f may serve as the SSL, and the gate lines 145b to 145e between the GSL and the SSL may serve as the word lines.

The GSL (e.g., the gate line 145a) may laterally surround the semiconductor pattern 117. The word lines (e.g., the gate lines 145b to 145e) and the SSL (e.g., the gate line 145f) may laterally surround the channel 122 or the dielectric layer structure 120.

The gate lines 145 may be formed at increased levels in consideration of a circuit design and a degree of integration of the vertical memory device (e.g. 16 levels, 24 levels, 32 levels, 48 levels, etc.). The SSLs may be formed at two or more levels.

The gate line 145 may include a metal such as, for example, tungsten (W), a metal nitride and/or a metal silicide. In exemplary embodiments, the gate line 145 may have a multi-layered structure including a metal nitride/metal such as, for example, tungsten nitride/tungsten.

Insulating interlayer patterns 106 (e.g., 106a through 106g) may be disposed between the gate lines 145 neighboring in the first direction. The insulating interlayer pattern 106 may include a silicon oxide-based material such as, for example, silicon dioxide ($SiO_2$), silicon oxycarbide (SiOC) or silicon oxyfluoride (SiOF). The gate lines 145 included in one gate line stack structure may be insulated from one another by the insulating interlayer patterns 106. In exemplary embodiments, the insulating interlayer patterns 106 may be stacked along the first direction in a pyramidal shape or a stepped shape substantially the same as or similar to that of the gate lines 145.

The gate line 145 at each level may be surrounded by an interface layer 143. The interface layer 143 may be formed between the gate line 145 and the dielectric layer structure 120, and between the insulating interlayer pattern 106 and the gate line 145. In exemplary embodiments, the interface layer 143 at a lowermost level may contact a sidewall of the semiconductor pattern 117, and may serve as a gate insulation layer of the GSL.

The interface layer 143 may be included for adjusting a work function between the channel 122 and the gate line 145. The interface layer 143 may include, for example, a metal oxide and/or a metal nitride. The metal oxide may include, for example, aluminum oxide, and the metal nitride may include, for example, titanium nitride, tantalum nitride and/or tungsten nitride.

A mold protection layer 110 (see FIG. 2) covering the stepped portions of the gate lines 145 may be formed on a lateral portion of the gate line stack structure. A first upper insulation layer 130 may be formed on the mold protection layer 110, an uppermost insulating interlayer pattern 106g, and the pads 126.

The mold protection layer 110 and the first upper insulation layer 130 may include an insulation material such as, for example, silicon oxide.

In exemplary embodiments, a conductive line 155 is interposed between the gate line stack structures, and an insulation pattern 150 is formed on a sidewall of the conductive line 155. For example, the conductive line 155 and the insulation pattern 150 may intersect the first upper insulation layer 130, the gate lines 145, the insulating interlayer patterns 106, and the mold protection layer 110, and may extend in the second direction. The gate line stack structure including the predetermined number of the channel rows (e.g., the 4 channel rows) may be defined by the conductive line 155 and the insulation pattern 150.

In exemplary embodiments, the conductive line 155 may serve as a common source line (CSL) of the vertical memory device. The conductive line 155 and the gate lines 145 included in the gate line stack structure may be insulated from one another by the insulation pattern 150.

The conductive line 155 may include a metal such as, for example, tungsten or copper. The insulation pattern 150 may include, for example, silicon oxide.

In exemplary embodiments, an impurity region 103 (see FIG. 3) is formed at an upper portion of the substrate 100 under the conductive line 155 and the insulation pattern 150. The first impurity region 103 extends in the second direction.

In exemplary embodiments, a second upper insulation layer 160 is formed on the first upper insulation layer 130, and covers the conductive line 155 and the insulation pattern 150.

As illustrated in FIGS. 1A and 2, in exemplary embodiments, the first contacts 165 (e.g., 165a through 165f) extend through the second upper insulation layer 160, the first upper insulation layer 130, and the mold protection layer 110 (or the uppermost insulating interlayer pattern 106g) to be electrically connected to the gate lines 145a to 145f.

In exemplary embodiments, the first contacts 165 are distributed on the second region II, and are electrically connected to the step portions of the gate lines 145. One of the first contacts 165 may be disposed on each step portion of one gate line 145. For example, the first contacts 165 may be arranged along the second direction to form a first contact row provided for each gate line stack structure. According to an arrangement of the gate line stack structures, a plurality of the first contact rows may be arranged along the third direction.

In exemplary embodiments, as illustrated in FIG. 1A, the first contacts 165 included in the first contact row may be arranged in a zigzag configuration along the second direction in a plane view. Accordingly, a distance between the neighboring first contacts 165 may be increased so that a process margin for forming the first contacts 165 may be additionally obtained.

In exemplary embodiments, as illustrated in FIG. 1B, the first contacts 166 included in the first contact row may be arranged in a substantially straight line (e.g., in exactly a straight line or in approximately a straight line as would be understood by one having ordinary skill in the art) along the second direction in a plane view.

Hereinafter, the vertical memory device will be further described with reference to the structure illustrated in FIG. 1A.

In exemplary embodiments, the first contact 165 may extend through the interface layer 143 of each level to be in contact with a top surface of the gate line 145.

In exemplary embodiments, a bit line contact 162 electrically connected to the pad 126 is disposed on the first region I. For example, the bit line contact 162 may extend through portions of the second upper insulation layer 160 and the first upper insulation layer 130 on the first region I to be disposed on a top surface of the pad 126.

In exemplary embodiments, the common wirings 175 (e.g., 175a through 175o electrically connected to the first contacts 165 are disposed on the second upper insulation layer 160.

In exemplary embodiments, the common wiring 175 is in contact with a plurality of the first contacts 165, and is electrically connected to the gate lines 145 at the same level. In exemplary embodiments, the common wirings 175 are disposed at a same level (e.g., at a same level within a same layer) as one another, and each common wiring 175 may be electrically connected to a corresponding gate line 145 at a same level of the corresponding gate line 145 via a corresponding contact 165. For example, as shown in FIG. 2, the common wirings 175a to 175f are disposed at a same level as one another in the third upper insulating layer 170. The common wirings 175a to 175f are substantially aligned (e.g., exactly aligned or approximately aligned as would be understood by one having ordinary skill in the art) with one another in the second direction to be disposed at the same level as one another. Referring to FIG. 2, the common wiring 175a is electrically connected to the corresponding gate line 145a at a same level of the corresponding gate line 145a via the corresponding first contact 165a, the common wiring 175b is electrically connected to the corresponding gate line 145b at a same level of the corresponding gate line 145b via the corresponding first contact 165b, etc. Thus, the common wirings 175 connect to the gate lines 145 at a same height as the gate lines 145. For example, referring to FIG. 2, the common wiring 175a is connected to the corresponding gate line 145a via the corresponding first contact 165a at a same height relative to the substrate 100, the common wiring 175b is connected to the corresponding gate line 145b via the corresponding first contact 165b at a same height relative to the substrate 100, etc. The first contacts 165 have different lengths from one another since the first contacts 165 connect to the corresponding gate lines 145 at a level/height corresponding to each of the gate lines 145. A first end of each first contact 165 is connected to one common wiring 175, and a second end of each first contact 165 is connected to a gate line 145. As shown in FIG. 2, the second ends of the first contacts 165 are disposed at different levels from one another.

In exemplary example embodiments, the common wiring 175 extends in the third direction, and a plurality of the common wirings 175 is arranged along the second direction.

As described above, a plurality of the gate line stack structures may be separated from each other by the conductive line 155 and the insulation pattern 150, and may be arranged along the third direction. In exemplary embodiments, a plurality of the gate lines 145 included in the different gate line stack structures and located at the same level may be electrically connected via the common wiring 175 to be merged as one unit.

In exemplary embodiments, the common wiring 175 extends in a direction crossing an extension direction of each gate line 145. As described above, for example, the common wiring 175 may extend in the third direction, and the gate line 145 may extend in the second direction.

In exemplary embodiments, the commons wirings 175 are disposed on the second region II. In exemplary embodiments, the common wirings 175 are selectively disposed on the second region II, and are not disposed on the first and third regions I and III. In exemplary embodiments, the common wirings 175 are disposed on the second region II, and at least some of the common wirings 175 also extend or are diverged to the third region III.

In exemplary embodiments, the bit line 172 is disposed on a portion of the second upper insulation layer 160 on the first region I.

In exemplary embodiments, the bit line 172 extends in the third direction, and is electrically connected to a plurality of the pads 126 via the bit line contacts 162. The bit line 172 may be electrically connected to the pads 126 included in the different gate line stack structures. A plurality of the bit lines 172 may be arranged along the second direction selectively on the first region I.

In exemplary embodiments, as illustrated in FIG. 1A, the bit line 172 and the common wiring 175 extend in substantially the same direction. In exemplary embodiments, the bit line 172 and the common wiring 175 are located at substantially the same level (e.g., on the second upper insulation layer 160).

In exemplary embodiments, as illustrated in FIG. 3, the bit line 172 crosses over the conductive line 155, which may serve as the CSL, as described above. The bit line 172 and the common wiring 175 may be disposed at an upper level of the conductive line 155.

In exemplary embodiments, a third upper insulation layer 170 covering the bit lines 172 and the common wirings 175 is formed on the second upper insulation layer 160. A second contact 180 is electrically connected to the common wiring 175 in the third upper insulation layer 170. In exemplary embodiments, the second contacts 180 are disposed on some of the common wirings 175 (e.g., the common wirings 175a, 175b and 175c).

In exemplary embodiments, the first signal wirings 185 (e.g., 185a, 185b and 185c) electrically connected to the common wiring 175 are disposed on the third upper insulation layer 170. The first signal wirings 185 and the second signal wirings 195 may be disposed over (e.g., overlap) the common wirings 175. That is, the first signal wirings 185 and the second signal wirings 195 may be disposed at a level higher than that of the common wirings 175 and may overlap the common wirings 175.

In exemplary embodiments, the first signal wirings 185 are selectively connected to some of the gate lines 145 via the some of the common wirings 175. In exemplary embodiments, the first signal wirings 185a, 185b and 185c are electrically connected selectively to the gate lines 145 at lower levels (e.g., the gate lines 145a, 145b and 145c).

In exemplary embodiments, the first signal wirings 185 are electrically connected to the GSL and some of the word lines.

In exemplary embodiments, the first signal wiring 185 extends in a direction different from that of the bit line 172 and/or the common wiring 175. In exemplary embodiments, as illustrated in FIG. 1A, the first signal wiring 185 extends in the second direction. For example, the first signal wiring 185 may extend in a direction substantially the same as that of the gate line 145, and may cross over the common wiring 175.

In exemplary embodiments, the first signal wiring 185 is disposed on the second region II and the third region III. In exemplary embodiments, the first signal wiring 185 is selectively disposed on the second region II and the third region III, and does not extend to the first region I.

In exemplary embodiments, a fourth upper insulation layer 190 covering the first signal wirings 185 is formed on the third upper insulation layer 170. A third contact 187 may extend through the fourth and third upper insulation layers 190 and 170 to be electrically connected to the common wiring 175. In exemplary embodiments, the third contact 187 is disposed on remaining common wirings 175 (e.g., the common wirings 175d, 175e and 175f) except for the some of the common wirings 175 on which the second contact 180 is disposed.

In exemplary embodiments, the second signal wirings 195 (e.g., 195d, 195e and 195f) electrically connected to the common wirings 175 are disposed on the fourth upper insulation layer 190.

In exemplary embodiments, the second signal wirings 195 are selectively connected to some of the gate lines 145 via the remaining common wirings 175. The second signal wirings 195 may be electrically connected to remaining gate lines 145 except for the gate lines 145a, 145b and 145c electrically connected to the first signal wirings 185.

In exemplary embodiments, the second signal wirings 195d, 195e and 195f are electrically connected selectively to the gate lines 145 (e.g., 145d, 145e and 145f) at upper levels. For example, the second signal wirings 195 may be electrically connected to the SSL and remaining word lines except for the word lines electrically connected to the first signal wirings 185.

In exemplary embodiments, the second signal wiring 195 extends in a direction substantially the same as that of the first signal wiring 185. The second signal wiring 195 extends in a direction different from that of the bit line 172 and/or the common wiring 175.

In exemplary embodiments, as illustrated in FIG. 1A, the second signal wiring 195 extends in the second direction, and crosses over the common wiring 175.

In exemplary embodiments, the second signal wiring 195 is disposed on the second region II and the third region III. In exemplary embodiments, the second signal wiring 195 is selectively disposed on the second region II and the third region III, and does not extend to the first region I.

In exemplary embodiments, as illustrated in FIG. 1A, the second signal wirings 195 and the first signal wirings 185 are arranged in a plane view to be sequentially connected from the uppermost gate line 145f to the lowermost gate line 145a.

The second, third and fourth upper insulation layers 160, 170 and 190 may include a silicon oxide-based material substantially the same as or similar to that of the first upper insulation layer 130. The first to third contacts 165, 180 and 187, the bit line contact 162, the common wiring 175, the bit line 172, and the first and second signal wirings 185 and 195 may include a metal such as, for example, tungsten, copper, etc.

According to exemplary embodiments of the inventive concept, as described above, wirings connected to the gate lines 145 from a peripheral circuit region are dispersed at different levels using the common wirings 175.

In a comparative example, if the wirings are all arranged at the same level (e.g., on the first upper insulation layer 130 or on the second upper insulation layer 160), a density of the wirings may be excessively increased. As a result, cross-talk between the wirings may occur. Further, a width of each wiring may be reduced to accommodate the wirings in a limited area of the peripheral circuit region. However, as the stacked number of the gate lines 145 increases, the width of the wirings may not be sufficiently reduced due to a resolution limit of a patterning process. Additionally, resistance of the wirings may be increased when the width of the wiring is excessively reduced.

However, according to exemplary embodiments of the present inventive concept, the wirings may be arranged three-dimensionally using the common wirings 175 merging a plurality of the gate lines 145 at the same level. As a result, an increased area for accommodating the wirings is provided. Therefore, the stacked number of the gate lines 145 may be increased without increasing the resistance of the wirings. This configuration prevents or reduces cross-talk from occurring between the wirings.

FIGS. 1A, 1B, 2 and 3 illustrate that the signal wirings 185 and 195 are distributed throughout two levels. However, exemplary embodiments of the inventive concept are not limited thereto. For example, according to exemplary embodiments, the signal wirings 185 and 195 may be distributed throughout three or more levels. This configuration may be implemented when the gate lines 145 are stacked at increased levels. In an exemplary embodiment, the signal wirings may be dispersed in a single level.

FIGS. 4 to 34 are cross-sectional views and top plan views illustrating a method of manufacturing a vertical memory device according to exemplary embodiments of the inventive concept. For example, FIGS. 4 to 34 illustrate a method of manufacturing the vertical memory device illustrated in FIGS. 1A, 1B, 2 and 3 according to exemplary embodiments of the inventive concept.

More specifically, FIGS. 6, 15, 21, 23A, 23B, 26, 29 and 32 are top plan views illustrating the method of manufacturing a vertical memory device according to exemplary embodiments of the inventive concept. FIGS. 4, 5, 7, 9, 11, 13, 17, 19, 24, 27, 30 and 33 are cross-sectional views taken along line I-I' indicated in the top plan views. FIGS. 8, 10, 12, 14, 16, 18, 20, 22, 25 28, 31 and 34 are cross-sectional views taken along line II-II' indicated in the top plan views.

For convenience of explanation, an illustration of insulation structures is omitted in some of the top plan views.

Figure 4:
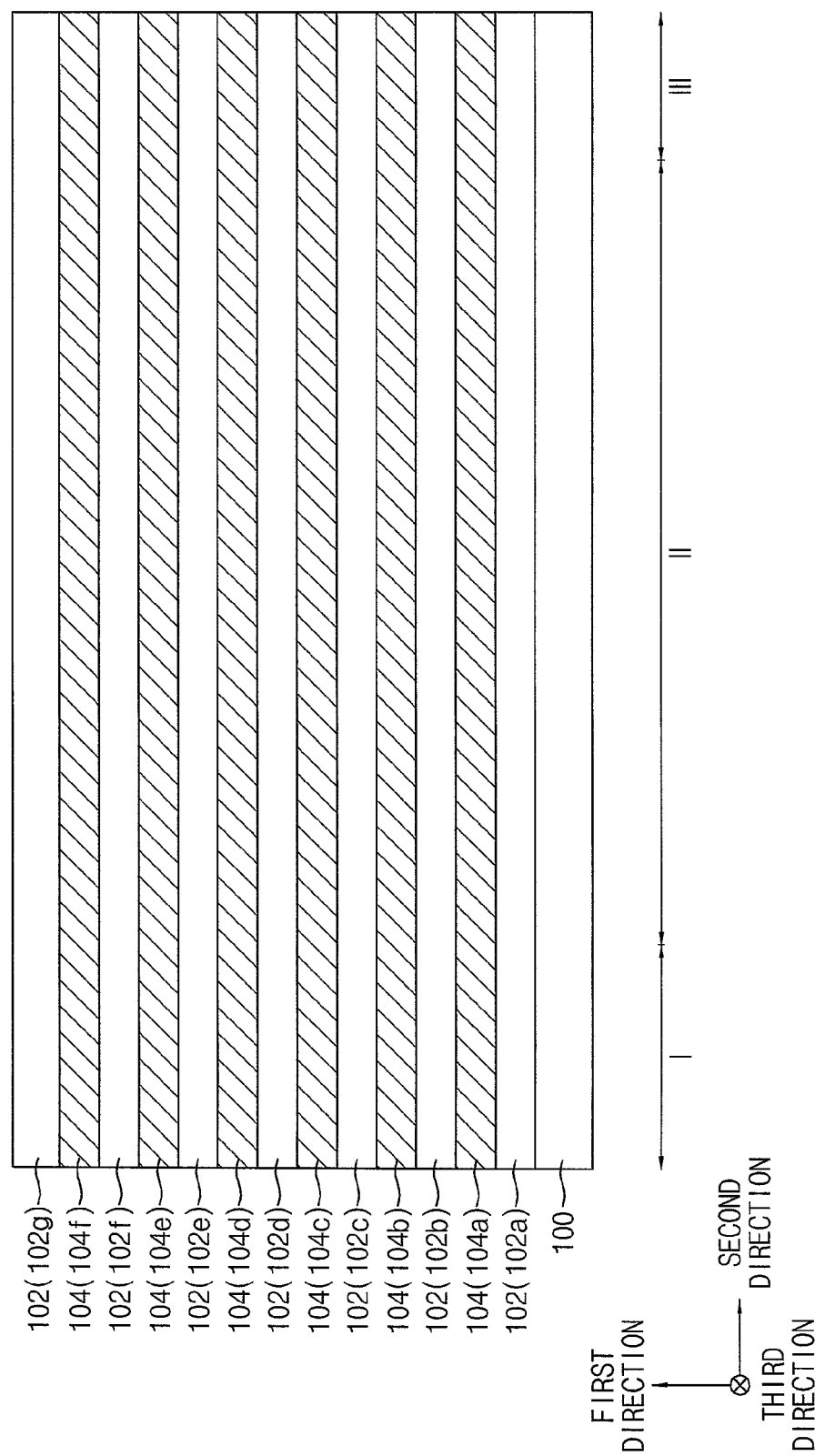

Referring to FIG. 4, in exemplary embodiments, insulating interlayers 102 (e.g., 102a through 102g) and sacrificial layers 104 (e.g., 104a through 104f) are formed alternately and repeatedly on the substrate 100 to form a mold structure.

The substrate 100 may include a semiconductor material such as, for example, silicon and/or germanium. In exemplary embodiments, the substrate 100 may include the first region I, the second region II and the third region III. As described above, the first region I, the second region II and the third region III may correspond to a cell region, an extension region and a peripheral circuit region, respectively, of the vertical memory device.

The insulating interlayer 102 may be formed of an oxide-based material such as, for example, silicon dioxide, silicon oxycarbide and/or silicon oxyfluoride. The sacrificial layer 104 may be formed of a material that has an etching selectivity with respect to the insulating interlayer 102 and that may be efficiently removed by a wet etching process. For example, the sacrificial layer 104 may be formed of a nitride-based material such as, for example, silicon nitride and/or silicon boronitride.

The insulating interlayer 102 and the sacrificial layer 104 may be formed by at least one of, for example, a chemical vapor deposition (CVD) process, a plasma enhanced chemical vapor deposition (PECVD) process, a high density plasma chemical vapor deposition (HDP-CVD) process, an atomic layer deposition (ALD) process, or a sputtering process.

In an exemplary embodiment, a lowermost insulating interlayer 102a may be formed by a thermal oxidation process or a radical oxidation process on a top surface of the substrate 100. In an exemplary embodiment, an uppermost insulating interlayer 102g may have a relatively large thickness in consideration of a formation of a pad 126 (see FIG. 13).

The sacrificial layers 104 may be removed in a subsequent process to provide spaces for a GSL, a word line and an SSL. Thus, the number of the insulating interlayers 102 and the sacrificial layers 104 may be determined in consideration of the number of the GSL, the word line and the SSL. FIG. 4 illustrates that the sacrificial layers 104 and the insulating interlayers 102 are formed at 6 levels and 7 levels, respectively. However, exemplary embodiments of the inventive concept are not limited thereto. For example, according to exemplary embodiments, the number of the insulating interlayers 102 and the sacrificial layers 104 may be increased depending on a degree of integration of the vertical memory device.

Figure 5:
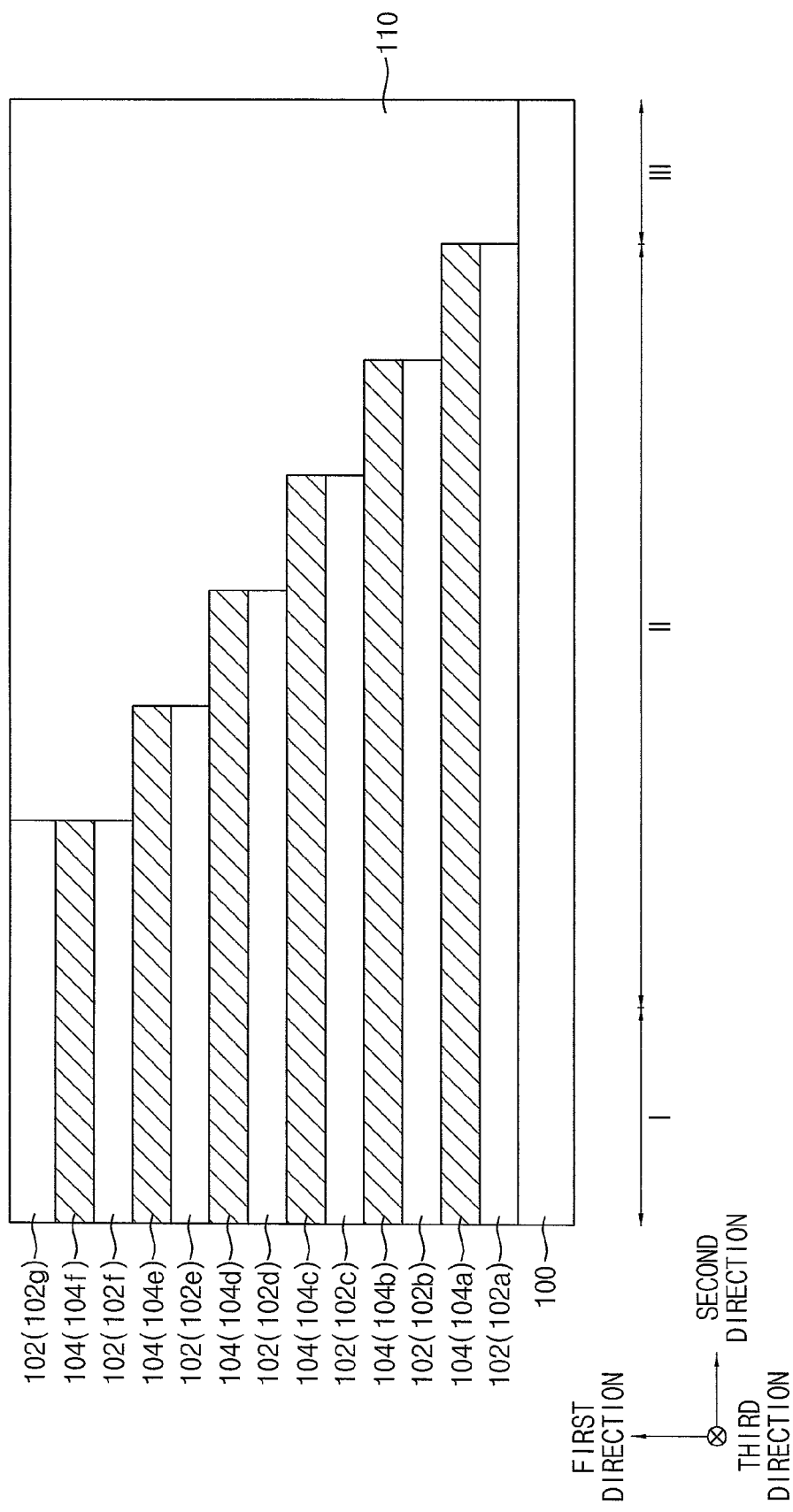

Referring to FIG. 5, in exemplary embodiments, a lateral portion of the mold structure is partially etched. The lateral portion of the mold structure may be partially etched in, for example, a stepwise manner to form a stepped mold structure.

A photoresist pattern covering the first region I and partially covering the second region II may be formed on the uppermost insulating interlayer 102g. Peripheral portions of the insulating interlayers 102g to 102a and the sacrificial layers 104f to 104a may be removed using the photoresist pattern as an etching mask. A peripheral portion of the photoresist pattern may be partially removed to reduce a width of the photoresist pattern. Peripheral portions of insulating interlayers 102g and 102b, and the sacrificial layers 104f and 104b may be etched using the photoresist pattern again as an etching mask. Etching processes may be repeated in a similar manner as described above to obtain the stepped mold structure illustrated in FIG. 5.

Subsequently, a mold protection layer 110 covering a lateral portion or step portions of the stepped mold structure may be formed on the substrate 100. For example, an insulation layer covering the stepped mold structure may be formed on the substrate 100 using, for example, silicon oxide by a CVD process or a spin coating process. An upper portion of the insulation layer may be planarized until the uppermost insulating interlayer 102g is exposed to form the mold protection layer 110. The planarization process may include, for example, a chemical mechanical polish (CMP) process and/or an etch-back process.

Figure 6:
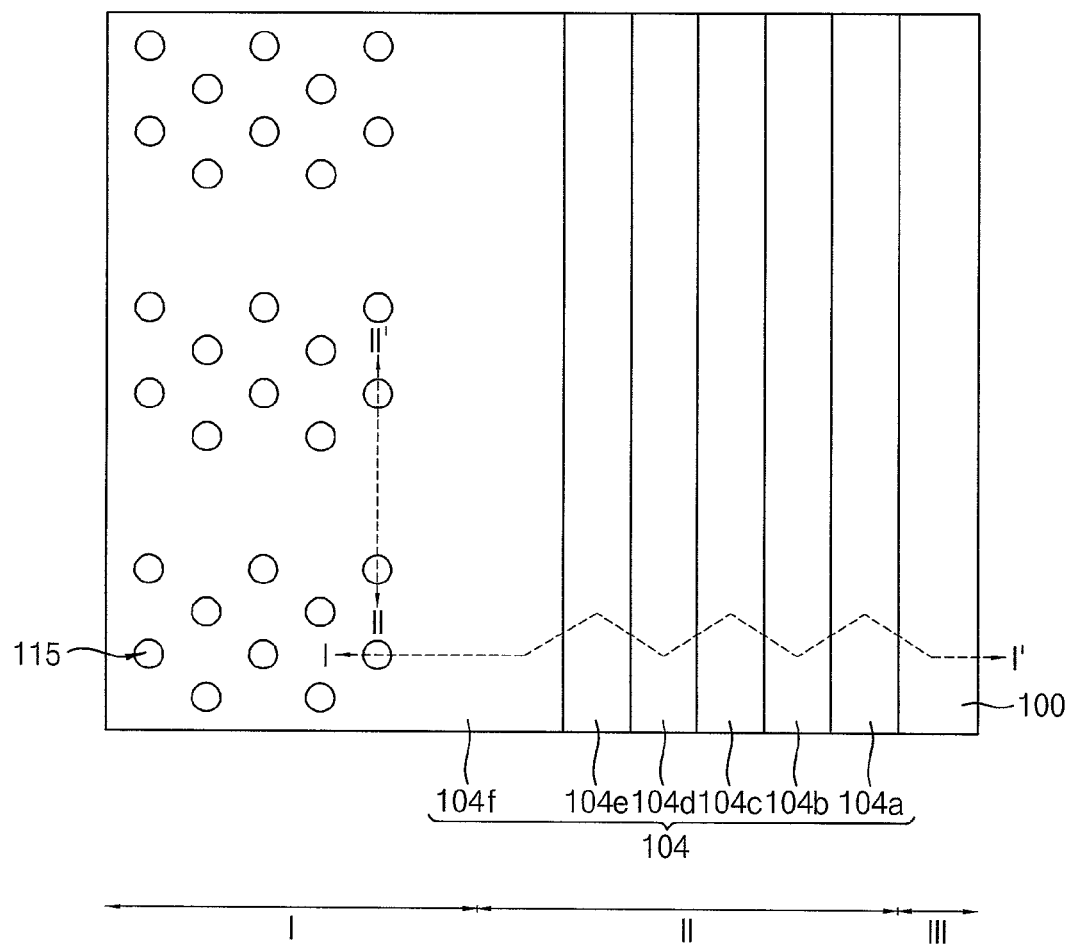
Figure 7:
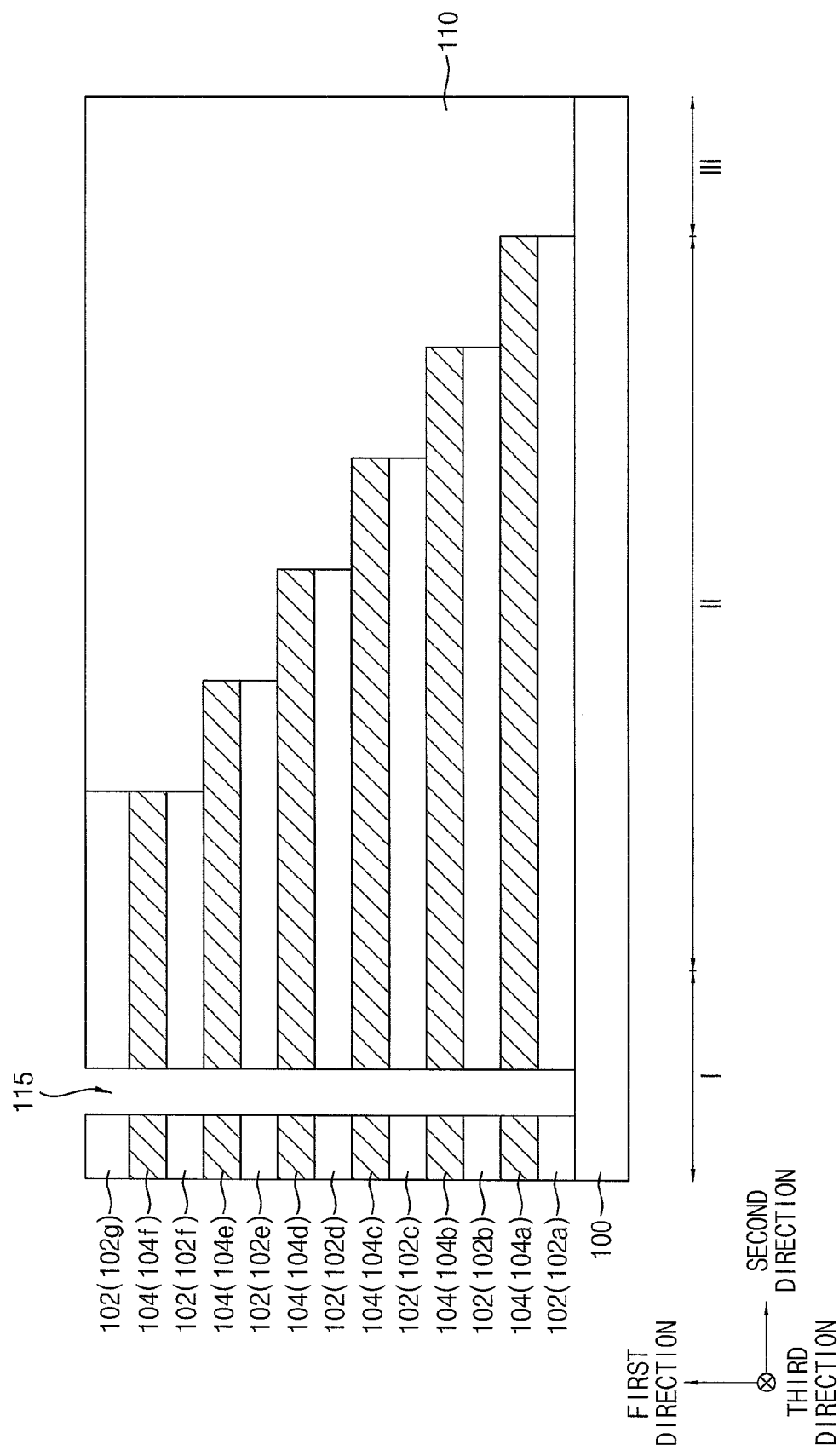

Referring to FIGS. 6 to 8, in exemplary embodiments, channel holes 115 are formed through the stepped mold structure.

For example, a hard mask may be formed on the uppermost insulating interlayer 102g and the mold protection layer 110. The insulating interlayers 102 and the sacrificial layers 104 of the stepped mold structure may be partially etched by performing, for example, a dry etching process. The hard mask may be used as an etching mask to form the channel hole 115. The channel hole 125 extends in the first direction from the top surface of the substrate 100. The top surface of the substrate 100 is partially exposed by the channel hole 115. The hard mask may be formed of, for example, silicon-based or carbon-based spin-on hardmask (SOH) materials, and/or a photoresist material.

As illustrated in FIG. 6, in exemplary embodiments, a plurality of the channel holes 115 is formed in the second direction to form a channel hole row. A plurality of the channel hole rows may be formed in the third direction. The channel holes 115 included in the different channel hole rows may be arranged in a zigzag configuration along the second direction and/or the third direction. The channel holes 115 may be formed in the first region I.

The hard mask may be removed by, for example, an ashing process and/or a strip process after the formation of the channel holes 115.

Figure 9:
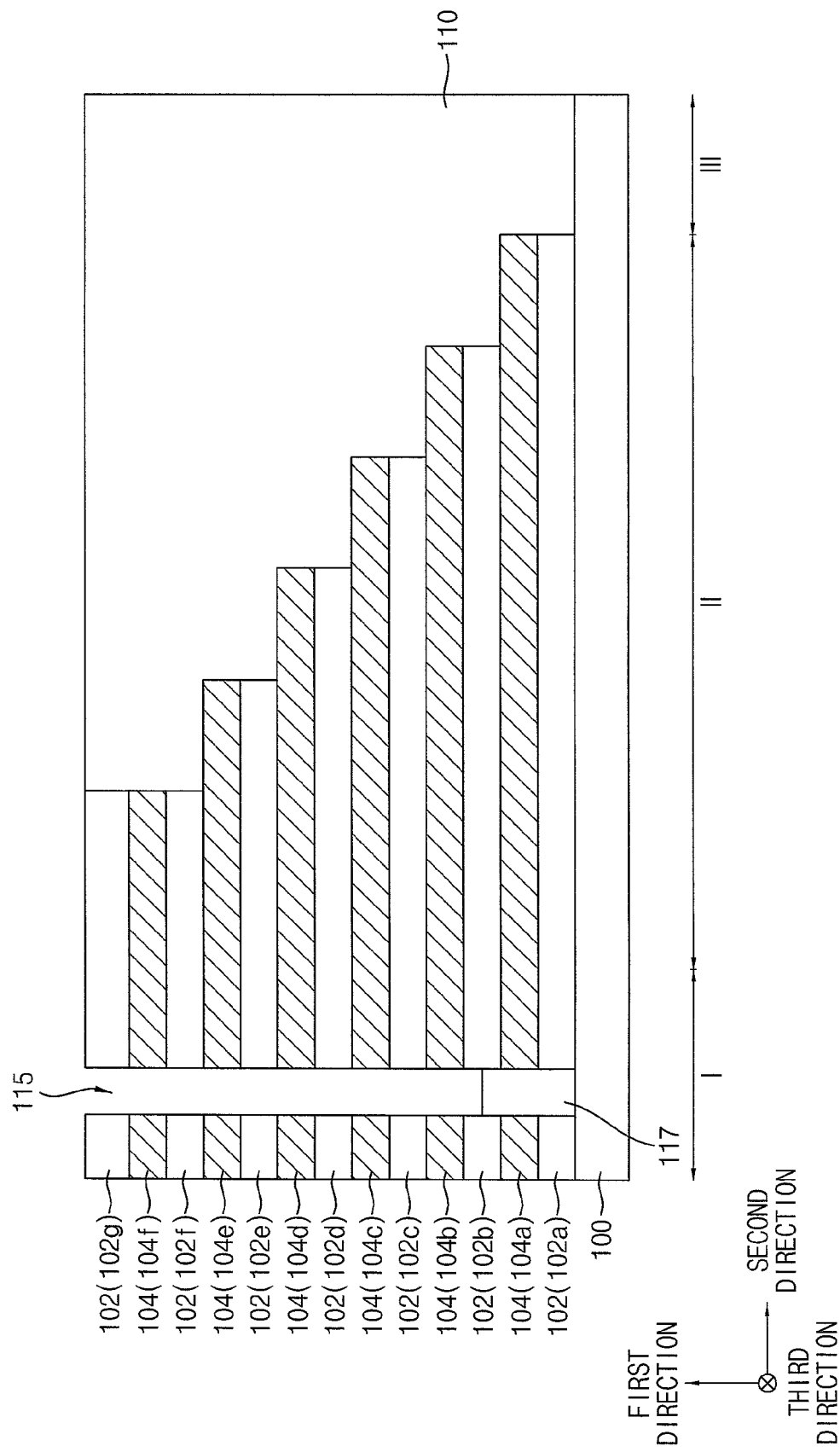

Referring to FIGS. 9 and 10, in exemplary embodiments, the semiconductor pattern 117 is formed at a lower portion of the channel hole 115.

For example, the semiconductor pattern 117 may be formed by a selective epitaxial growth (SEG) process using the top surface of the substrate 100 exposed through the channel hole 115 as a seed. In exemplary embodiments, an amorphous silicon layer filling the lower portion of the channel hole 115 may be formed, and a laser epitaxial growth (LEG) process or a solid phase epitaxi (SPE) process may be performed thereon to form the semiconductor pattern 117.

In exemplary embodiments, a top surface of the semiconductor pattern 117 is positioned between the sacrificial layers 104a and 104b at two lower levels.

Figure 11:
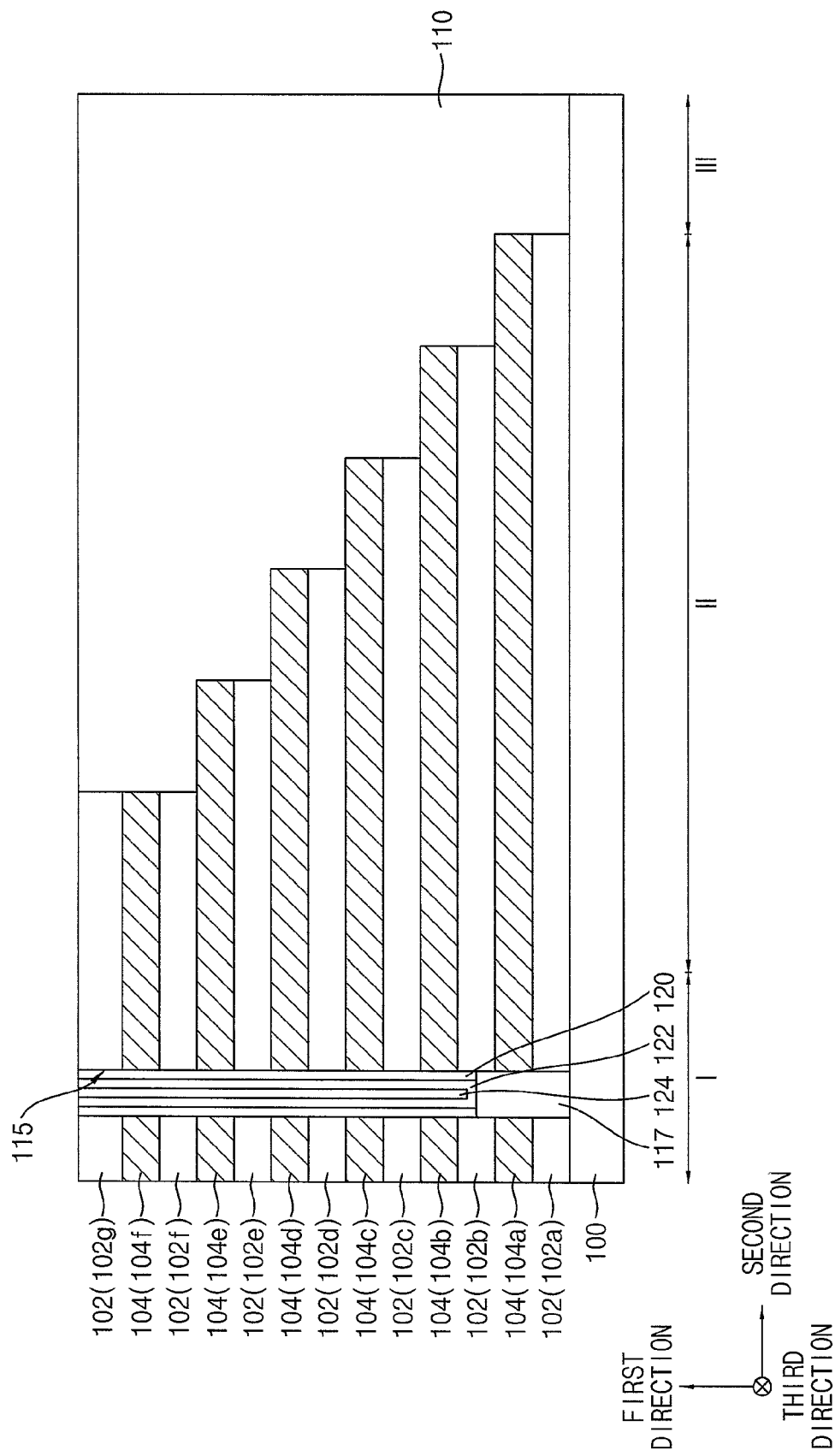

Referring to FIGS. 11 and 12, in exemplary embodiments, the vertical channel structure including the dielectric layer structure 120, the channel 122 and the filling insulation pattern 124 is formed in the channel hole 115.

In exemplary embodiments, a dielectric layer may be formed along sidewalls of the channel holes 115, and top surfaces of the semiconductor pattern 117 and the mold protection layer 110. Upper and lower portions of the dielectric layer may be removed by an etch-back process to form the dielectric layer structure 120 on the sidewall of the channel hole 115.

In exemplary embodiments, a channel layer and a filling insulation layer filling remaining portions of the channel holes 115 are sequentially formed on the mold protection layer 110, and upper portions of the channel layer and the filling insulation layer may be planarized by, for example, a CMP process until the mold protection layer 110 and/or the uppermost insulating interlayer 102g are exposed. Accordingly, the channel 122 and the filling insulation pattern 124 filling the channel hole 115 are formed on the semiconductor pattern 117.

In exemplary embodiments, the dielectric layer is formed by sequentially forming a blocking layer, a charge storage layer and a tunnel insulation layer. The blocking layer may be formed of, for example, silicon oxide or a metal oxide. The charge storage layer may be formed of a nitride such as, for example, silicon nitride or a metal oxide. The tunnel insulation layer may be formed of an oxide such as, for example, silicon oxide. For example, the dielectric layer may be formed as an oxide-nitride-oxide (ONO) layered structure. The blocking layer, the charge storage layer and the tunnel insulation layer may be formed by, for example, a CVD process, a PECVD process, an ALD process, etc.

The channel layer may be formed of polysilicon or amorphous silicon. In exemplary embodiments, the polysilicon or amorphous silicon is doped with impurities. In an exemplary embodiment, a heat treatment or a laser beam irradiation is further performed on the channel layer. In this case, the channel layer may be transformed to include single crystalline silicon. The filling insulation layer may be formed of, for example, silicon oxide or silicon nitride. The channel layer and the filling insulation layer may be formed by, for example, a CVD process, a PECVD process, an ALD process, a PVD process, a sputtering process, etc.

The dielectric layer structure 120 may have, for example, a straw shape or a cylindrical shell shape surrounding an outer sidewall of the channel 122. The channel 122 may have, for example, a substantially cup shape. The filling insulation pattern 124 may have, for example, a pillar shape inserted in the channel 122. In exemplary embodiments, the formation of the filling insulation layer may be omitted, and the channel 122 may have a pillar shape filling the channel hole 115.

Figure 13:
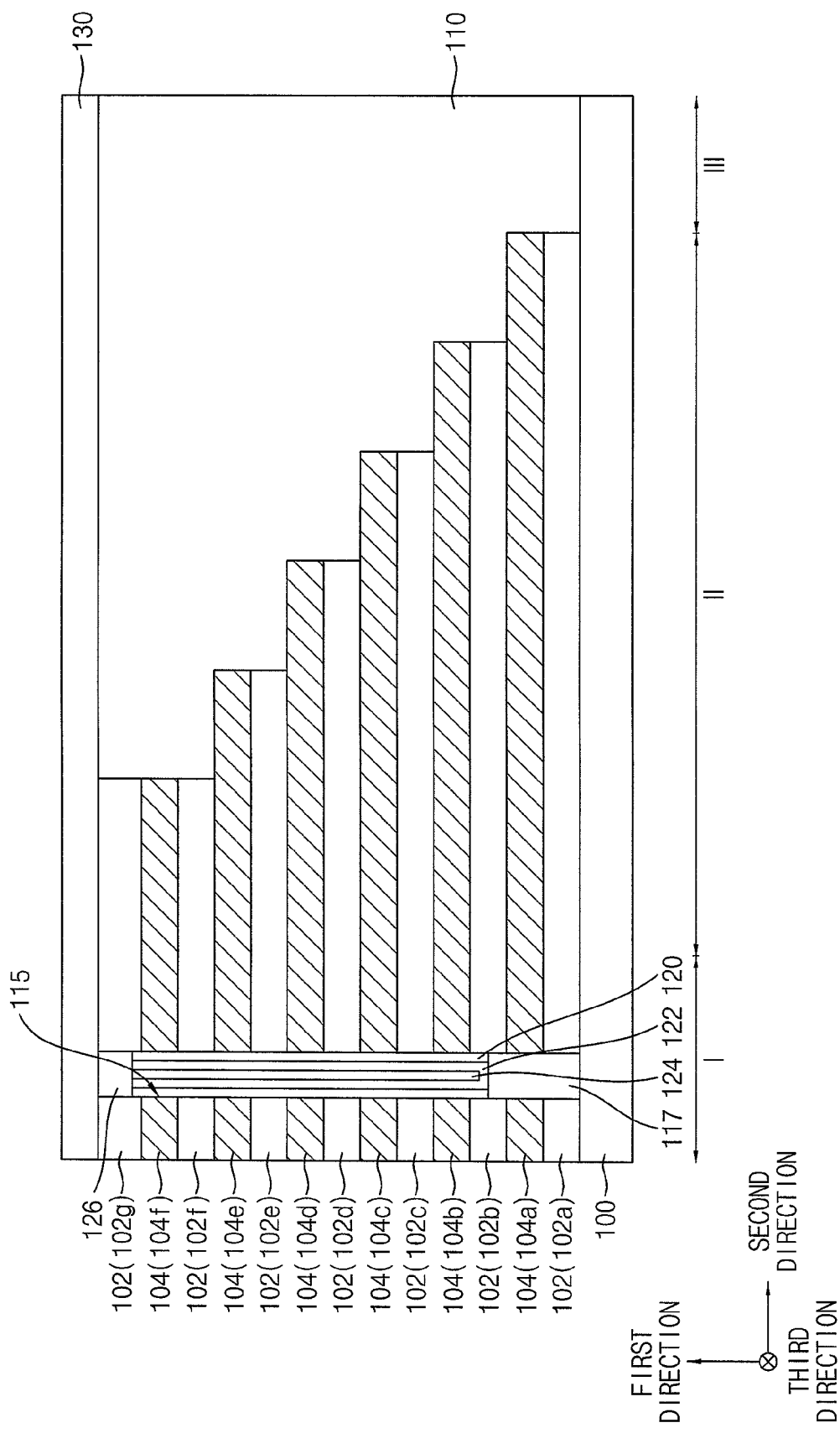
Figure 14:
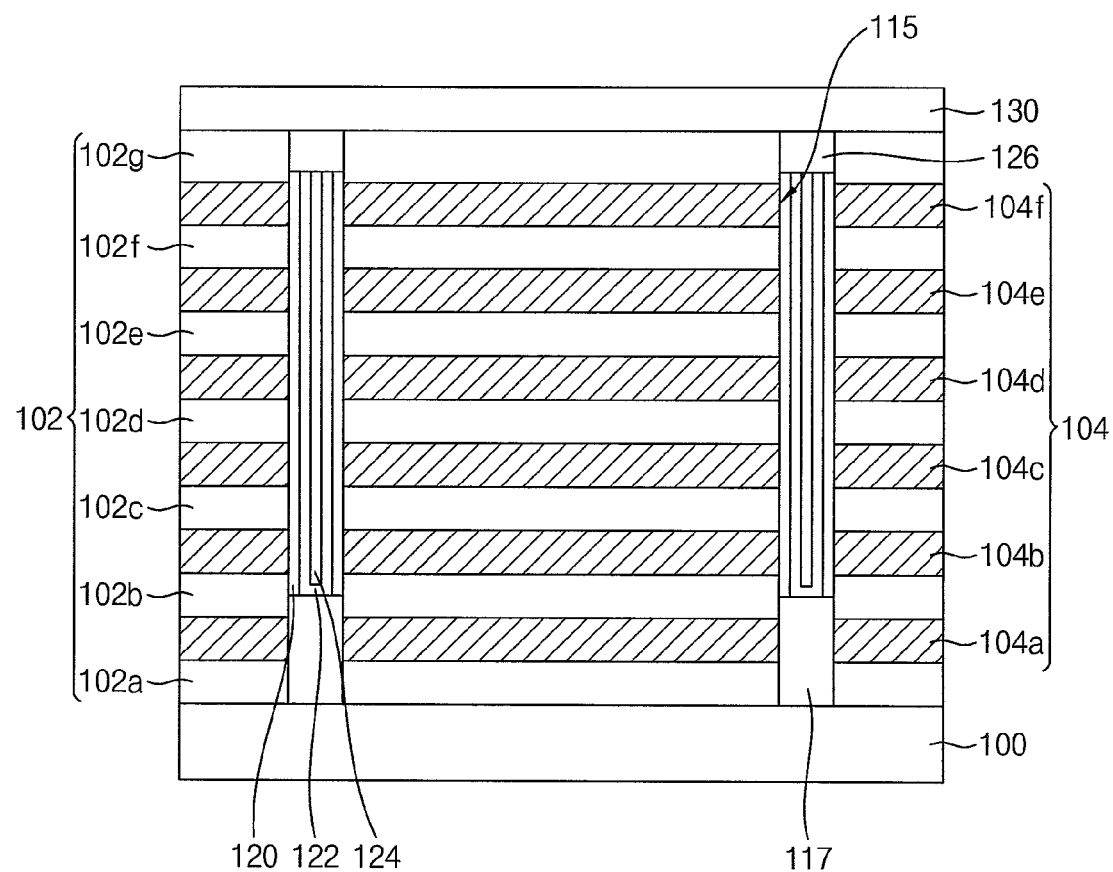

Referring to FIGS. 13 and 14, in exemplary embodiments, the pad 126 capping an upper portion of the channel hole 115 is formed.

For example, upper portions of the dielectric layer structure 120, the channel 122 and the filling insulation pattern 124 may be partially removed by, for example, an etch-back process to form a recess. In exemplary embodiments, a pad layer is formed on the dielectric layer structure 120, the channel 122, the filling insulation pattern 124, the uppermost insulating interlayer 102g, and the mold protection layer 110 to sufficiently fill the recess. For example, the pad layer may fill the recess in a sufficient manner such that when the pad 126 is formed, an upper surface of the pad 126 is substantially coplanar with an upper surface of the layer in which it is formed (e.g., the insulating interlayer 102g in FIGS. 13 and 14). An upper portion of the pad layer may be planarized by, for example, a CMP process until the mold protection layer 130 and/or the uppermost insulating interlayer 102g are exposed to form the pad 126 from a remaining portion of the pad layer.

The pad layer may be formed using, for example, polysilicon. In exemplary embodiments, the polysilicon is doped with n-type impurities by, for example, a sputtering process or an ALD process. In an exemplary embodiment, a preliminary pad layer including amorphous silicon is formed, and a crystallization process is performed thereon to form the pad layer.

According to the arrangement of the channel hole row, a plurality of the pads 126 may define a pad row in the uppermost insulating interlayer 102g, and a plurality of the pad rows may be formed along the third direction. A channel row may be defined under the pad row, and a plurality of the channel rows may be arranged along the third direction.

In exemplary embodiments, the first upper insulation layer 130 is formed on the uppermost insulating interlayer 102, the pads 126 and the mold protection layer 110. The first upper insulation layer 130 may be formed of, for example, silicon oxide by a CVD process, a spin coating process, etc.

Figure 15:
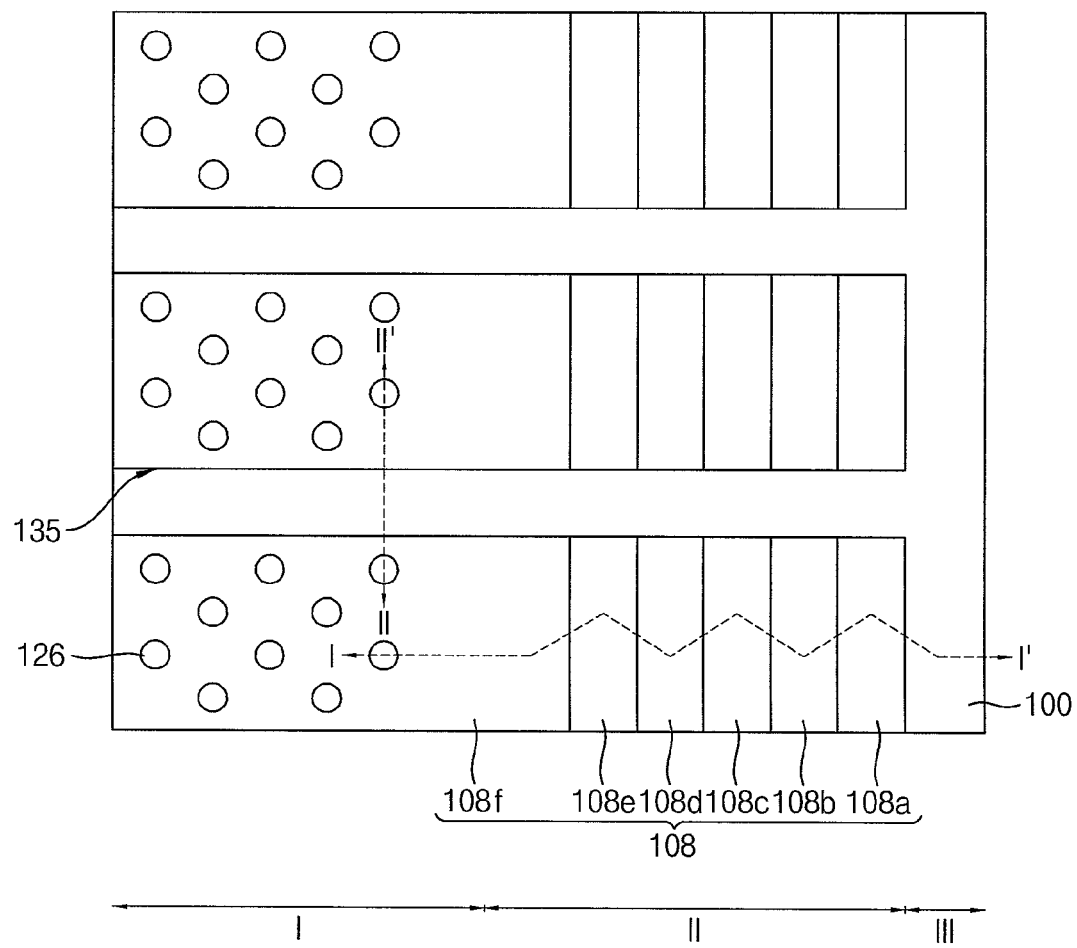
Figure 16:
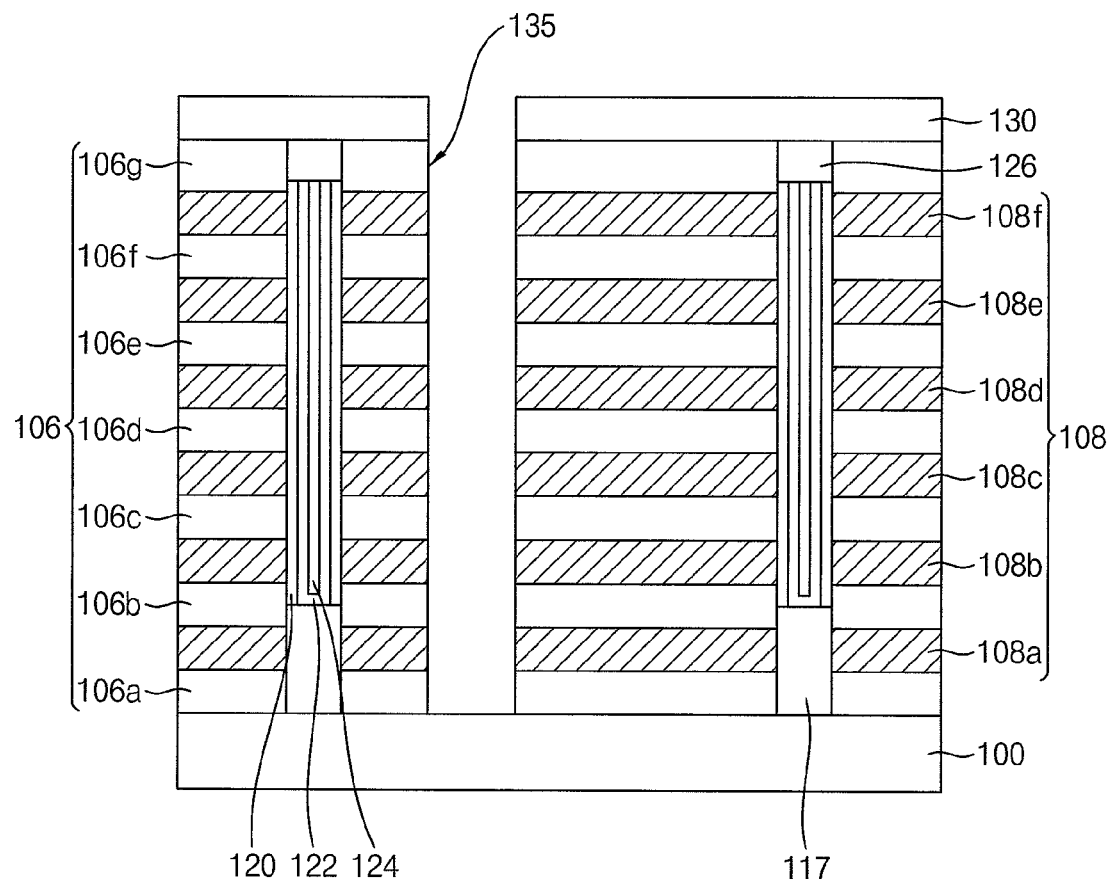

Referring to FIGS. 15 and 16, in exemplary embodiments, an opening 135 cutting the stepped mold structure is formed.

For example, in exemplary embodiments, a hard mask partially exposing the first upper insulation layer 130 between some of the channel rows neighboring in the third direction is formed. The first upper insulation layer 130, the mold protection layer 110, the insulating interlayers 102, and the sacrificial layers 104 may be partially etched by, for example, a dry etching process using the hard mask as an etching mask to form the opening 135. The hard mask may be formed using, for example, a photoresist material or an SOH material. The hard mask may be removed by, for example, an ashing process and/or a strip process after the formation of the opening 135.

The opening 135 extends in the second direction, and a plurality of the openings 135 may be formed along the third direction. The predetermined number of the channel rows may be arranged between the openings 135 neighboring in the third direction. For example, as illustrated in FIG. 15, in exemplary embodiments, four channel rows are included between the neighboring openings 135. However, exemplary embodiments of the inventive concept are not limited thereto. For example, in exemplary embodiments, the number of the channel rows between the openings 135 may be properly adjusted in consideration of a circuit design or a degree of integration of the vertical memory device.

As illustrated in FIG. 16, in exemplary embodiments, after the formation of the opening 135, the insulating interlayers 102 and the sacrificial layers 104 are changed into insulating interlayer patterns 106 (e.g., 106a through 106g) and sacrificial patterns 108 (e.g., 108a through 108f). The insulating interlayer pattern 106 and the sacrificial pattern 108 at each level may have, for example, a plate shape extending in the second direction. The top surface of the substrate 100, and sidewalls of the insulating interlayer patterns 106 and the sacrificial patterns 108 are exposed through the opening 135.

Figure 17:
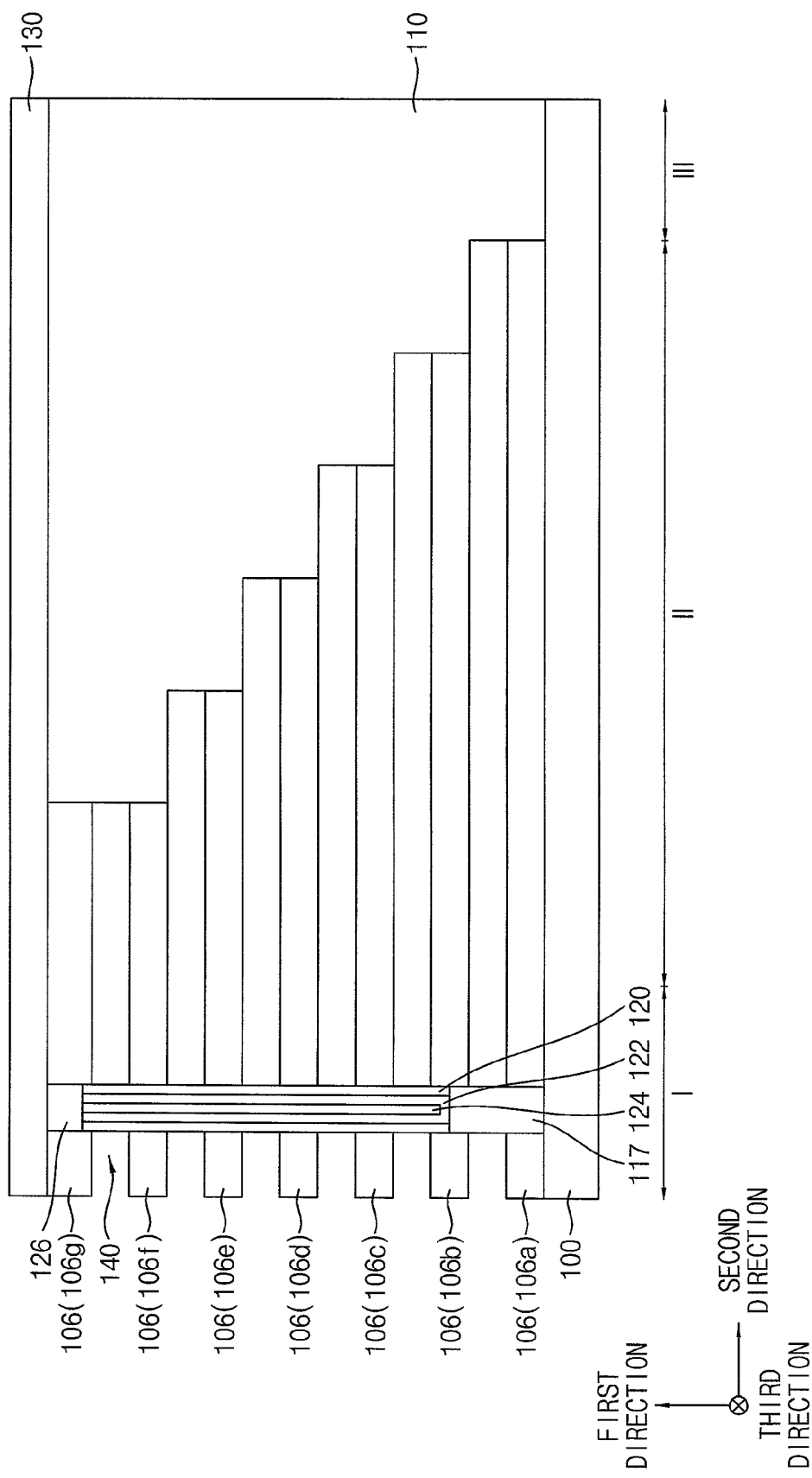

Referring to FIGS. 17 and 18, in exemplary embodiments, the sacrificial patterns 108 exposed by the opening 135 are removed. In exemplary embodiments, the sacrificial patterns 108 may be removed by a wet etching process using, for example, phosphoric acid that has an etching selectivity for silicon nitride as an etchant solution.

A gap 140 is defined by a space from which the sacrificial pattern 108 is removed between the insulating interlayer patterns 106 neighboring in the first direction. A sidewall of the vertical channel structure (e.g., a sidewall of the dielectric layer structure 120) may be partially exposed by the gap 140. In exemplary embodiments, a sidewall of the semiconductor pattern 117 is exposed by a lowermost gap 140.

Figure 19:
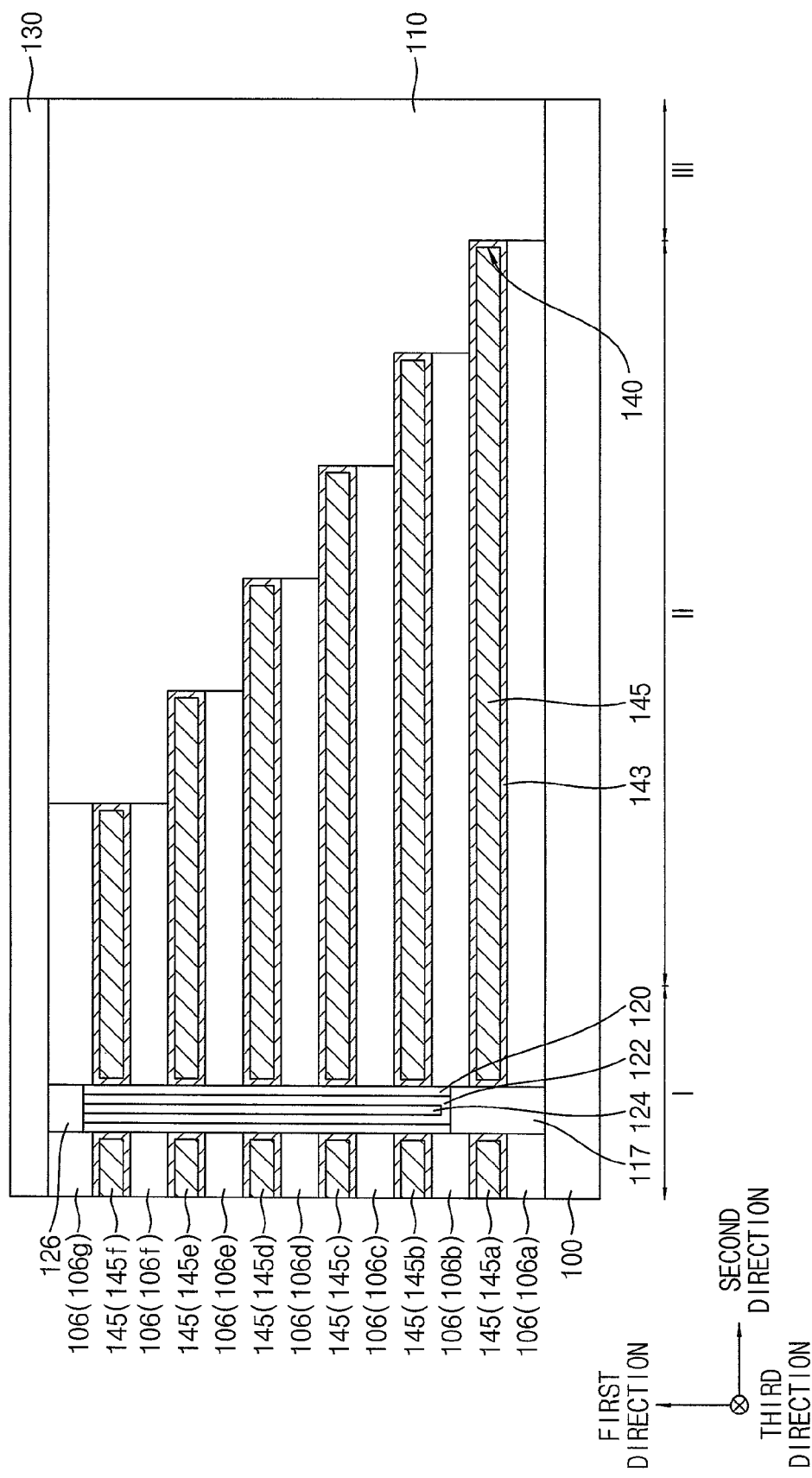
Figure 20:
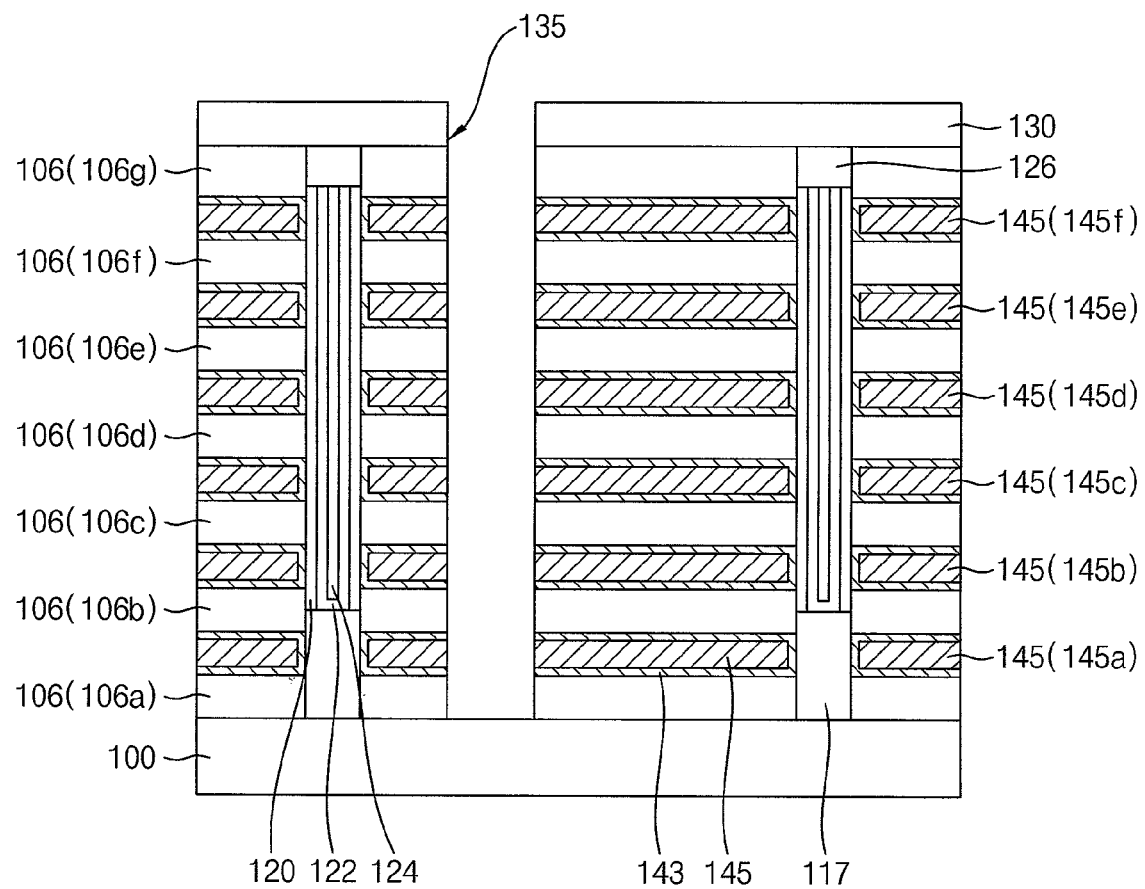

Referring to FIGS. 19 and 20, in exemplary embodiments, the interface layer 143 and a gate line 145 (e.g., 145a through 145f) are formed in each gap 140.

In exemplary embodiments, the interface layer 143 is formed on surfaces of the insulating interlayer patterns 106 and the mold protection layer 110 defining the gap 140, and the outer sidewall of the dielectric layer structure 120. A lowermost interface layer 143 may be in contact with the sidewall of the semiconductor pattern 117.

In exemplary embodiments, the interface layer 143 is formed on the sidewalls of the insulating interlayer pattern 106 exposed by the opening 135.

The interface layer 143 may be formed of a metal oxide and/or a metal nitride by, for example, an ALD process, a sputtering process, etc.

In exemplary embodiments, a gate electrode layer sufficiently filling the gaps 140 and at least partially filling the opening 135 is formed on the interface layer 143. The gate electrode layer may also be formed on a top surface of the first upper insulation layer 130.

The gate electrode layer may be formed using a metal or a metal nitride. For example, the gate electrode layer may be formed of a metal such as tungsten, aluminum, copper, titanium or tantalum, or a nitride of the metal. In an exemplary embodiment, the gate electrode layer may be formed as a multi-layered structure including a barrier layer formed of a metal nitride, and a metal layer. The gate electrode layer may be formed by, for example, a CVD process, a PECVD process, an ALD process, a PVD process, a sputtering process, etc.

In exemplary embodiments, the gate electrode layer is partially removed to form the gate line 155 in the gap 140 at each level.

An upper portion of the gate electrode layer may be planarized by, for example, a CMP process until the first upper insulation layer 130 is exposed. Portions of the gate electrode layer formed in the opening 135 and on the top surface of the substrate 100 may be additionally etched to obtain the gate lines 145.

The gate lines 145 may include the GSL (e.g., the gate line 145a), the word lines (e.g., the gate lines 145b through 145e), and the SSL (e.g., the gate line 145f) sequentially stacked from the top surface of the substrate 100 and spaced apart from one another in the first direction. The number of the levels at which the GSL, the word lines and the SSL are formed may be increased in exemplary embodiments in consideration of a circuit design and a capacity of the vertical memory device.

A gate line stack structure may be defined by the gate lines 145, the insulating interlayer patterns 106, and the channel rows included in the gate lines 145 and the insulating interlayer patterns 106. A plurality of the gate line stack structures may be arranged along the third direction, and may be spaced apart from one another by the openings 135.

Figure 21:
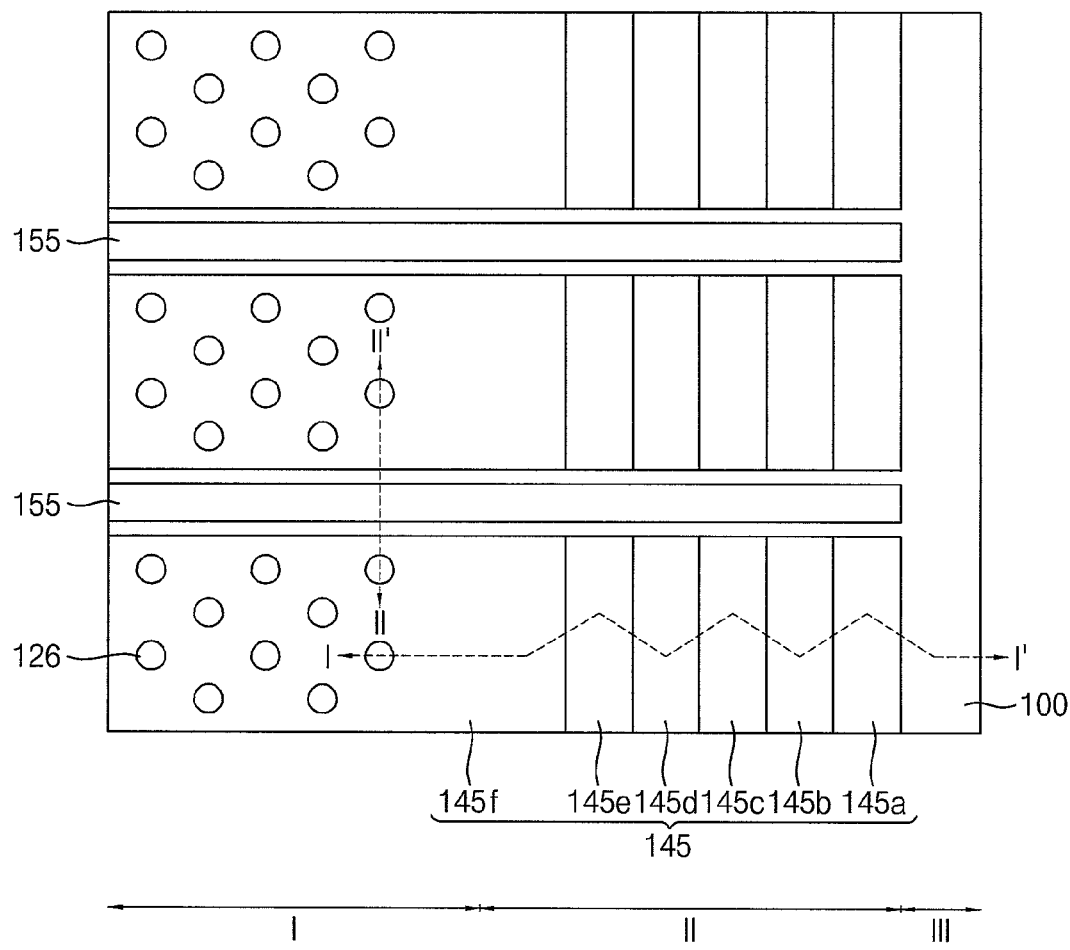
Figure 22:
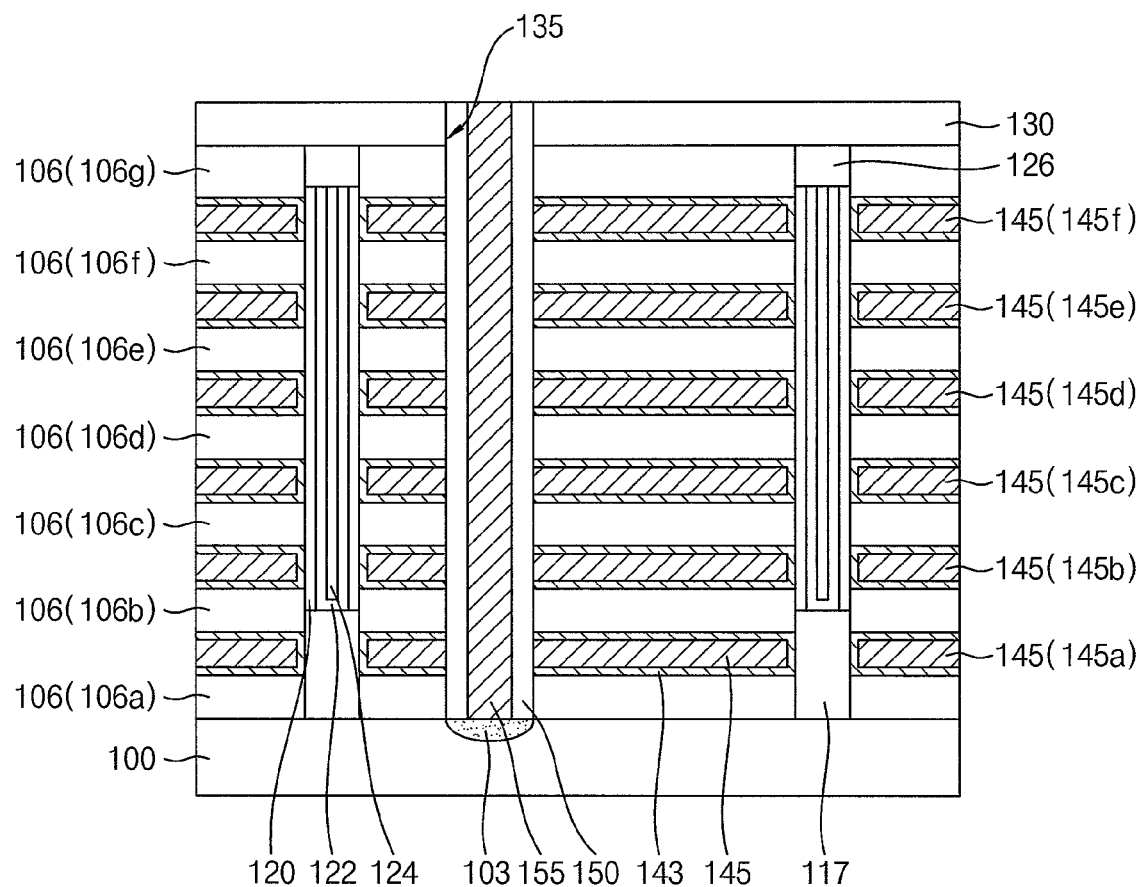

Referring to FIGS. 21 and 22, in exemplary embodiments, an ion-implantation process is performed to form the impurity region 103 at an upper portion of the substrate 100 exposed through the opening 135. The impurity region 103 extends in the second direction at the upper portion of the substrate 100.

In exemplary embodiments, the insulation pattern 150 and the conductive line 155 filling the opening 135 are formed on the impurity region 103.

For example, in exemplary embodiments, an insulation layer including silicon oxide is formed along the top surface of the first upper insulation layer 130, and the sidewalls and the bottoms of the openings 135. Portions of the insulation layer formed on the top surface of the first upper insulation layer 130 and the bottoms of the opening 135 are removed by, for example, a CMP process and/or an etch-back process to form the insulation pattern 150. A conductive layer filling a remaining portion of the opening 135 is formed on the first upper insulation layer 130, and an upper portion of the conductive layer is planarized by a CMP process to form the conductive line 155. The conductive layer may be formed of, for example, a metal, a metal silicide and/or doped polysilicon by a sputtering process or an ALD process.

In exemplary embodiments, the conductive line 155 and the insulation pattern 150 extend through the first upper insulation layer 130 and the gate line stack structures, and extend in the second direction in the opening 135. In exemplary embodiments, the conductive line 155 serves as a CSL of the vertical memory device, and is insulated from the gate lines 145 by the insulation pattern 150.

Referring to FIGS. 23A, 23B, 24 and 25, in exemplary embodiments, the second upper insulation layer 160 covering the conductive line 155 and the insulation pattern 150 is formed on the first upper insulation layer 130. The bit line contact 162 is formed through the second upper insulation layer 160 and the first upper insulation layer 130 on the first region I to be electrically connected to the pad 126. A first contact 165 (e.g., 165a through 165f) is formed through the second upper insulation layer 160, the first upper insulation layer 130, and the mold protection layer 110 on the second region II to be electrically connected to the gate line 165 at each level.

Figure 23A:
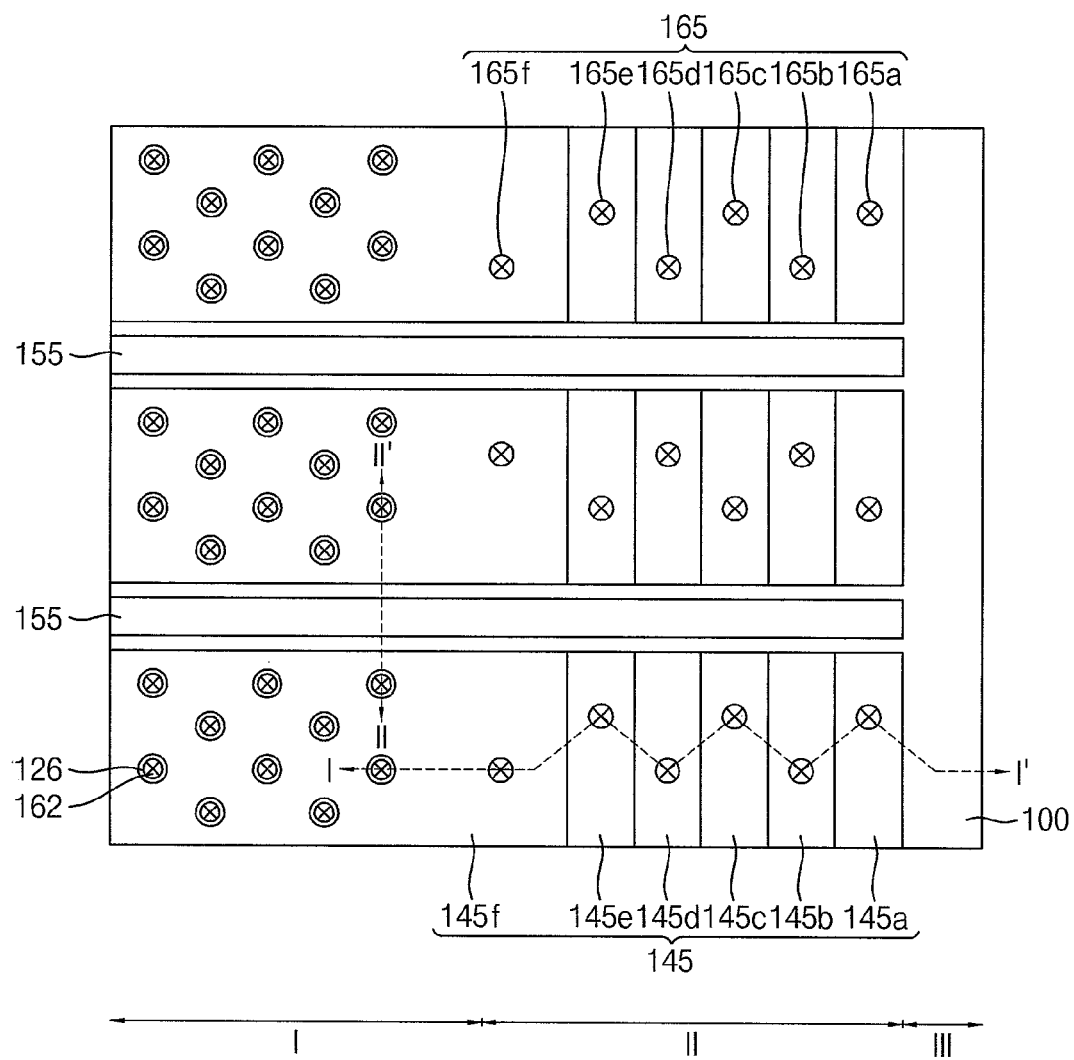

As illustrated in FIG. 23A, the first contacts 165 may be formed in a zigzag configuration along the second direction in a plane view. Accordingly, a distance between the neighboring first contacts 165 may be increased so that a process margin for forming the first contacts 165 is additionally obtained.

Figure 23B:
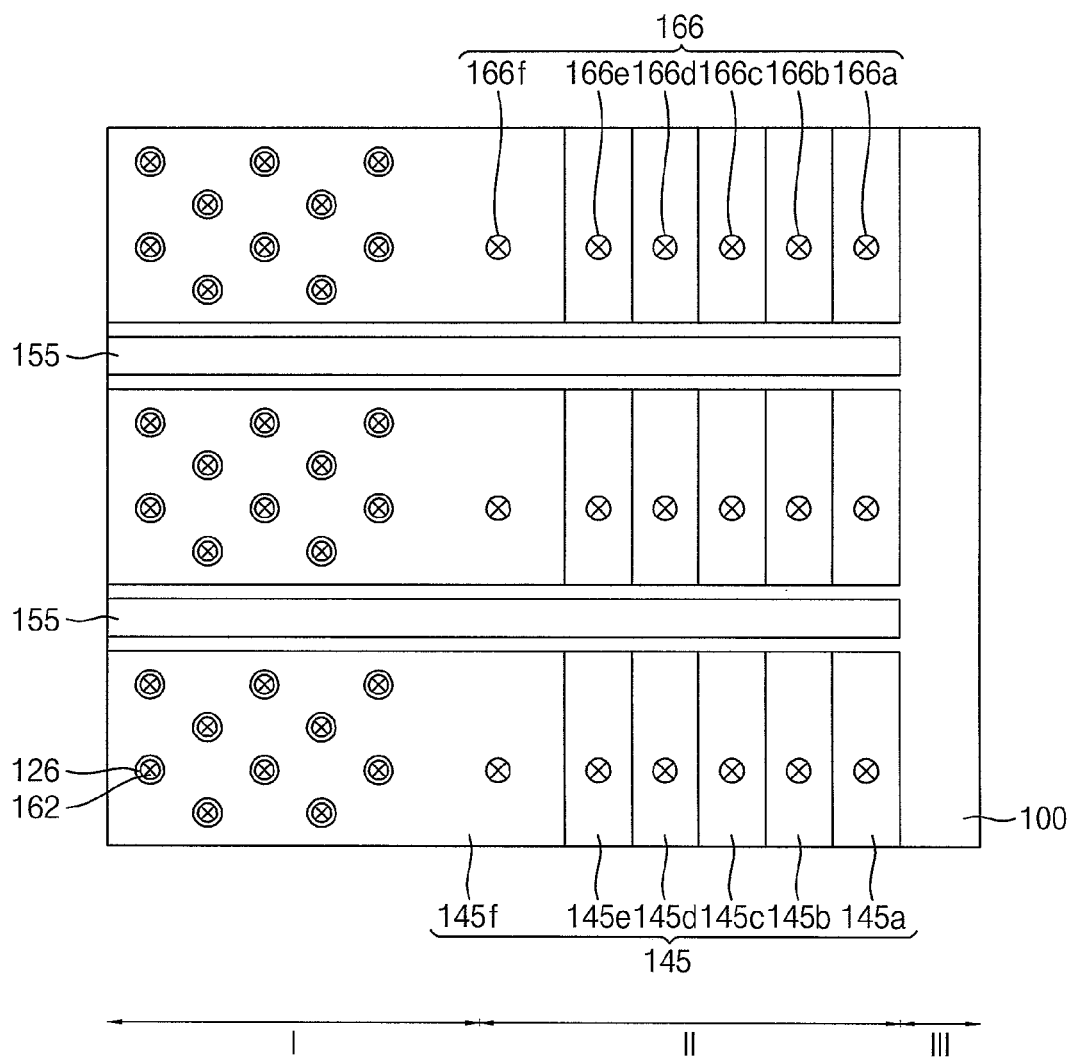
Figure 24:
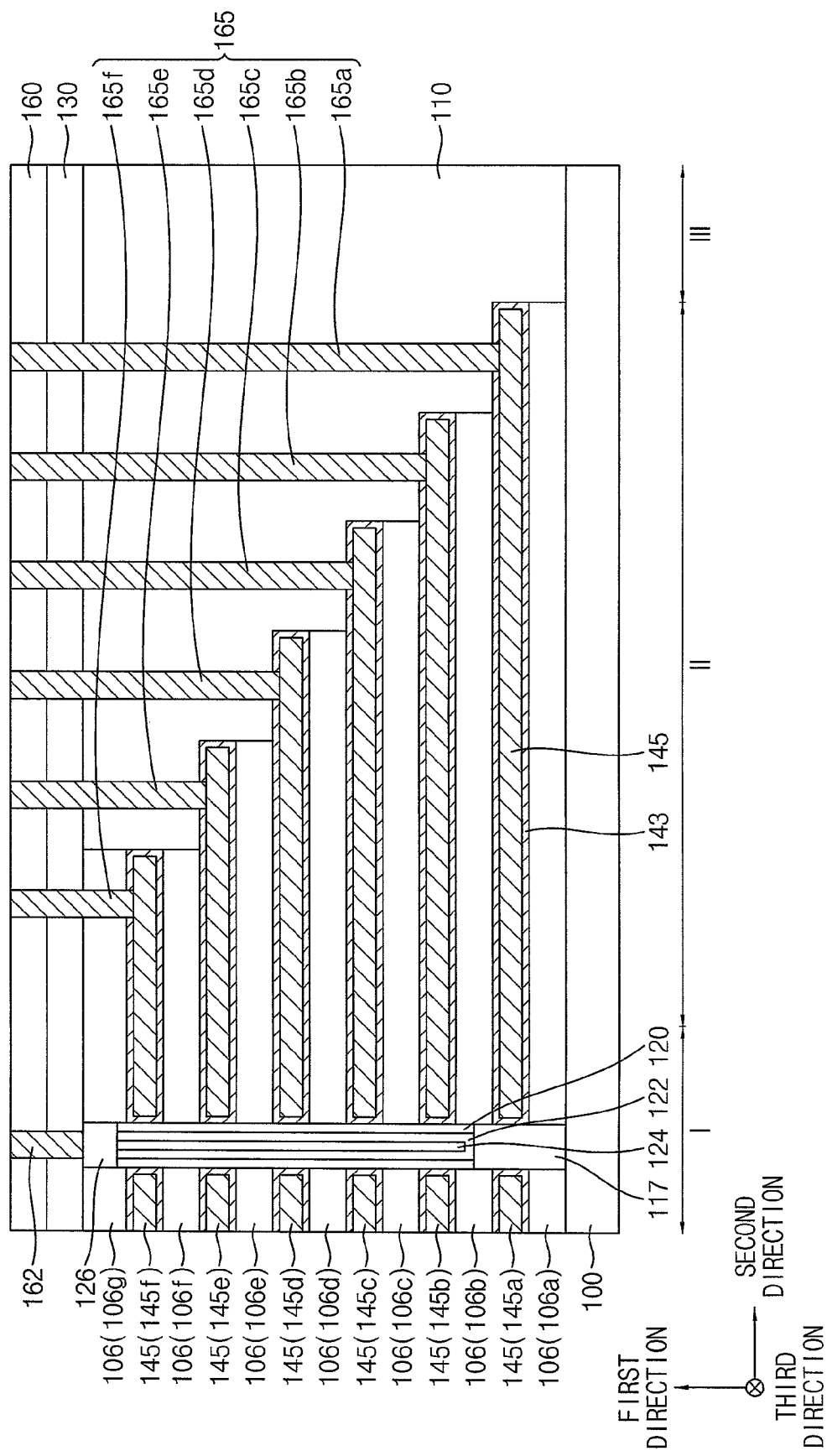
Figure 25:
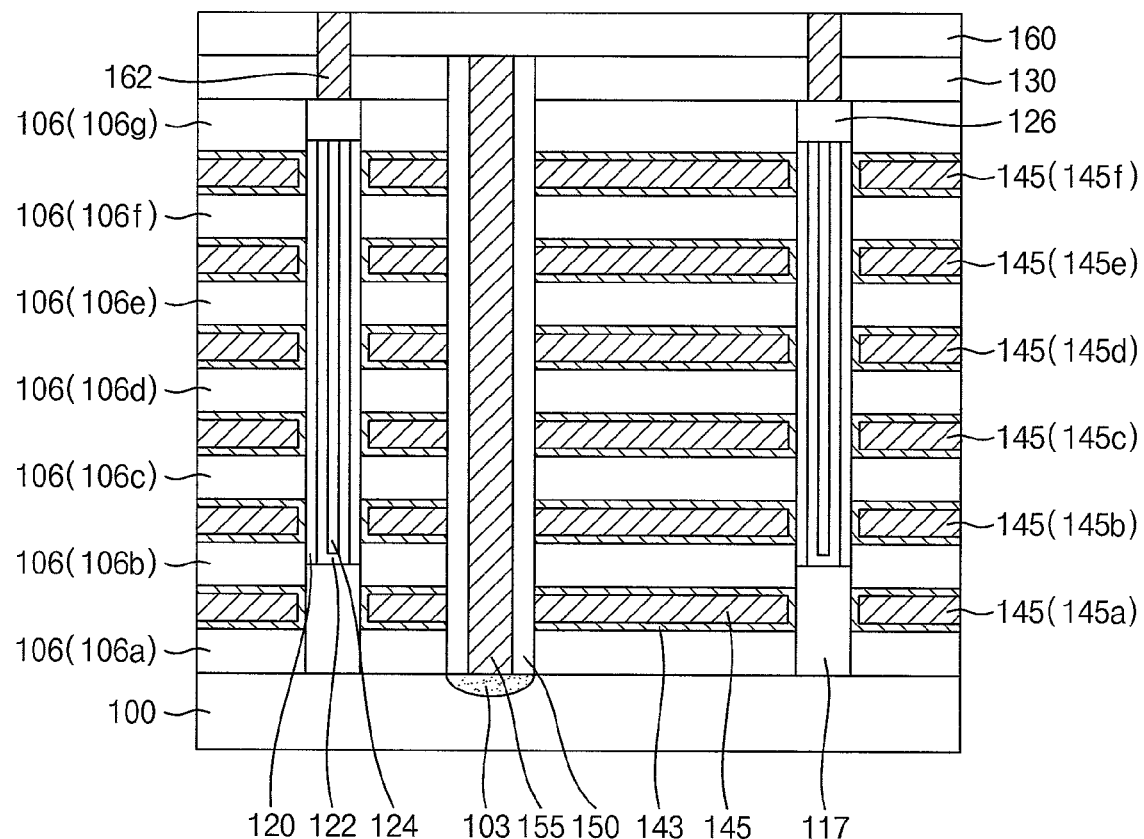

In exemplary embodiments, as illustrated in FIG. 23B, the first contacts 166 are arranged in a substantially straight line along the second direction in a plane view.

Hereinafter, subsequent processes and elements will be described with reference to the structure illustrated in FIG. 23A.

In exemplary embodiments, the first contact 165f electrically connected to, for example, the SSL 145f, extends through the second upper insulation layer 160, the first upper insulation layer 130, and the uppermost insulating interlayer pattern 106g. The first contacts 165 may also extend through the interface layer 143 at each level.

In exemplary embodiments, contact holes for forming the bit line contact 162 and the first contacts 165 are formed concurrently by, for example, substantially the same photolithography process. A first conductive layer sufficiently filling the contact holes may be formed, and an upper portion of the first conductive layer may be planarized by, for example, a CMP process until the second upper insulation layer 160 is exposed to form the bit line contact 162 and the first contacts 165 concurrently.

As illustrated in FIGS. 23A and 23B, in exemplary embodiments, one first contact 165 is formed per the gate line 145 at each level in the gate line stack structure.

Figure 27:
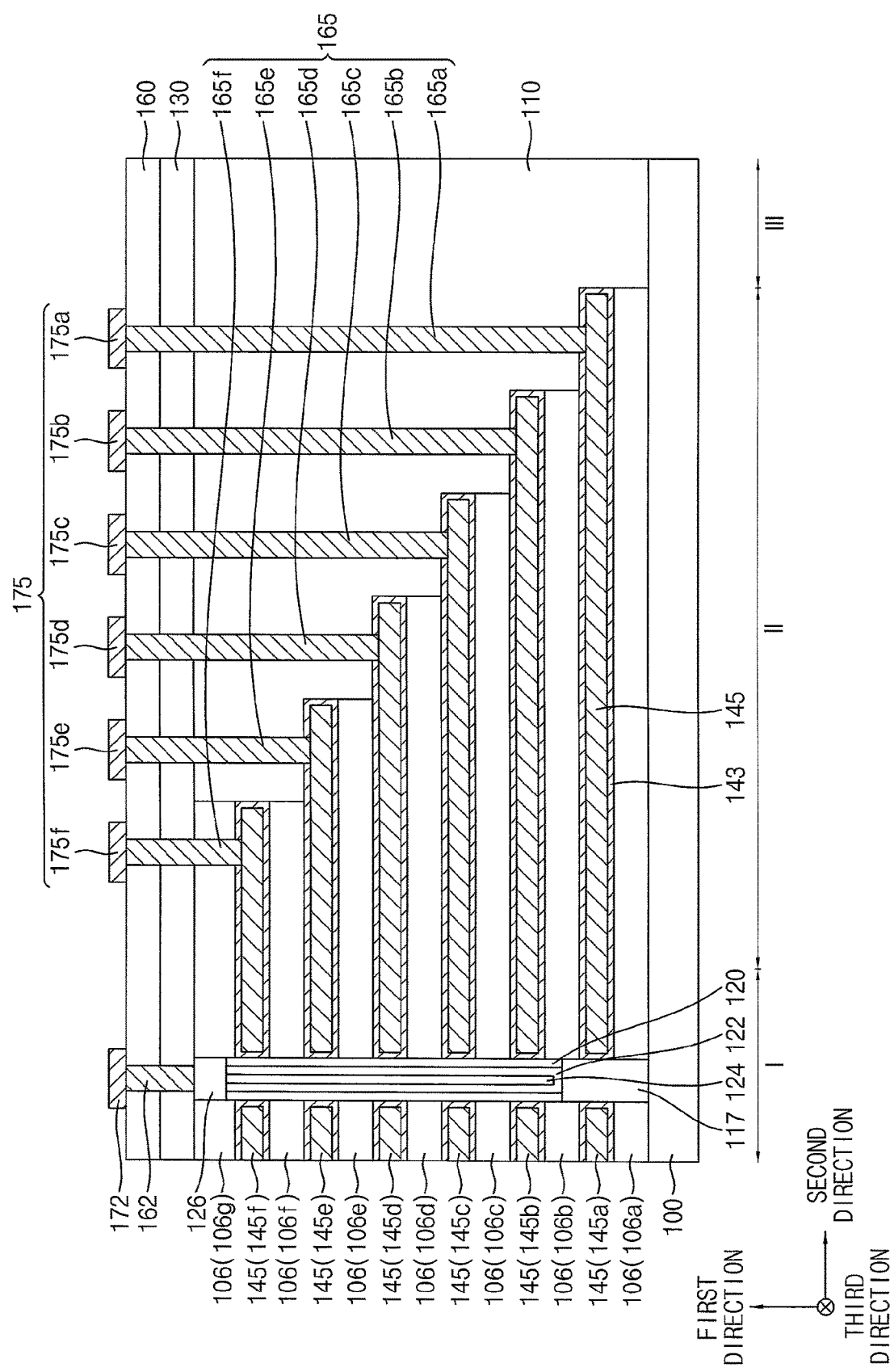
Figure 28:
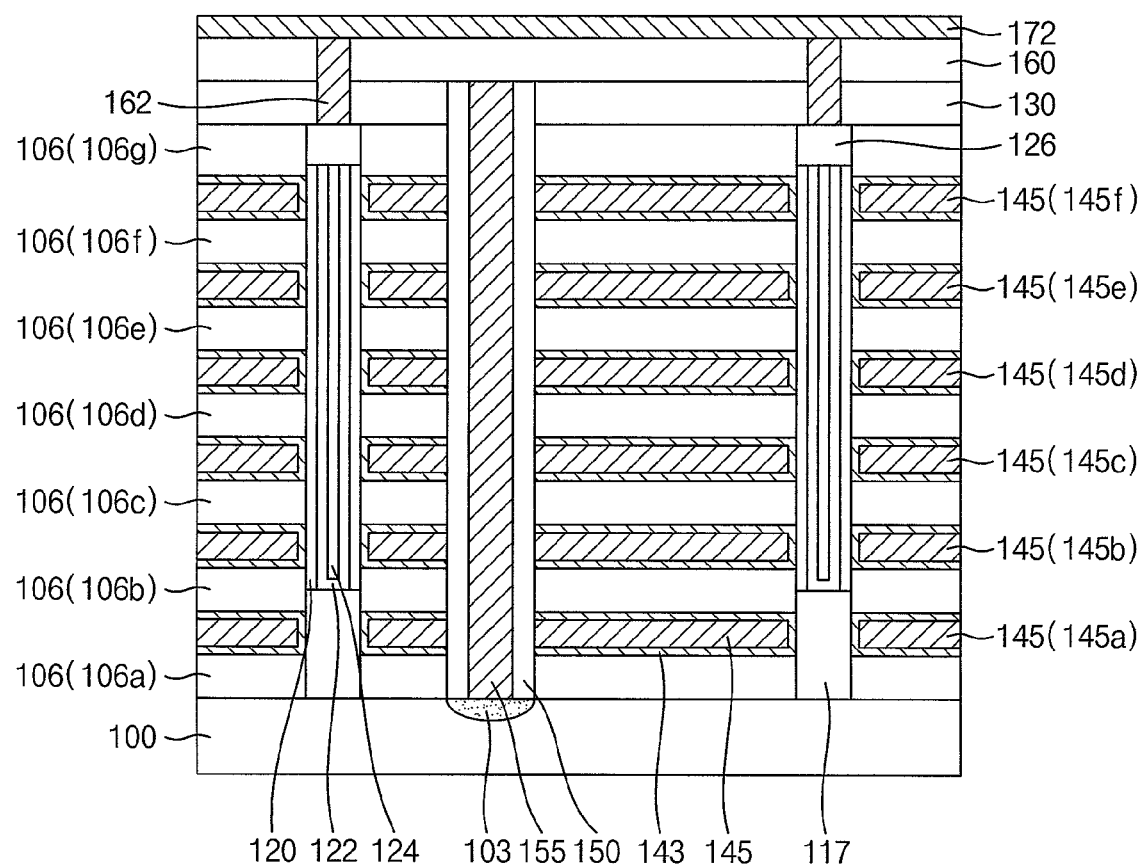

Referring to FIGS. 26 to 28, in exemplary embodiments, a bit line 172 and a common wiring 175 are formed on the second insulating interlayer 160.

For example, in exemplary embodiments, a second conductive layer is formed on the second insulating interlayer 160. The second conductive layer may be linearly etched along the third direction to form the bit lines 172 and the common wirings 175 (e.g., 175a through 175f).

In exemplary embodiments, the bit line 172 extends in the third direction on the first region I, and is electrically connected to a plurality of the bit line contacts 162. A plurality of the bit lines 172 may be formed along the second direction on the first region I.

In exemplary embodiments, the common wiring 175 extends in the third direction, and is electrically connected to the first contacts 165, which may be formed on the gate lines 145 located at the same level and included in the different gate line stack structures. A plurality of the common wirings 175 may be formed along the second direction on the second region II.

In exemplary embodiments, the common wirings 175 are sequentially arranged along the second direction from the common wiring 175f connected to the SSL 145f to the common wiring 175a connected to the GSL 145a.

Figure 29:
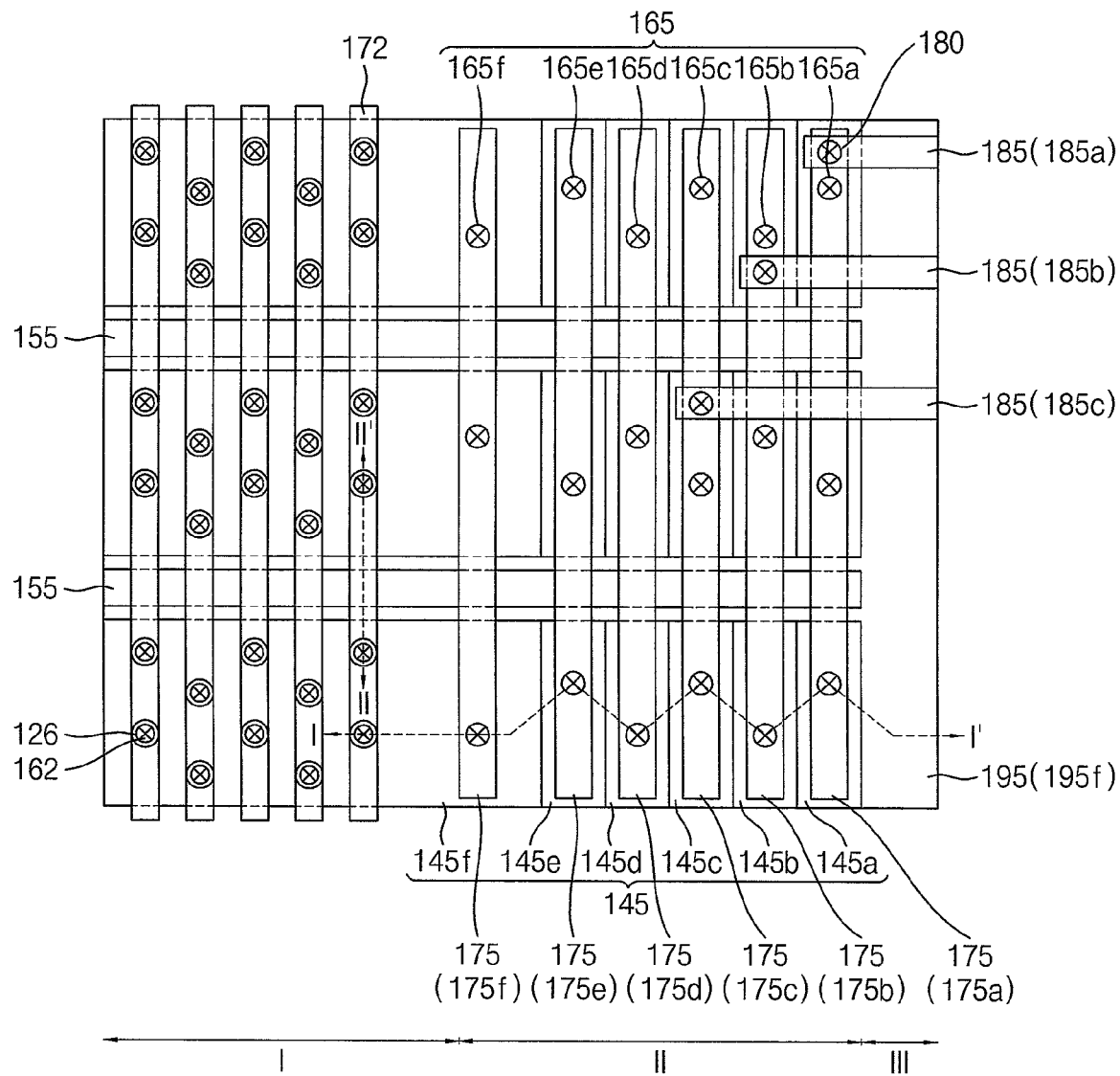
Figure 30:
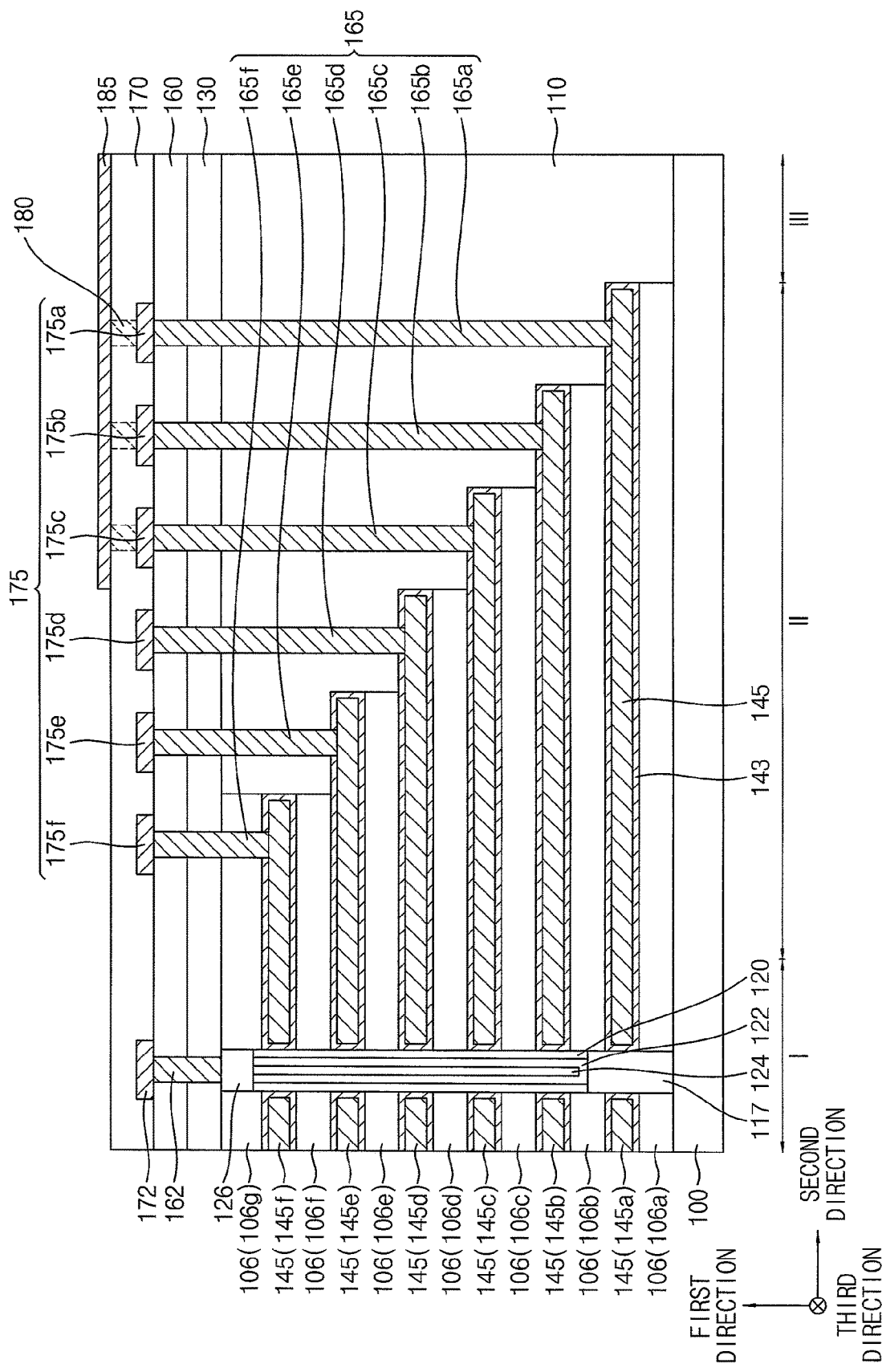

Referring to FIGS. 29 to 31, in exemplary embodiments, the third upper insulation layer 170 covering the bit line 172 and the common wirings 175 is formed on the second upper insulation layer 160. Second contacts 180 are formed through the third upper insulation layer 170 to be in contact with some common wirings 175 (e.g., 175a, 175b and 175c) of the common wirings 175. First signal wirings 185 (e.g., 185a, 185b and 185c) are formed on the third upper insulation layer 170 to be electrically connected to the some common wirings 175 (e.g., 175a, 175b and 175c) via the second contacts 180.

In exemplary embodiments, one second contact 180 is formed per each of the some common wirings (e.g., 175a, 175b and 175c). A third conductive layer may be formed on the third upper insulation layer 170 and the second contacts 180. The third conductive layer may be etched along the second direction to form the first signal wiring 185 electrically connected to each second contact 180.

For example, in exemplary embodiments, the first signal wirings 185 are electrically connected to some of the gate lines 145 included in the gate line stack structure via the common wirings 175. For example, the first signal wirings 185 may be electrically connected to the GSL 145a and some word lines 145b and 145c.

Figure 33:
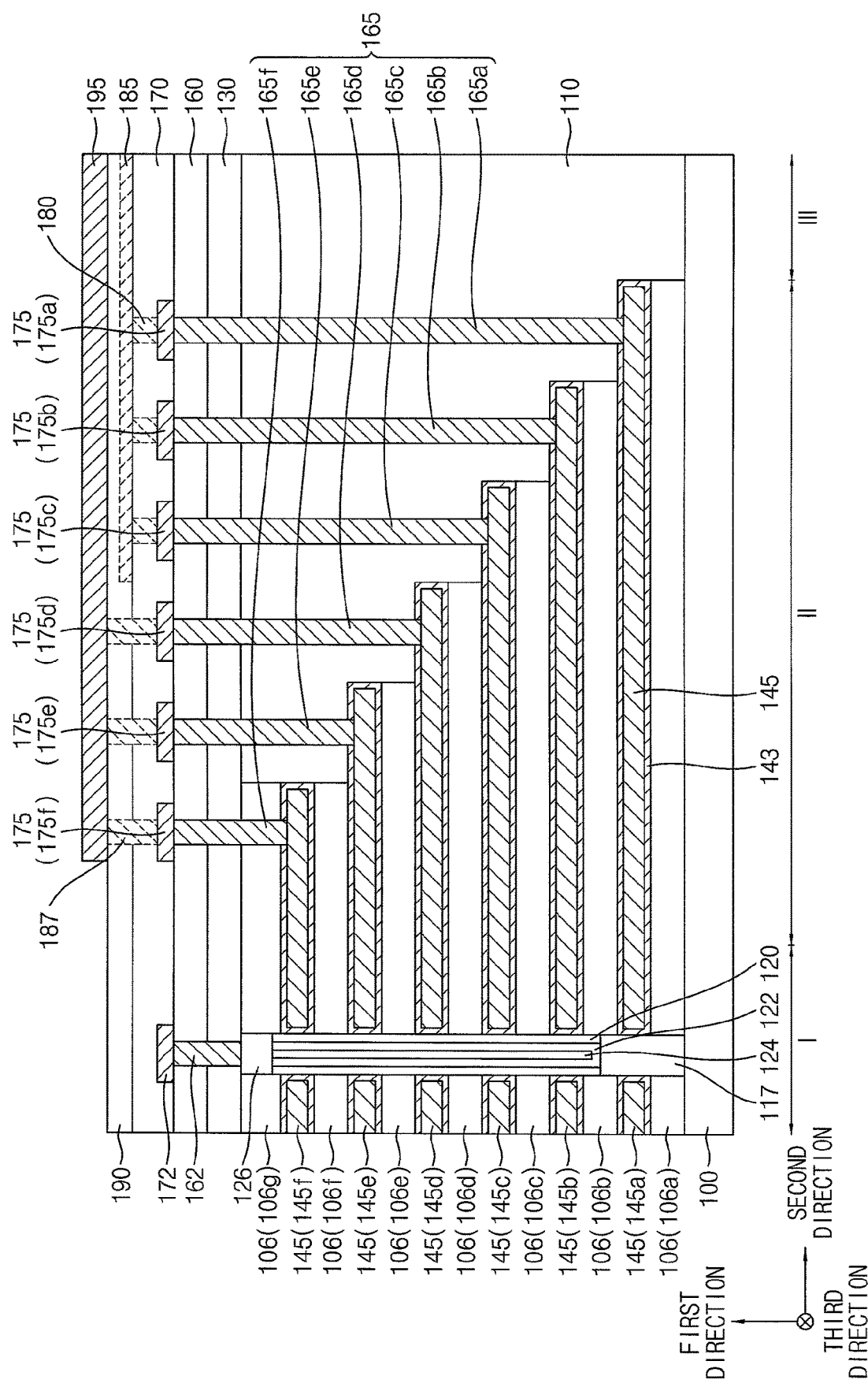

Referring to FIGS. 32 to 34, in exemplary embodiments, a fourth upper insulation layer 190 covering the first signal wirings 185 is formed on the third upper insulation layer 170. Third contacts 187 are formed through the fourth upper insulation layer 190 and the third upper insulation layer 170 to be disposed on remaining common wirings 175 (e.g., 175d, 175e and 175f) except for the some common wirings (e.g., 175a, 175b and 175c) that contact the second contacts 180. Second signal wirings 195 (e.g., 195d, 195e and 195f) electrically connected to the remaining common wirings 175 via the third contacts 187 are formed on the fourth upper insulation layer 190.

In exemplary embodiments, one third contact 187 is formed per each of the remaining common wirings 175d, 175e and 175f. A fourth conductive layer may be formed on the fourth upper insulation layer 190 and the third contacts 187. The fourth conductive layer may be patterned along the second direction to form the second signal wiring 195 electrically connected to each third contact 187.

For example, in exemplary embodiments, the second signal wirings 195 are electrically connected to remaining gate lines 145 included in the gate line stack structure except for the gate lines 145 connected to the first signal wirings 185 via the common wirings 175. For example, the second signal wirings 195 may be electrically connected to the SSL 145f and upper word lines 145e and 145d.

The second to fourth upper insulation layers 160, 170 and 190 may be formed of a silicon oxide-based material substantially the same as or similar to that of the first upper insulation layer 130 by, for example, a CVD process or a spin coating process. The first to fourth conductive layers may be formed of a metal such as, for example, tungsten or copper by a sputtering process, an ALD process, etc.

According to exemplary embodiments as described above, the signal wirings 185 and 195 may be divided and formed at different levels utilizing the common wiring 175. Thus, a patterning margin for forming the signal wirings 185 and 195 may be obtained, and the vertical memory device including the increased number of the gate lines may be formed.

Figure 35:
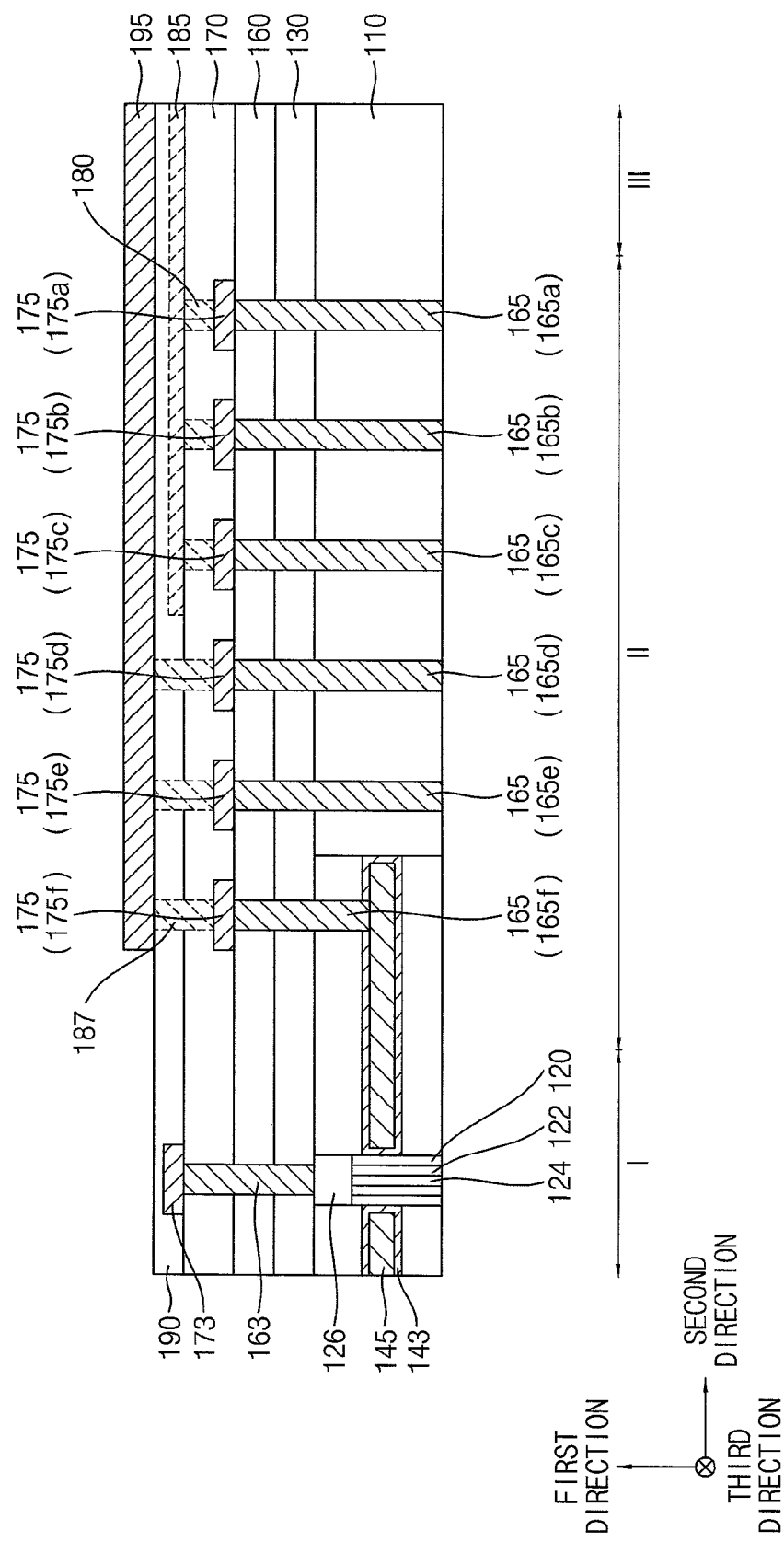
FIG. 35 is a cross-sectional view illustrating a vertical memory device according to exemplary embodiments of the inventive concept.

FIG. 35 is a cross-sectional view illustrating a vertical memory device according to exemplary embodiments of the inventive concept. FIG. 35 illustrates an upper portion of the vertical memory device including a wiring structure according to exemplary embodiments of the inventive concept. For convenience of explanation, a further description of elements and/or configurations substantially the same as or similar to those illustrated with reference to FIGS. 1A, 1B, 2 and 3 may be omitted herein.

Referring to FIG. 35, as also described with reference to FIGS. 1A, 1B, 2 and 3, in exemplary embodiments, the wiring structure includes first to third contacts 165, 180 and 187, a common wiring 175, a first signal wiring 185, and a second signal wiring 195. The common wiring 175, the first signal wiring 185, and the second signal wiring 195 may be located at different levels. For example, in exemplary embodiments, the common wiring 175, the first signal wiring 185, and the second signal wiring 195 are disposed on a second upper insulation layer 160, a third upper insulation layer 170, and a fourth upper insulation layer 190, respectively.

In exemplary embodiments, a bit line 173 is located at a different level from that of the common wiring 175. In exemplary embodiments, the bit line 173 is located at a higher level than that of the common wiring 175 and at a lower level than that of the second signal wiring 195.

In an exemplary embodiment, as illustrated in FIG. 35, the bit line 173 may be located at the same level as that of the first signal wiring 185. For example, in an exemplary embodiment, the bit line 173 is disposed on the third upper insulation layer 170, and is covered by the fourth upper insulation layer 190. In this case, a bit line contact 163 may extend through the third to first upper insulation layers 170, 160 and 130 to be in contact with a pad 126.

In exemplary embodiments, after forming the common wirings 175 and the third upper insulation layer 170, the bit line contact 163 and the second contact 180 may be formed by substantially the same photo-lithography process and deposition process. Subsequently, the bit line 173 and the first signal wiring 185 may be formed from the same conductive layer and by substantially the same patterning process.

Figure 36:
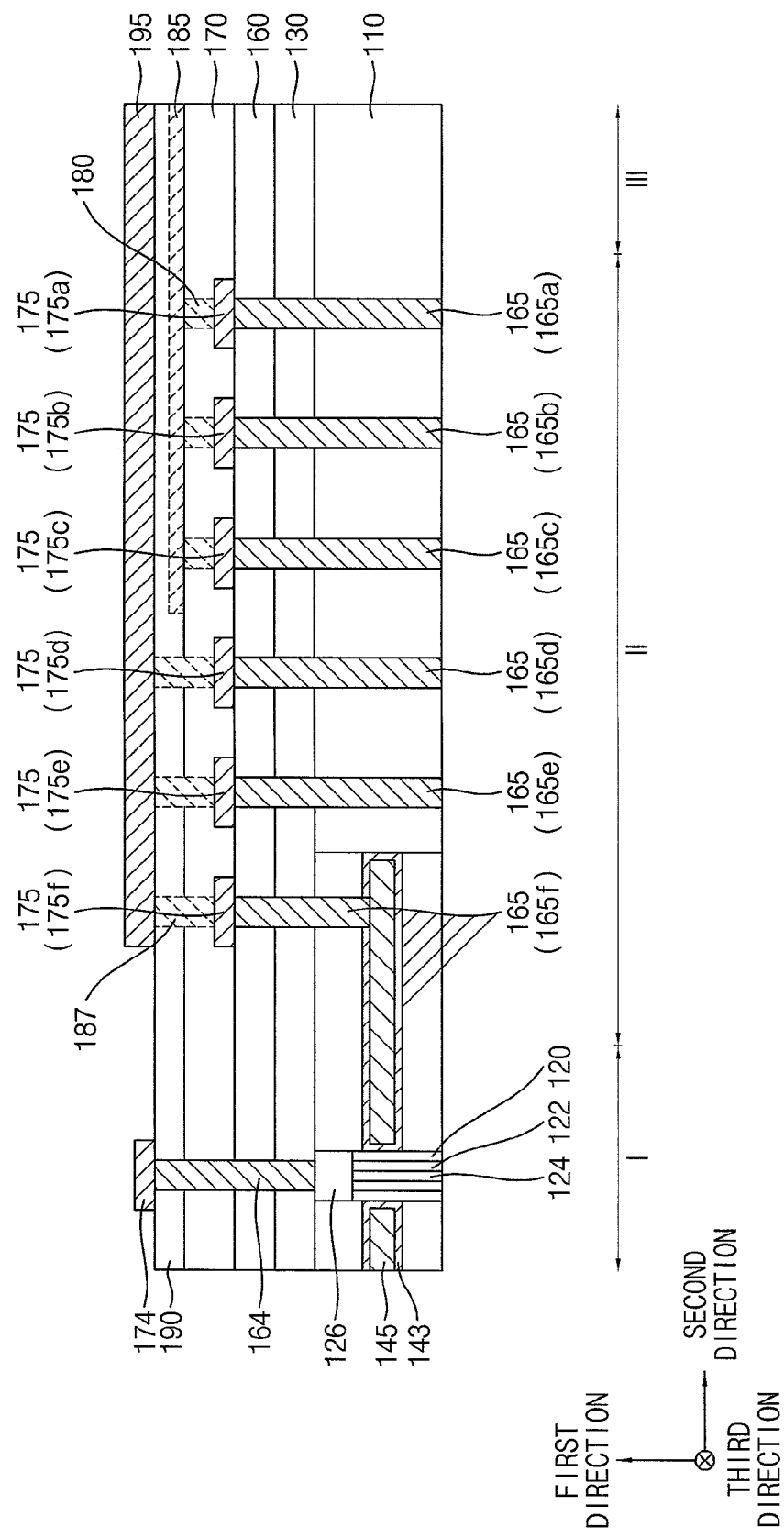
FIG. 36 is a cross-sectional view illustrating a vertical memory device according to exemplary embodiments of the inventive concept.

FIG. 36 is a cross-sectional view illustrating a vertical memory device according to exemplary embodiments of the inventive concept. FIG. 36 illustrates an upper portion of the vertical memory device including a wiring structure according to an exemplary embodiment. For convenience of explanation, a further description of elements and/or configurations substantially the same as or similar to those illustrated with reference to FIGS. 1A, 1B, 2 and 3 may be omitted herein.

Referring to FIG. 36, as also described with reference to FIGS. 1A, 1B, 2 and 3, in exemplary embodiments, the wiring structure includes first to third contacts 165, 180 and 187, a common wiring 175, a first signal wiring 185, and a second signal wiring 195. The common wiring 175, the first signal wiring 185, and the second signal wiring 195 may be located at different levels. For example, in exemplary embodiments, the common wiring 175, the first signal wiring 185, and the second signal wiring 195 are disposed on a second upper insulation layer 160, a third upper insulation layer 170, and a fourth upper insulation layer 190, respectively.

In exemplary embodiments, a bit line 174 is located at a different level from that of the common wiring 175. In exemplary embodiments, the bit line 174 is located at a higher level than those of the common wiring 175 and the first signal wiring 185.

In an exemplary embodiment, as illustrated in FIG. 36, the bit line 174 is located at the same level as that of the second signal wiring 195. For example, the bit line 174 may be disposed on the fourth upper insulation layer 190. In this case, a bit line contact 164 may extend through the fourth to first upper insulation layers 190, 170, 160 and 130 to be in contact with a pad 126.

In exemplary embodiments, after forming the first signal wirings 185 and the fourth upper insulation layer 190, the bit line contact 164 and the third contact 187 may be formed by substantially the same photo-lithography process and deposition process. Subsequently, the bit line 174 and the second signal wiring 195 may be formed from the same conductive layer and by substantially the same patterning process.

Figure 37:
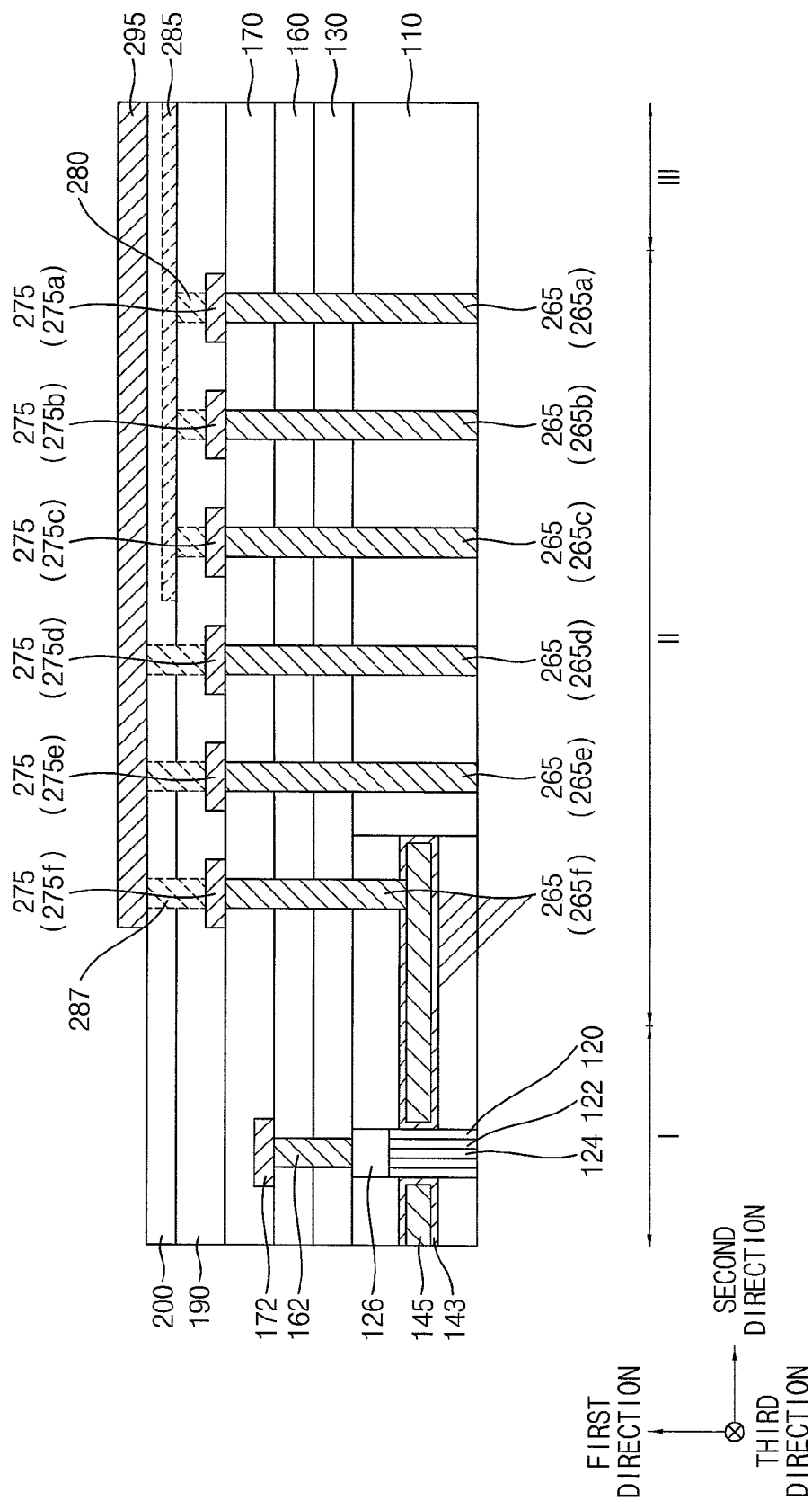
FIG. 37 is a cross-sectional view illustrating a vertical memory device according to exemplary embodiments of the inventive concept.

FIG. 37 is a cross-sectional view illustrating a vertical memory device according to exemplary embodiments of the inventive concept. FIG. 37 illustrates an upper portion of the vertical memory device including a wiring structure. For convenience of explanation, a further description of elements and/or configurations substantially the same as or similar to those illustrated with reference to FIGS. 1A, 1B, 2 and 3 may be omitted herein.

Referring to FIG. 37, as also described with reference to FIGS. 1A, 1B, 2 and 3, in exemplary embodiments, a bit line contact 162 extends through a second upper insulation layer 160 and a first upper insulation layer 130 to be disposed on a pad 126. A bit line 172 is disposed on the second upper insulation layer 160 to be electrically connected to the pad 126 via the bit line contact 162.

In exemplary embodiments, the wiring structure includes first contacts 265 (e.g., 265a through 265f), second contacts 280, third contacts 287, common wirings 275 (e.g., 275a through 275f), a first signal wiring 285, and a second signal wiring 295. The first and second signal wiring 285 and 295 are electrically connected to the common wirings 275 via the second and third contacts 280 and 287, respectively. The common wiring 275, the first signal wiring 285, and the second signal wiring 295 may be located at different levels. For example, in exemplary embodiments, the common wiring 275 and the first signal wiring 285 are disposed on a third upper insulation layer 170 and a fourth upper insulation layer 190, respectively. In exemplary embodiments, a fifth upper insulation layer 200 is further formed on the fourth upper insulation layer 190, and the second signal wiring 295 is disposed on the fifth upper insulation layer 200.

In exemplary embodiments, after forming the bit line 172, the third upper insulation layer 170 covering the bit line 172 is formed. Subsequently, the first contacts 265 may be formed through the third to first upper insulation layers 170, 160 and 130 and a mold protection layer 110, and the common wirings 275 electrically connected to the first contacts 265 may be formed on the third upper insulation layer 170. The second and third contacts 280 and 287, and the first and second signal wirings 285 and 295 may be formed by build-up processes substantially the same as or similar to those illustrated with reference to FIGS. 29 to 34.

Accordingly, in exemplary embodiments, the common wiring 275, the first signal wiring 285, and the second signal wiring 295 are located at higher levels than that of the bit line 172.

As described with reference to FIGS. 35 to 37, in exemplary embodiments, a location/level of the bit line may be properly adjusted in consideration of patterning convenience and operational reliability of the vertical memory device. In exemplary embodiments, the bit line is formed at a higher level than that of the second signal wiring 195.

Figure 38:
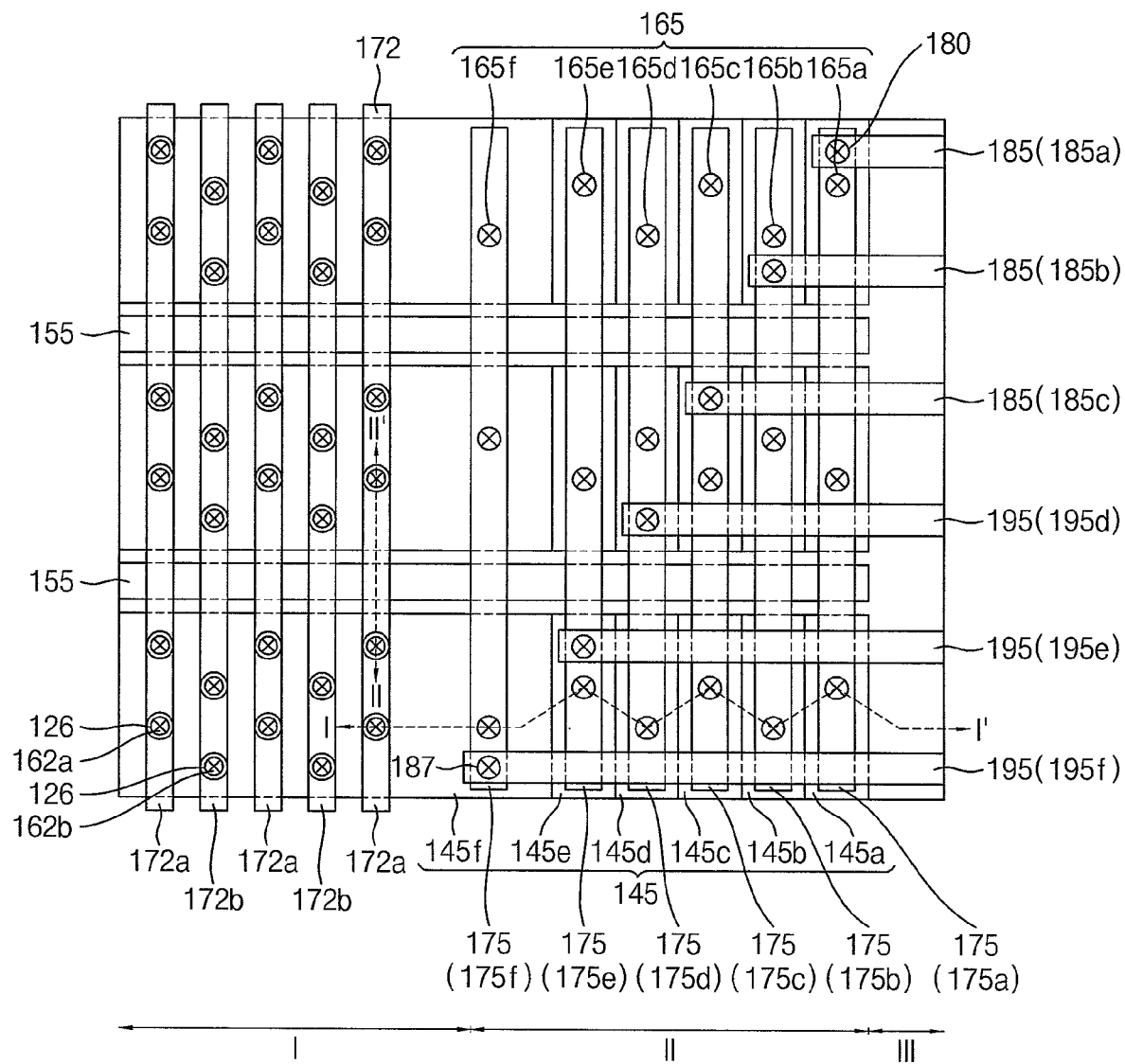

FIGS. 38 to 40 are a top plan view and cross-sectional views illustrating a vertical memory device according to exemplary embodiments of the inventive concept. More specifically, FIG. 38 is a top plan view illustrating the vertical memory device. FIGS. 39 and 40 are cross-sectional views taken along line II-II' of FIG. 38.

Referring to FIGS. 38 and 39, in exemplary embodiments, a wiring structure substantially the same as or similar to that illustrated with reference to FIGS. 1A, 1B, 2 and 3 is disposed on a second region II and a third region III of the vertical memory device.

In exemplary embodiments, the wiring structure includes first contacts 165 (e.g., 165a through 165f) connected to respective gate lines 145 (e.g., 145a through 145f), second and third contacts 180 and 187, common wirings 175 (e.g., 175a through 175f), first signal wirings 185 (e.g., 185a, 185b and 185c), and second signal wirings 195 (e.g., 195d, 195e and 195f). The common wiring 175, the first signal wiring 185, and the second signal wiring 195 may be located at different levels. For example, in exemplary embodiments, the common wiring 175, the first signal wiring 185, and the second signal wiring 195 are disposed on a second upper insulation layer 160, a third upper insulation layer 170, and a fourth upper insulation layer 190, respectively.

In exemplary embodiments, bit lines are distributed at different levels. In exemplary embodiments, the bit lines include, for example, a first bit line 172a and a second bit line 172b. The second bit line 172b is located at a higher level than that of the first bit line 172a.

In exemplary embodiments, the first bit line 172a is located at the same level as that of the common wiring 175. In this case, as illustrated in FIG. 39, the first bit line 172a is disposed on the second upper insulation layer 160.

For example, in exemplary embodiments, a first bit line contact 162a may be formed together with the first contacts 165. The first bit line contact 162a may be formed through the second and first upper insulation layers 160 and 130 to be in contact with a pad 126. Subsequently, the first bit line 172a and the common wiring 175 may be formed from the same conductive layer and by the same etching process.

In exemplary embodiments, the second bit line 172b is located at substantially the same level as that of the first signal wiring 185. In this case, as illustrated in FIG. 39, the second bit line 172b is disposed on the third upper insulation layer 170.

For example, in exemplary embodiments, a second bit line contact 162b may be formed together with the second contacts 180. The second bit line contact 162b may be formed through the third to first upper insulation layers 170, 160 and 130 to be in contact with the pad 126. Subsequently, the second bit line 172b and the first signal wiring 185 may be formed from the same conductive layer and by the same etching process.

In exemplary embodiments, as illustrated in FIG. 38, the first bit line 172a and the second bit line 172b are alternately arranged along the second direction. Accordingly, the bit lines may be disposed at different levels alternately along the second direction.

Referring to FIG. 40, in exemplary embodiments, a first bit line 173a and a second bit line 173b are disposed on the third upper insulation layer 170 and the fourth upper insulation layer 190, respectively. In this case, the first bit line 173a and the second bit line 173b are located at substantially the same levels as those of the first signal wiring 185 and the second signal wiring 195, respectively.

For example, in exemplary embodiments, a first bit line contact 163a may be formed together with the second contacts 180. The first bit line contact 163a may be formed through the third to first upper insulation layers 170, 160 and 130 to be in contact with the pad 126. The first bit line 173a and the first signal wiring 185 may be formed from the same conductive layer and by the same etching process.

Subsequently, a second bit line contact 163b may be formed together with the third contacts 187. The second bit line contact 163b may be formed through the fourth to first upper insulation layers 190, 170, 160 and 130 to be in contact with the pad 126. The second bit line 173b and the second signal wiring 195 may be formed from the same conductive layer and by the same etching process.

According to exemplary embodiments as described above, the bit lines are also distributed at different levels while forming the signal wirings connected to the gate lines 145 at different levels. Thus, a space and a patterning margin for forming the bit lines on the first region I may be additionally obtained.

Figure 41:
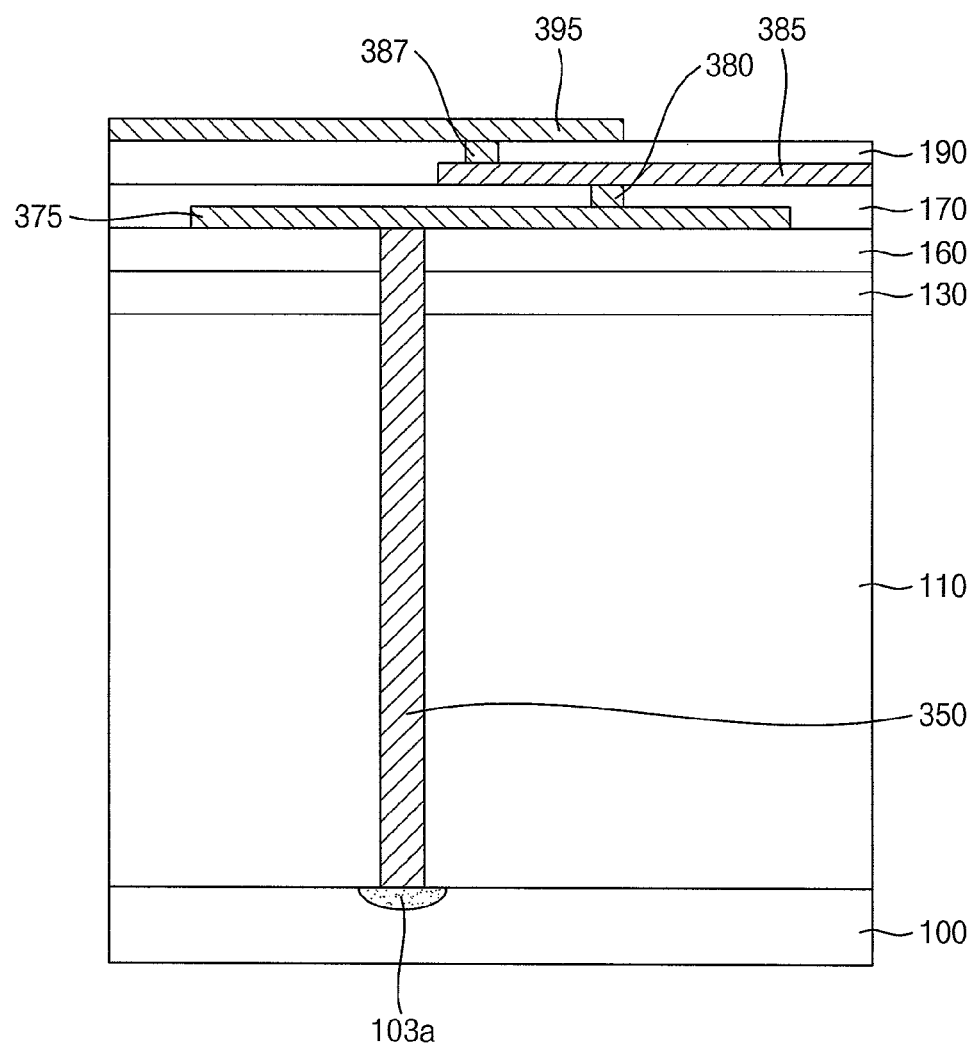
FIG. 41 is a cross-sectional view illustrating a peripheral circuit region of a vertical memory device according to exemplary embodiments of the inventive concept.

FIG. 41 is a cross-sectional view illustrating a peripheral circuit region of a vertical memory device according to exemplary embodiments of the inventive concept.

Referring to FIG. 41, in exemplary embodiments, first to third peripheral circuit contacts 350, 380 and 387, and first to third peripheral circuit wirings 375, 385 and 395 are formed on a peripheral circuit region (e.g., on the third region III).

For example, in exemplary embodiments, the first peripheral circuit contact 350 extends through the second upper insulation layer 160, the first upper insulation layer 130, and the mold protection layer 110 to be electrically connected to a second impurity region 103a. The second impurity region 103a may be formed, for example, at an upper portion of the substrate 100 of the third region III, and may define a transistor together with a peripheral circuit gate structure.

In exemplary embodiments, the first peripheral circuit wiring 375 is disposed on the second upper insulation layer 160, and is electrically connected to the first peripheral circuit contact 350. In exemplary embodiments, the first peripheral circuit wiring 375 is located at substantially the same level as that of the common wiring 175 illustrated in FIGS. 1A, 1B, 2 and 3. In an exemplary embodiment, the first peripheral circuit wiring 375 may be diverged from the common wiring 175.

In exemplary embodiments, the second peripheral circuit contact 380 is disposed on the first peripheral circuit wiring 375 in the third upper insulation layer 170. The second peripheral circuit wiring 385 may be disposed on the third upper insulation layer 170, and may be electrically connected to the second peripheral circuit contact 380. In exemplary embodiments, the second peripheral circuit wiring 385 is located at substantially the same level as that of the first signal wiring 185 illustrated in FIGS. 1A, 1B, 2 and 3. In an exemplary embodiment, the second peripheral circuit wiring 385 may be diverged from the first signal wiring 185.

In exemplary embodiments, the third peripheral circuit contact 387 is disposed on the second peripheral circuit wiring 385 in the fourth upper insulation layer 190. The third peripheral circuit wiring 395 may be disposed on the fourth upper insulation layer 190, and may be electrically connected to the third peripheral circuit contact 387. In exemplary embodiments, the third peripheral circuit wiring 395 is located at substantially the same level as that of the second signal wiring 195 illustrated in FIGS. 1A, 1B, 2 and 3. In an exemplary embodiment, the third peripheral circuit wiring 395 may be diverged from the second signal wiring 195.

According to exemplary embodiments as described above, the peripheral circuit wirings connected to the signal wirings may also be distributed at different levels while forming the signal wirings at different levels. Thus, the peripheral circuit wirings may be three-dimensionally arranged in a limited area of the peripheral circuit region. As a result, according to exemplary embodiments of the inventive concept, an entire wiring density of the vertical memory device may be improved.

According to exemplary embodiments of the present inventive concept, common wirings connected commonly to gate lines at the same level included in different gate line stack structures are provided. Signal wirings electrically connected to the gate lines are distributed at different levels via the common wirings. Therefore, an additional area for accommodating the signal wirings may be provided, even as the number of levels of the gate lines becomes greater.

In exemplary embodiments of the inventive concept, a nonvolatile memory may be embodied to include a three dimensional (3D) memory array. The 3D memory array may be monolithically formed on a substrate (e.g., a semiconductor substrate such as, for example, silicon or a semiconductor-on-insulator substrate). The 3D memory array may include two or more physical levels of memory cells having an active area disposed above the substrate and circuitry associated with the operation of those memory cells, whether such associated circuitry is above or within such substrate. The term "monolithic" means that the layers of each level of the array are directly deposited on the layers of each underlying level of the array.

In exemplary embodiments, the 3D memory array includes vertical NAND strings that are vertically oriented such that at least one memory cell is located over another memory cell. The at least one memory cell may comprise a charge trap layer.

The following patent documents, which are hereby incorporated by reference in their entirety, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A vertical memory device, comprising:
   a substrate;
   a plurality of channels extending in a vertical direction with respect to a top surface of the substrate;
   a plurality of gate lines surrounding a predetermined number of channels from among the channels, wherein the gate lines are arranged and spaced apart from one another along the vertical direction, and the gate lines comprise a ground selection line (GSL), a plurality of word lines, and a string selection line (SSL) sequentially stacked on the top surface of the substrate;
   a plurality of common wirings electrically connected to the gate lines, wherein a first one of the common wirings is electrically connected to the SSL, a second one of the common wirings is electrically connected to the GSL, and remaining ones of the common wirings other than the first and second common wirings are electrically connected to the word lines,
   wherein the first one of the common wirings, the second one of the common wirings, and the remaining ones of the common wirings are disposed at a same level and are respectively connected to the SSL, the GSL, and the word lines via a plurality of contacts,
   wherein the gate lines extend in a first direction, and the common wirings extend in a second direction crossing the first direction,
   wherein a length of the first one of the common wirings, a length of the second one of the common wirings, and lengths of the remaining ones of the common wirings are about equal to each other in the second direction; and
   a plurality of signal wirings electrically connected to the gate lines via the common wirings, wherein the signal wirings are distributed at a plurality of levels.

2. The vertical memory device of claim 1, wherein the signal wirings are disposed over the common wirings, the signal wirings comprise first signal wirings and second signal wirings, and the first signal wirings are disposed at a different level than the second signal wirings.

3. The vertical memory device of claim 2, wherein the first signal wirings are electrically connected to the GSL and lower word lines from among the word lines at a predetermined number of lower levels.

4. The vertical memory device of claim 3, wherein the second signal wirings are electrically connected to upper word lines from among the word lines except for the lower word lines.

5. The vertical memory device of claim 4, wherein the second signal wirings comprise a signal wiring electrically connected to the SSL.

6. The vertical memory device of claim 4, wherein the second signal wirings are disposed over the first signal wirings.

7. The vertical memory device of claim 2, wherein the plurality of contacts comprises:
   a plurality of first contacts connecting the gate lines and the common wirings;
   a plurality of second contacts connecting the common wirings and the first signal wirings; and
   a plurality of third contacts connecting the common wirings and the second signal wirings,
   wherein one of the second contacts or one of the third contacts is disposed on each of the common wirings.

8. The vertical memory device of claim 1, wherein the signal wirings extend in the first direction.

9. The vertical memory device of claim 8, wherein the common wirings overlap end portions of the gate lines and do not overlap the channels.

10. A vertical memory device, comprising:
    a substrate;
    a plurality of channels extending in a first direction substantially vertical to a top surface of the substrate;
    a plurality of gate lines arranged and spaced apart from one another along the first direction, wherein the plurality of gate lines surround the channels;
    a plurality of common wirings electrically connected to the gate lines;
    a plurality of first contacts extending in the first direction, wherein a first end of each first contact is connected to a corresponding common wiring from among the common wirings, and a second end of each first contact is connected to a corresponding gate line from among the gate lines,
    wherein the second ends of the first contacts are disposed at different levels from one another,
    wherein an uppermost gate line from among the gate lines is connected to a corresponding common wiring via a corresponding first contact;
    a plurality of first signal wirings electrically connected to lower gate lines from among the gate lines via the common wirings; and
    a plurality of second signal wirings electrically connected to upper gate lines from among the gate lines via the common wirings,
    wherein the second signal wirings are disposed higher than the first signal wirings in the first direction, the first signal wirings are electrically connected to adjacent common wirings from among the common wirings, and the second signal wirings are electrically connected to adjacent common wirings from among the common wirings,
    wherein, in a plan view, the first signal wirings are not disposed between the second signal wirings, and the second signal wirings are not disposed between the first signal wirings.

11. The vertical memory device of claim 10, wherein the common wirings are disposed at a same level as one another, the first signal wirings are disposed over the common wirings, and the second signal wirings are disposed over the first signal wirings.

12. The vertical memory device of claim 10,
    wherein the gate lines are stacked along the first direction, and the gate lines extend in a second direction substantially parallel to the top surface of the substrate,
    wherein the common wirings extend in a third direction substantially parallel to the top surface of the substrate and crossing the second direction, and the signal wirings extend in the second direction.

13. The vertical memory device of claim 10, wherein the uppermost gate line is a string selection line (SSL).

14. The vertical memory device of claim 10, wherein a lowermost gate line from among the gate lines is connected to a corresponding common wiring via a corresponding first contact.

15. The vertical memory device of claim 14, wherein the lowermost gate line is a ground selection line (GSL).

16. The vertical memory device of claim 10, wherein the vertical memory device further comprises a plurality of bit lines electrically connected to the plurality of channels.

17. The vertical memory device of claim 16, wherein the common wirings and the plurality of bit lines extend in a same direction, and the first and second signal wirings extend in a different direction than the common wirings and the plurality of bit lines.

18. The vertical memory device of claim 16, wherein the plurality of bit lines are disposed at a same level as the common wirings or at a lower level than the common wirings.

19. The vertical memory device of claim 1, wherein the SSL is an uppermost gate line from among the gate lines.

20. A vertical memory device, comprising:
- a substrate;
- a plurality of channels extending lengthwise in a first direction substantially vertical to a top surface of the substrate;
- a plurality of gate lines arranged and spaced apart from one another along the first direction, each of the plurality of gate lines extending lengthwise in a second direction, and the plurality of gate lines surrounding the channels;
- a plurality of common wirings electrically connected to the gate lines, each of the plurality of common wirings extending lengthwise in a third direction crossing the second direction;
- a plurality of first contacts extending lengthwise in the first direction, wherein a first end of each first contact is connected to a corresponding common wiring from among the common wirings, and a second end of each first contact is connected to a corresponding gate line from among the gate lines,
- wherein the second ends of the first contacts disposed at different levels from one another,
- wherein an uppermost gate line from among the gate lines is connected to a corresponding common wiring from among the common wirings via a corresponding first contact from among the first contacts;
- a plurality of first signal wirings electrically connected to lower gate lines from among the gate lines via the common wirings; and
- a plurality of second signal wirings electrically connected to upper gate lines from among the gate lines via the common wirings,
- wherein the second signal wirings are disposed higher than the first signal wirings in the first direction,
- wherein the first signal wirings are electrically connected to adjacent first common wirings from among the common wirings, the adjacent first common wirings being disposed in the second direction, and
- wherein the second signal wirings are electrically connected to adjacent second common wirings from among the common wirings, the adjacent second common wirings being disposed in the second direction.

* * * * *